(12) United States Patent
Kim

(10) Patent No.: US 12,176,381 B2
(45) Date of Patent: Dec. 24, 2024

(54) DISPLAY DEVICE HAVING REDUCED DEAD SPACE

(71) Applicant: Samsung Display Co., Ltd., Yongin-si (KR)

(72) Inventor: Duk Sung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 501 days.

(21) Appl. No.: 17/450,142

(22) Filed: Oct. 6, 2021

(65) Prior Publication Data
US 2022/0130896 A1     Apr. 28, 2022

(30) Foreign Application Priority Data

Oct. 22, 2020 (KR) .................. 10-2020-0137844

(51) Int. Cl.
| | | |
|---|---|---|
| H01L 27/15 | (2006.01) | |
| H01L 33/24 | (2010.01) | |
| H01L 33/44 | (2010.01) | |
| H01L 33/50 | (2010.01) | |
| H01L 33/58 | (2010.01) | |

(52) U.S. Cl.
CPC ............ *H01L 27/156* (2013.01); *H01L 33/24* (2013.01); *H01L 33/44* (2013.01); *H01L 33/50* (2013.01); *H01L 33/58* (2013.01); *H01L 2933/0041* (2013.01); *H01L 2933/0058* (2013.01)

(58) Field of Classification Search
CPC ................. H01L 33/58; H01L 2933/0041
See application file for complete search history.

(56) References Cited

U.S. PATENT DOCUMENTS

| | | |
|---|---|---|
| 10,090,335 B2 | 10/2018 | Kang et al. |
| 10,680,207 B2 | 6/2020 | Choi et al. |
| 10,854,672 B2 | 12/2020 | Cho et al. |
| 11,037,914 B2 | 6/2021 | Kim |
| 11,037,917 B1 | 6/2021 | Kim |
| 2019/0305035 A1* | 10/2019 | Cho .................. H01L 33/46 |

(Continued)

FOREIGN PATENT DOCUMENTS

| | | |
|---|---|---|
| KR | 10-2018-0046494 A | 5/2018 |
| KR | 10-2019-0063965 A | 6/2019 |

(Continued)

*Primary Examiner* — Jay C Chang
*Assistant Examiner* — Mikka Liu
(74) *Attorney, Agent, or Firm* — Lewis Roca Rothgerber Christie LLP

(57) ABSTRACT

A display device may include a substrate including a plurality of pixel regions, each including a first region and a second region; and a pixel in each of the pixel regions. The pixel may include a display element portion including a plurality of light emitting elements that emit a light of a first color. The display element portion may include a color filter on the first surface of the substrate and corresponding to the second region, a first electrode and a second electrode on the color filter and spaced apart from each other in a first direction, the plurality of light emitting elements, which are between the first electrode and the second electrode, a first contact electrode on the first electrode and a second contact electrode on the second electrode, and a color conversion layer on the first contact electrode and the second contact electrode and including color conversion particles.

14 Claims, 32 Drawing Sheets

(56) References Cited

U.S. PATENT DOCUMENTS

2019/0319168 A1* 10/2019 Kim .................... H01L 33/508
2020/0105826 A1    4/2020 Kim et al.
2021/0280662 A1    9/2021 Kim et al.
2021/0319727 A1   10/2021 Kim

FOREIGN PATENT DOCUMENTS

| KR | 10-2019-0115160 A | 10/2019 |
| KR | 10-2020-0005692 A | 1/2020 |
| KR | 10-2020-0038342 A | 4/2020 |
| KR | 10-2021-0113478   | 9/2021 |
| KR | 10-2021-0127272 A | 10/2021 |

* cited by examiner

FIG. 3
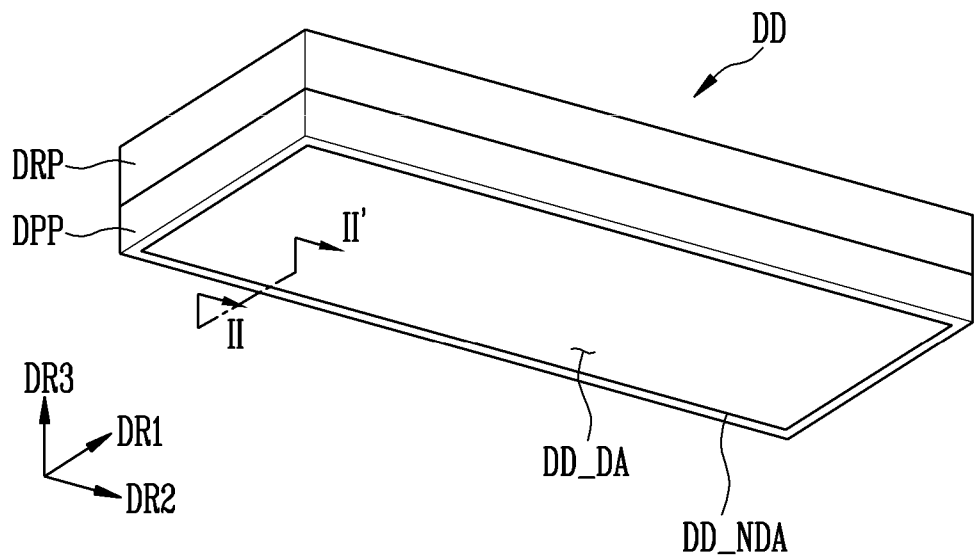
FIG. 4
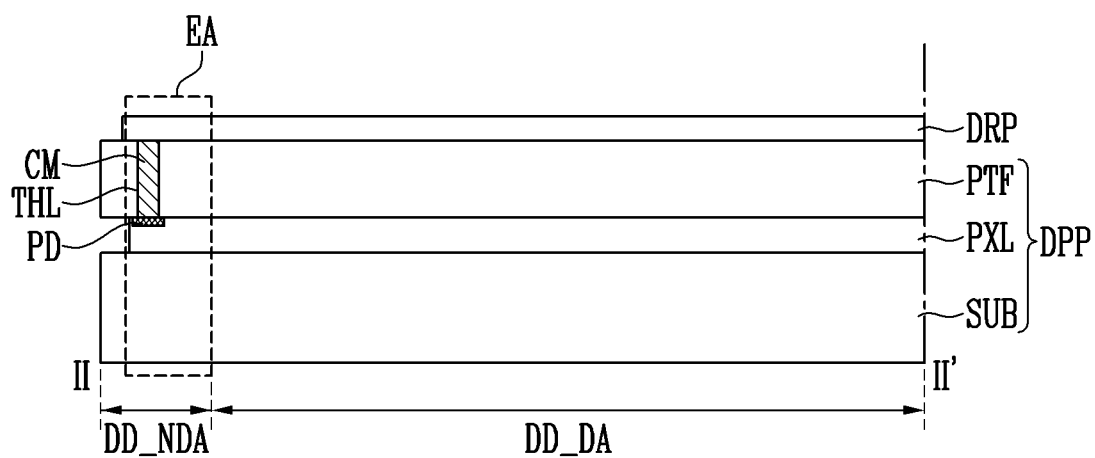
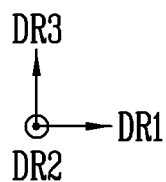

DISPLAY DEVICE HAVING REDUCED DEAD SPACE

CROSS-REFERENCE TO RELATED APPLICATION

This application claims priority to and the benefit of Korean Patent Application No. 10-2020-0137844 filed in the Korean Intellectual Property Office on Oct. 22, 2020, the entire contents of which are hereby incorporated by reference.

BACKGROUND

1. Field

Embodiments of the present disclosure relate to a display device and a method of fabricating the display device.

2. Description of the Related Art

With an increasing interest in information displays and an increasing demand for use of portable information media, there are increasing demand and commercialization for display devices.

SUMMARY

Embodiments of the present disclosure provide a display device formed through a simple fabrication process by minimizing or reducing a dead space and reducing the number of masks, and a method of fabricating the display device.

An embodiment of the present disclosure may provide a display device including a substrate that includes a plurality of pixel regions, each of the plurality of pixel regions including a first region and a second region, and a pixel in each of the plurality of pixel regions. The pixel may include a display element portion (or a display element layer) including a plurality of light emitting elements that emit a light of a first color. Here, the display element portion may include a color filter on the first surface of the substrate and corresponding to the second region; a first electrode and a second electrode on the color filter and spaced apart from each other in a first direction; the plurality of light emitting elements, which are between the first electrode and the second electrode; a first contact electrode on the first electrode and a second contact electrode on the second electrode; and a color conversion layer on the first contact electrode and the second contact electrode and including color conversion particles that absorb the light of the first color and emit a light of a second color.

In one or more embodiments, the second region may include a light emitting region from which the light of the second color is emitted, and when viewed in cross section, the color filter and the color conversion layer may overlap each other in the second region with the light emitting elements therebetween.

In the embodiment, the pixel may further include at least one transistor on the first surface to correspond to the first region, at least one signal line electrically coupled to the transistor, and a first insulating layer on the transistor and the signal line.

In the embodiment, the display device may further include a first bridge pattern and a second bridge pattern on the first insulating layer to correspond to the first region, and a second insulating layer on the first bridge pattern and the second bridge pattern and exposing part of the first bridge pattern, part of the first electrode, and part of the second electrode, wherein the second bridge pattern may be electrically coupled to one selected from the first electrode and the second electrode.

In the embodiment, the display device may further include a light blocking layer on the first bridge pattern and the second bridge pattern and including an opening corresponding to the light emitting region, wherein the color conversion layer may be in the opening.

In the embodiment, the display device may further include a first conductive pattern on the first bridge pattern in the first region and electrically coupled to the first bridge pattern; and a second conductive pattern on the color conversion layer in the second region, wherein the first conductive pattern and the second conductive pattern may include a same material.

In the embodiment, the first conductive pattern and the second conductive pattern may include a conductive material having a set reflectivity.

In the embodiment, the second conductive pattern may be a guide member that guides the light of the second color emitted from the color conversion layer to a second surface facing the first surface of the substrate.

In the embodiment, the display device may further include a planarization layer on the first conductive pattern and the second conductive pattern and exposing one region of the first conductive pattern, and a pad electrode on the planarization layer, wherein the pad electrode may be electrically coupled to the one region of the first conductive pattern that is exposed by the planarization layer.

In the embodiment, the display device may further include a protective film on the pad electrode and including at least one through-hole exposing one region of the pad electrode, and a connection member in the through-hole and electrically coupled to the pad electrode.

In the embodiment, the display device may further include a drive portion (or a driver) on the protective film and electrically coupled to the pad electrode through the connection member.

In the embodiment, the drive portion may be over the pixel on the first surface of the substrate.

In the embodiment, the display device may further include a bank adjacent to the light emitting region in the first region, wherein the light blocking layer may be on the bank.

In the embodiment, the display device may further include a bank pattern between the first contact electrode and the second insulating layer and between the second contact electrode and the second insulating layer to correspond to the second region.

In the embodiment, the display device may further include a polarization film on a second surface of the substrate facing the first surface.

The display device according to the above-described embodiment may be fabricated by including a step of providing a pixel including at least one pixel region having a first region and a second region on a substrate.

In one embodiment, the pixel may be formed by a method including forming at least one transistor and at least one signal line electrically coupled to the transistor on a first surface of the substrate; forming a first insulating layer on the transistor and the signal line; forming a color filter on the first insulating layer to correspond to the second region; forming a second insulating layer including a plurality of contact holes on the first insulating layer including the color filter; forming a first bridge pattern and a second bridge pattern on the second insulating layer; forming a first electrode and a second electrode on the second insulating layer including the first bridge pattern and the second bridge pattern to correspond to the second region; aligning light emitting elements that emit a light of a first color between the first electrode and the second electrode; forming a first contact electrode and a second contact electrode on the light emitting elements; forming a light blocking layer in the first region, the light blocking layer having an opening that exposes the first and second contact electrodes; and forming a color conversion layer in the opening.

According to a display device and a method of fabricating the same according to embodiments of the present disclosure, pixels for displaying an image on a first surface (or an upper surface) of a substrate is formed, a pad electrode is formed on the pixels, a drive portion electrically coupled to the pad electrode is on the pad electrode, and thereby, the pixels and the drive portion may be sequentially on the same first surface (e.g., the upper surface) of the substrate. Accordingly, a process of fabricating the display device may be simplified.

In addition, according to one embodiment of the present disclosure, a reflective member is on a color conversion layer to guide light emitted from a direction of a first surface (or an upper surface) of a substrate to a direction of a second surface (or a lower surface) facing the first surface on the color conversion layer, and thus, loss of light due to configuration elements on the color conversion layer may be minimized or reduced.

Effects according to the embodiments of the present disclosure are not limited by the content described above, and various additional effects are included in the scope of the present specification.

BRIEF DESCRIPTION OF THE DRAWINGS

The above and other aspects and features of certain embodiments of the disclosure will be more apparent from the following description taken in conjunction with the accompanying drawings, in which:

FIG. 3 is a schematic perspective view of a display device according to an embodiment of the present disclosure;

FIG. 4 is a cross-sectional view taken along line II-II' of FIG. 3;

DETAILED DESCRIPTION

Figure 1:
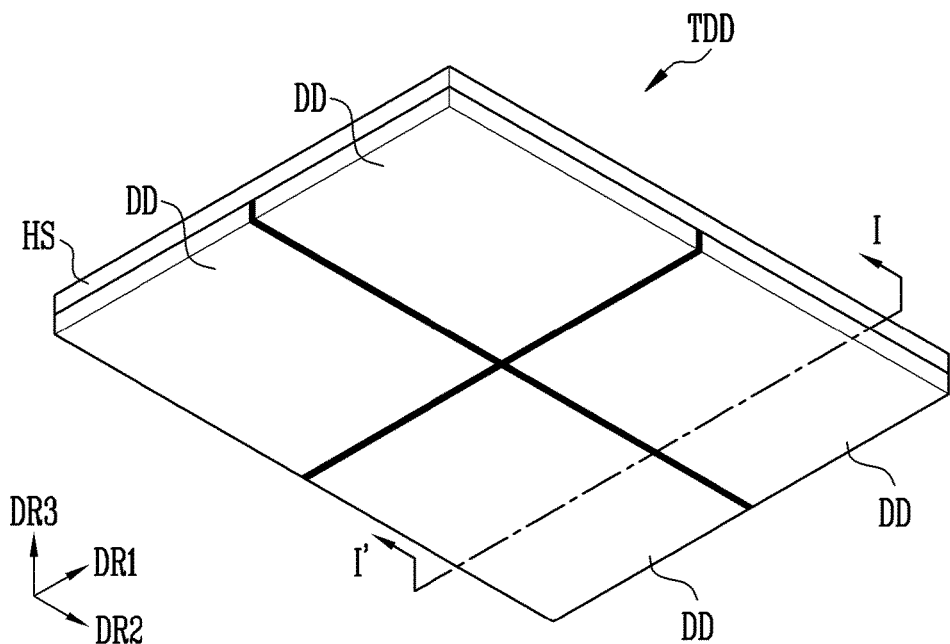
FIG. 1 is a schematic perspective view of a multi-screen display device according to an embodiment of the present disclosure.

Because the subject matter of the present disclosure may be variously modified and may have various forms, example embodiments will be illustrated in the drawings and described in more detail in the specification. However, this is not intended to limit the present disclosure to a specific disclosure form and should be understood to include all changes, equivalents, and substitutes included in the spirit and scope of the present disclosure.

In describing the respective drawings, similar reference numerals are given to similar configuration elements. In the drawings, dimensions of structures are enlarged more than actual structures for the sake of clear illustration of the subject matter of the present disclosure. Terms, "first" and "second", may be used to describe various configuration elements, and the configuration elements are not limited thereto. The terms are used only for the purpose of distinguishing one configuration element from another configuration element. For example, a first configuration element may be referred to as a second element, and similarly, a second element may be referred to as a first element, without departing from the scope of the present disclosure. A singular expression includes a plural expression unless the context clearly indicates otherwise.

In the present application, the terms, "comprise" and "have" are intended to designate presence of characteristics, numbers, steps, actions, configuration elements, components, or combinations thereof described in the specification, and it should be understood that possibility of presence or addition of one or more other characteristics, numbers, steps, actions, configuration elements, components, or combinations thereof are not excluded. In addition, when a portion such as layer, film, region, or plate is described as being placed "on" another portion, this includes not only a case in which the portion is "directly on" another portion but also a case in which another portion is therebetween. In addition, in the present specification, when a portion such as layer, film, region, or plate is formed on another portion, the formed direction is not limited only to an upper direction and includes a lateral direction or a lower direction. In contrast to this, when a portion such as layer, film, region, or plate is described as being placed "below" another portion, this includes not only a case in which the portion is "directly below" another portion but also a case in which another portion is therebetween.

In the present application, when it is described that a certain configuration element (for example, a "first configuration element") is "connected (operatively or communicatively)" or "coupled" to another configuration element (for example, a "second configuration element"), it should be understood that the certain configuration element may be directly connected (e.g., coupled) to another configuration element or may be connected (e.g., coupled) through another configuration element (for example, a "third configuration element"). In contrast to this, when it is described that a certain configuration element (for example, a "first configuration element") is "directly connected" or "directly coupled" to another configuration element (for example, a "second configuration element"), it may be understood that there is no another configuration element (for example, a "third configuration element") therebetween.

Hereinafter, embodiments of the present disclosure and other matters helpful for those skilled in the art to easily understand the content of the present disclosure will be described in more detail with reference to the accompanying drawings. In the following description, a singular expression also includes a plural expression unless the context clearly includes only the singular expression.

Figure 2:
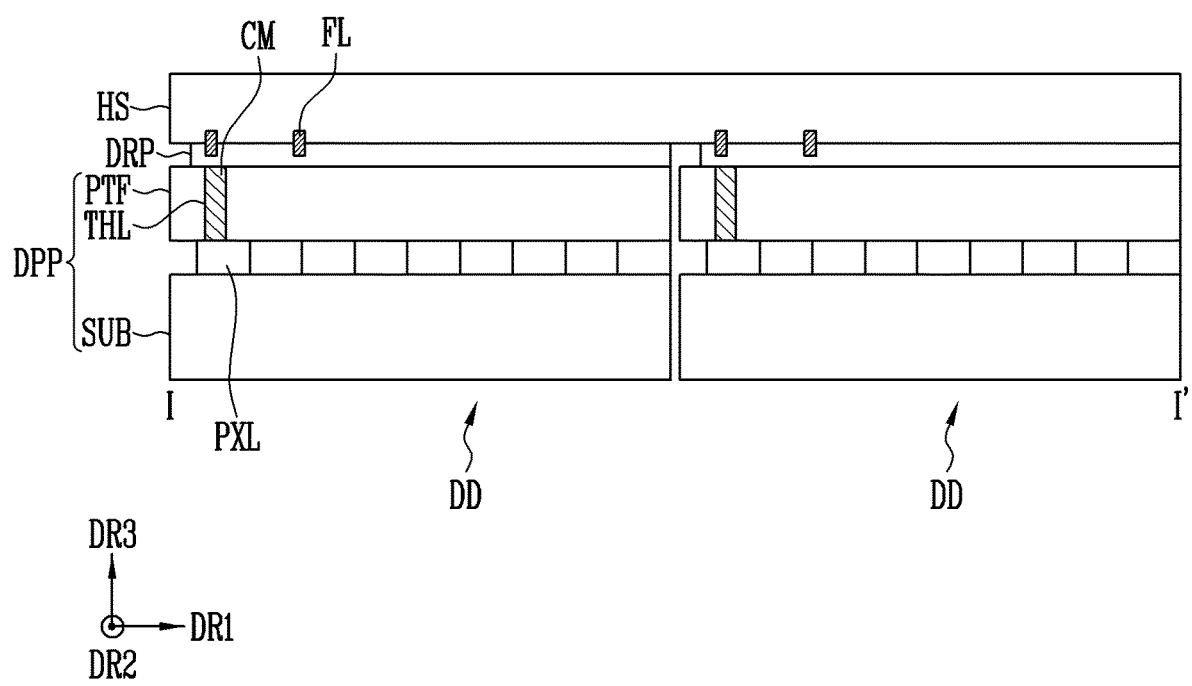
FIG. 2 is a cross-sectional view taken along line I-I' of FIG. 1.
Figure 5:
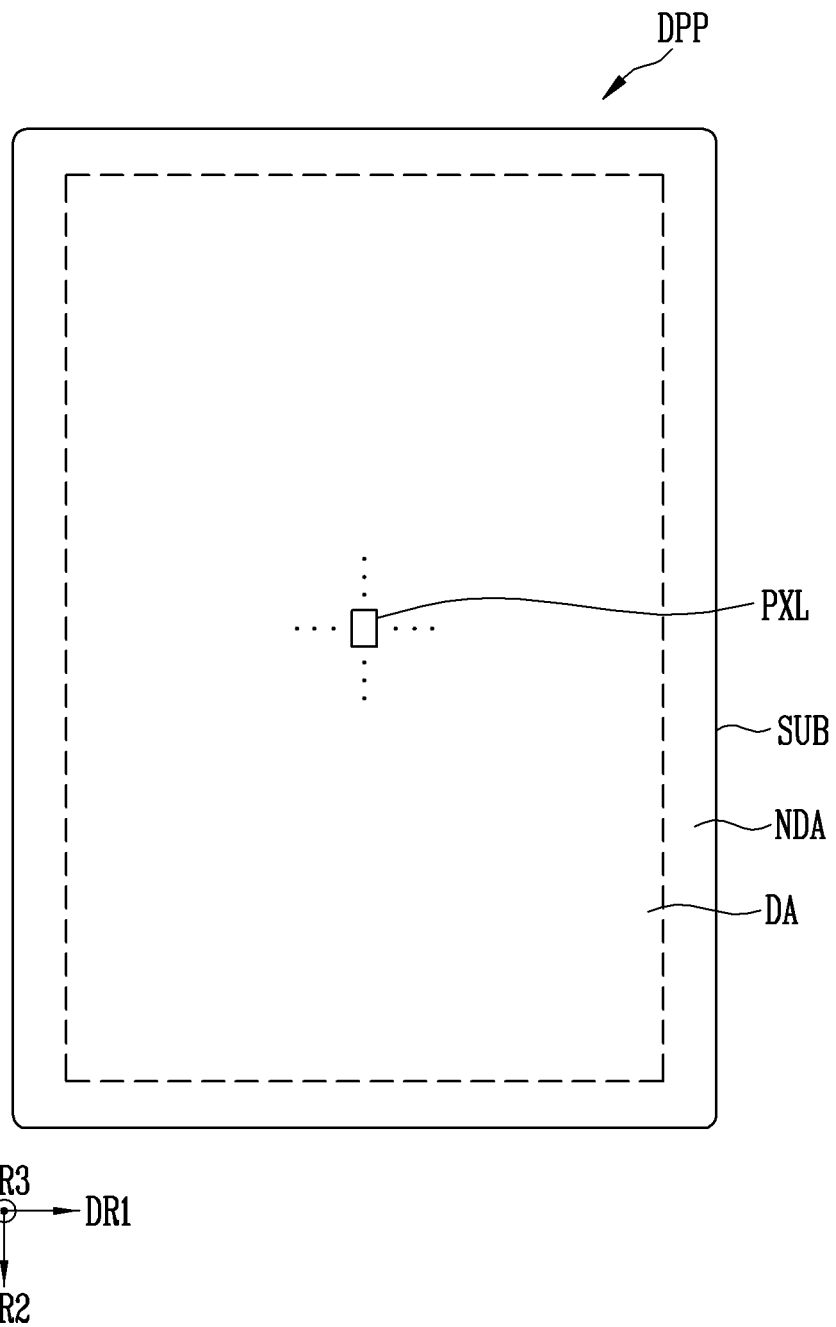
FIG. 5 is a plan view schematically illustrating a display panel according to an embodiment of the present disclosure.

FIG. 1 is a schematic perspective view of a multi-screen display device TDD according to an embodiment of the present disclosure, FIG. 2 is a cross-sectional view taken along line I-I' of FIG. 1, FIG. 3 is a schematic perspective view of a display device DD according to an embodiment of the present disclosure, FIG. 4 is a cross-sectional view taken along line II-II' of FIG. 3, and FIG. 5 is a plan view schematically illustrating a display panel DPP according to an embodiment of the present disclosure.

Referring to FIGS. 1 to 5, a display device according to an embodiment of the present disclosure may be a multi-screen display device TDD including a plurality of display devices DD. If each of the display devices DD is an electronic device having a display surface applied to at least one surface thereof, such as, smartphone, television, tablet personal computer (PC), mobile phone, video phone, e-book reader, desktop PC, laptop PC, netbook computer, workstation, server, personal digital assistant (PDA), portable multimedia player (PMP), moving pictures experts group (MPEG) audio layer-3 (MP3) player, medical device, camera, and/or wearable device, the present disclosure may be applied thereto.

The multi-screen display device TDD (also referred to as a "tiled display") includes a plurality of the display devices DD in a matrix form in a first direction DR1 and a second direction DR2, and a housing HS. The plurality of display devices DD may display individual images or may divide and display one image. The plurality of display devices DD may include display panels of the same type, kind, structure, size, and/or method, but are not limited thereto.

The plurality of display devices DD may be in a matrix form. The matrix form may include at least one or more rows and at least two or more columns.

The housing HS may physically couple the display devices DD so that the plurality of display devices DD may form one multi-screen display device TDD. The housing HS may be on one surface (for example, an upper surface) among surfaces of the display devices DD to control or fix movement of the plurality of display devices DD. Each of the display devices DD may be detachably fastened to the housing HS through at least one fastening member FL. Accordingly, the display devices DD are easily attached to and detached from the housing HS, and thus, when one of the display devices DD fails, the failed display may be easily repaired.

Each of the plurality of display devices DD may be in various suitable shapes, for example, a rectangular plate shape having two pairs of sides parallel (e.g., substantially parallel) to each other, but the present disclosure is not limited thereto. When each of the display devices DD is in a rectangular plate shape, one pair of sides among the two pairs of sides may be longer than the other pair of sides. In the drawing, each of the display devices DD is illustrated as having angled corner portions formed in straight lines, but the present disclosure is not limited thereto. In some embodiments, each of the display devices DD in a rectangular plate shape may also have a round shape at a corner in which one long side is in contact with one short side.

In one embodiment of the present disclosure, for the sake of convenient description, it is illustrated that each of the display devices DD has a rectangular shape having a pair of long sides and a pair of short sides, an extension direction of the long side is a second direction DR2, an extension direction of the short side is a first direction DR1, and a direction perpendicular to the extension directions of the long side and the short side is a third direction DR3, but the present disclosure is not limited thereto. The first direction to the third direction DR1, DR2, and DR3 may indicate directions indicated by the first direction to the third direction DR1, DR2, and DR3.

In one embodiment of the present disclosure, at least a part of each of the display devices DD may be flexible, and a portion which is flexible may be folded.

Each of the display devices DD may include a display region DD_DA for displaying an image and a non-display region DD_NDA on at least one side of the display region DD_DA. The non-display region DD_NDA is a region in which an image is not displayed (or is not designed to be displayed). However, the present disclosure is not limited thereto. In some embodiments, a shape of the display region DD_DA and a shape of the non-display region DD_NDA may be relatively designed.

In some embodiments, each of the display devices DD may include a sensing region and a non-sensing region. Each of the display devices DD not only may display an image through the sensing region but also may sense a touch input made on a display surface (or an input surface) and/or may detect light incident from the front. The non-sensing region may surround the sensing region, but this is an example and it is not limited thereto. In some embodiments, a partial region of the display region DA may correspond to the sensing region.

An image displayed on a screen of the multi-screen display device TDD may be disconnected due to the non-display region DD_NDA at a boundary region between the display devices DD, for example, a seam region. For example, when a width (or an area) of the non-display region DD_NDA is relatively large, disconnection of an image may be increased in the boundary region between the display devices DD.

In one or more embodiments, when a width (or an area) of the non-display region DD_NDA is reduced, a size of the display region DD_DA may be increased without increasing a size of each of the display devices DD. Accordingly, a larger display region DD_DA may be provided. In addition, in a case in which the non-display region DD_NDA is reduced, when the multi-screen display device TDD is composed by using the plurality of display devices DD, it is possible to minimize visual recognition of the boundary between the display devices DD and to compose a more natural screen (e.g., it is possible to reduce visibility of the boundary between the display devices DD).

Each of the display devices DD may include a display portion DPP and a drive portion DRP.

The display portion DPP may display an image. The display portion DPP may include a self-luminous display panel, such as an organic light emitting display (OLED) panel using an organic light emitting diode as a light emitting element, a nano-scale LED display panel using an ultra-small light emitting diode as a light emitting element, and/or a quantum dot organic light emitting display (QD OLED) panel using quantum dots and an organic light emitting diode. In addition, the display portion DPP may include a non-light emission type or kind of display panel such as a liquid crystal display (LCD) panel, an electrophoretic display (EPD) panel, and/or an electro-wetting display (EWD) panel. When a non-light emission type or kind of display panel is used as the display portion DPP, the display device DD may include a separate light source such as a backlight unit that supplies light to the display portion DPP.

The display portion DPP may include a substrate SUB, pixels PXL, and a protective film PTF.

The substrate SUB may be composed of one region having an approximately rectangular shape. However, the number of regions on the substrate SUB may change, and a shape of the substrate SUB may have a different shape according to the regions on the substrate SUB.

The substrate SUB may be formed of an insulating material such as glass and/or resin. In addition, the substrate SUB may be formed of a flexible material to be bent and/or folded and may have a single layer structure or a multilayer structure. For example, the flexible material may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. In one embodiment of the present disclosure, the substrate SUB may be formed of polyimide having flexibility. However, the material forming the substrate SUB is not limited to the above-described embodiments.

The substrate SUB may include a display region DA and a non-display region NDA. The display region DA is a region in which the pixels PXL are formed to display an image, and the non-display region NDA is a region in which the pixels PXL are not formed so as not to display an image.

The display region DA of the display portion DPP corresponds to the display region DD_DA of the related display device DD, and the non-display region NDA of the display portion DPP may correspond to the non-display region DD_NDA of the related display device DD.

The pixels PXL may be formed on one surface of the substrate SUB. For the sake of convenient description, only one pixel PXL is illustrated in FIG. 5, but the present disclosure is not limited thereto. For example, a plurality of pixels PXL may be in the display region DA of the substrate SUB.

The pixels PXL may be formed in the display region DA of the substrate SUB. Each of the pixels PXL may be a minimum unit for displaying an image. The pixels PXL may include light emitting elements that emit white light and/or color light. Each of the pixels PXL may emit any one of red, green, and blue but is not limited thereto and may emit colors such as cyan, magenta, and yellow. Each of the pixels PXL may include at least one light emitting element that emits light. Detailed description of the light emitting element will be further provided below with reference to FIGS. 6 and 7.

The pixels PXL may be in a matrix form along a row extending in the first direction DR1 and a column extending in the second direction DR2 crossing the first direction DR1. However, an arrangement form of the pixels PXL is not particularly limited and may have various suitable configurations. In the drawings, the pixel PXL is illustrated as having a rectangular shape, but the present disclosure is not limited thereto and may be changed in various suitable shapes. In addition, when a plurality of pixels PXL are provided, the pixels may have different areas (or sizes). For example, when pixels PXL emit light of different colors, the pixels PXL may have different areas (or sizes) for each color.

A wiring portion electrically coupled to the pixels PXL may be in the non-display region NDA of the substrate SUB. The wiring portion may electrically couple the drive portion DRP and the pixels PXL. The wiring portion provides a signal to each of the pixels PXL and may include signal lines coupled to the respective pixels PXL, for example, a fan-out line coupled to a scan line, a data line, a light emission control line, and so on. In addition, the wiring portion includes signal lines coupled to the respective pixels PXL, for example, a fan-out line coupled to a control line, a sensing line, and so on to compensate for a change in electrical characteristics of each of the pixels PXL in real time.

The protective film PTF may be formed on the pixels PXL. The protective film PTF may include the same (e.g., substantially the same) material as the substrate SUB or may include one or more materials selected from materials provided herein as examples of configuration materials of the substrate SUB. The protective film PTF may include one or more through-holes THL. The through-holes THL are distributed in the display region DA where the pixels PXL are formed and may be formed to penetrate the protective film PTF. A connection member CM may be in the through-hole THL.

The connection member CM may be a conductive adhesive member. The connection member CM may electrically couple a pad electrode PD on the pixels PXL to the drive portion DRP on the display portion DPP. Here, the conductive adhesive member may be an anisotropic conductive film.

The drive portion DRP may be on the protective film PTF of the display portion DPP to be electrically coupled to the pixels PXL through the connection member CM and the pad electrode PD described above. The drive portion DRP may include a circuit substrate on which a drive chip electrically coupled to a light emitting elements formed in the respective pixels PXL is mounted.

Figure 6:
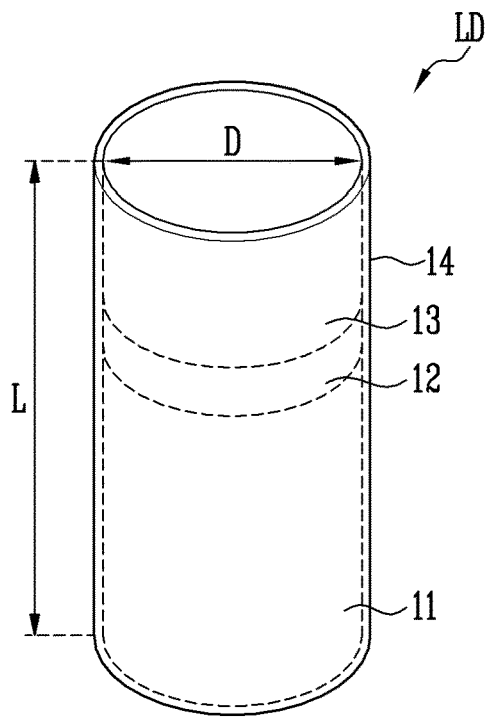
FIG. 6 is a perspective view schematically illustrating a light emitting element according to an embodiment of the present disclosure.
Figure 7:
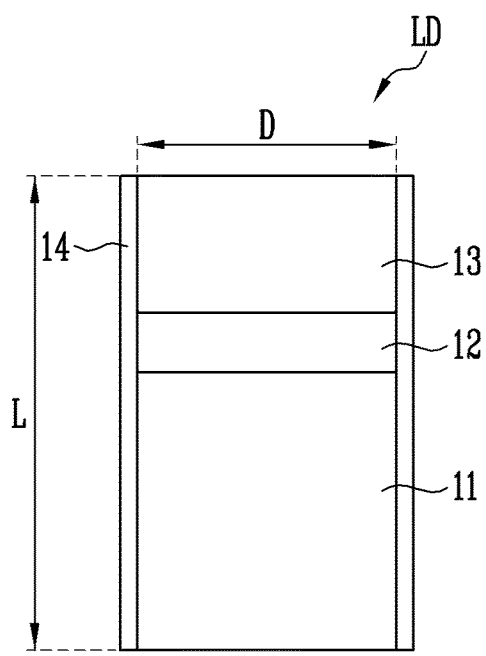
FIG. 7 is a cross-sectional view of the light emitting element of FIG. 6.

FIG. 6 is a perspective view schematically illustrating a light emitting element LD according to an embodiment of the present disclosure, and FIG. 7 is a cross-sectional view of the light emitting element LD of FIG. 6.

In one embodiment of the present disclosure, a type, a kind, and/or a shape of the light emitting elements LD is not limited to the embodiments illustrated in FIGS. 6 and 7.

Referring to FIGS. 6 and 7, a light emitting element LD includes a first semiconductor layer 11, a second semiconductor layer 13, and an active layer 12 interposed between the first semiconductor layer 11 and the second semiconductor layer 13. For example, the light emitting element LD may include a light emitting stacked body in which the first semiconductor layer 11, the active layer 12, and the second semiconductor layer 13 are sequentially stacked.

The light emitting element LD may have a shape extending in one direction. When an extending direction of the light emitting element LD is referred to as a longitudinal direction, the light emitting element LD may include one end (or a lower end) and the other end (or an upper end) in the extending direction. One of the first and second semiconductor layers 11 and 13 may be at one end (or the lower end) of the light emitting element LD, and the other of the first and second semiconductor layers 11 and 13 may be at the other end (or the upper end) of the light emitting element LD. As one example, the first semiconductor layer 11 may be at one end (or the lower end) of the light emitting element LD, and the second semiconductor layer 13 may be at the other end (or the upper end) of the light emitting element LD.

The light emitting element LD may be formed in various suitable shapes. As one example, the light emitting element LD may have a rod-like shape, a bar-like shape, or a column shape that is long in a length L direction (e.g., an aspect ratio is greater than 1). However, the present disclosure is not limited thereto, and in some embodiments, the light emitting element LD may also have a rod-like shape, a bar-like shape, or a column-like shape that is short in the length L direction (e.g., the aspect ratio is less than 1). In addition, according to another embodiment, the light emitting element LD may have a rod-like shape, a bar-like shape, or a column-like shape that are equal to each other in a length L and a diameter D.

When the light emitting element LD is long in the length L direction, the length L of the light emitting element LD may be greater than its diameter D (or a width of a cross section). The light emitting element LD may include, for example, a light emitting diode (LED) manufactured in a very small size to have the diameter D and/or the length L of approximately a nanoscale to approximately a microscale (e.g., the diameter D and/or the length L may have a dimension of nanometers to micrometers).

The diameter D of the light emitting element LD may be approximately 0.5 µm to 6 µm, and the length L thereof may be approximately 1 µm to 10 µm. However, the diameter D and the length L of the light emitting element LD are not limited thereto, and a size of the light emitting element LD may be changed to meet requirements (or design conditions) of an illumination device to which the light emitting element LD is applied, or a self-luminous display device.

The first semiconductor layer 11 may include, for example, at least one n-type semiconductor layer. For example, the first semiconductor layer 11 may include any one selected from InAlGaN, GaN, AlGaN, InGaN, AlN, and InN, and may be an n-type semiconductor layer doped with a first conductive dopant (or n-type dopant) such as Si, Ge, and/or Sn. However, a material forming the first semiconductor layer 11 is not limited thereto and may be formed of various other suitable materials. In one embodiment of the present disclosure, the first semiconductor layer 11 may include a gallium nitride (GaN) semiconductor material doped with a first conductive dopant (or n-type dopant). The first semiconductor layer 11 may include an upper surface in contact with the active layer 12 in the length L direction of the light emitting element LD, and a lower surface exposed to the outside. As used herein, the term "contact" may refer to physical or direct contact. The lower surface of the first semiconductor layer 11 may be one end (or the lower end) of the light emitting element LD.

The active layer 12 may be on the first semiconductor layer 11 and may be formed in a single structure or a multi-quantum well structure. For example, when the active layer 12 is formed in a multi-quantum well structure, the active layer 12 may have a structure in which one unit composed of a barrier layer, a strain reinforcing layer, and a well layer is repeatedly stacked periodically. The strain reinforcing layer may have a smaller lattice constant than the barrier layer to further strengthen a strain applied to the well layer, for example, a compression strain. However, a structure of the active layer 12 is not limited to the above-described embodiment.

The active layer 12 may emit light having a wavelength of 400 nm to 900 nm and may use a double hetero structure. In one embodiment of the present disclosure, a clad layer doped with a conductive dopant may also be formed on and/or under the active layer 12 in the length L direction of the light emitting element LD. For example, the clad layer may be formed of an AlGaN layer or an InAlGaN layer. In some embodiments, a material such as AlGaN and/or InAlGaN may be used to form the active layer 12, and various other suitable materials may form the active layer 12. The active layer 12 may include a first surface in contact with the first semiconductor layer 11 and a second surface in contact with the second semiconductor layer 13.

When an electric field of a set or predetermined voltage or more is applied to both ends of the light emitting element LD, electrons and holes are coupled to each other in the active layer 12 to cause the light emitting element LD to emit light. By controlling the light emission of the light emitting element LD by using this principle, the light emitting element LD may be used as a light source (or light emitting source) of various suitable light emitting elements including pixels of a display device.

The second semiconductor layer 13 may be on a second surface of the active layer 12 and include a semiconductor layer of a different type (or kind) from the first semiconductor layer 11. For example, the second semiconductor layer 13 may include at least one p-type semiconductor layer. For example, the second semiconductor layer 13 may include at least selected from InAlGaN, GaN, AlGaN, InGaN, AlN, and InN and may include a p-type semiconductor layer doped with a second conductive dopant (or p-type dopant) such as Mg. However, a material forming the second semiconductor layer 13 is not limited thereto, and various other suitable materials may form the second semiconductor layer 13. In one embodiment of the present disclosure, the second semiconductor layer 13 may include a gallium nitride (GaN) semiconductor material doped with a second conductive dopant (or p-type dopant). The second semiconductor layer 13 may include a lower surface in contact with the second surface of the active layer 12 in the length L direction of the light emitting element LD, and an upper surface exposed to the outside. Here, the upper surface of the second semiconductor layer 13 may be the other end (or the upper end) of the light emitting element LD.

In one embodiment of the present disclosure, the first semiconductor layer 11 and the second semiconductor layer 13 may have different thicknesses in the length L direction of the light emitting element LD. For example, the first semiconductor layer 11 may have a relatively greater thickness than the second semiconductor layer 13 in the length L direction of the light emitting element LD. Accordingly, the active layer 12 of the light emitting element LD may be closer to the upper surface of the second semiconductor layer 13 than the lower surface of the first semiconductor layer 11.

In one or more embodiments, although the first semiconductor layer 11 and the second semiconductor layer 13 are each illustrated as being composed of one layer, the present disclosure is not limited thereto. In one embodiment of the present disclosure, each of the first semiconductor layer 11 and the second semiconductor layer 13 may also further include at least one layer, for example, a clad layer and/or a tensile strain barrier layer (TSBR), according to the material of the active layer 12. The TSBR layer may be a strain mitigating layer that is between semiconductor layers having different lattice structures to serve as a buffer for reducing a difference in lattice constant. The TSBR layer may be composed of a p-type semiconductor layer such as p-GaInP, p-AlInP, and/or p-AlGaInP but present disclosure is not limited thereto.

In some embodiments, the light emitting element LD may further include an additional electrode (hereinafter referred to as a "first additional electrode") on the second semiconductor layer 13 in addition to the first semiconductor layer 11, the active layer 12, and the second semiconductor layer 13 described above. In addition, according to another embodiment, the light emitting element LD may further include another additional electrode (hereinafter referred to as a "second additional electrode") at one end of the first semiconductor layer 11.

Each of the first and second additional electrodes may be an ohmic contact electrode, but the present disclosure is not limited thereto. In some embodiments, the first and second additional electrodes may be Schottky contact electrodes. The first and second additional electrodes may include a conductive material (e.g., an electrically conductive material). For example, the first and second additional electrodes may include an opaque metal used alone or in combination with chromium (Cr), titanium (Ti), aluminum (Al), gold (Au), nickel (Ni), and/or oxides and/or alloys thereof, but the present disclosure is not limited thereto. In some embodiments, the first and second additional electrodes may also include transparent conductive oxides such as indium tin oxide (ITO), indium zinc oxide (IZO), zinc oxide (ZnO), indium gallium zinc oxide (IGZO), and/or indium tin zinc oxide (ITZO).

Materials included in the first and second additional electrodes may be the same as or different from each other. The first and second additional electrodes may be substantially transparent or translucent. Accordingly, light generated by the light emitting element LD may pass through each of the first and second additional electrodes to be emitted to the outside of the light emitting element LD. In some embodiments, when the light generated by the light emitting element LD does not pass through the first and second additional electrodes and is emitted to the outside of the light emitting element LD through a region other than both ends of the light emitting element LD, the first and second additional electrodes may include an opaque metal.

In one embodiment of the present disclosure, the light emitting element LD may further include the insulating layer 14. However, in some embodiments, the insulating layer 14 may be omitted or may cover only a portion of the first semiconductor layer 11, the active layer 12, and the second semiconductor layer 13.

The insulating layer 14 may prevent or reduce occurrence of an electrical short circuit when the active layer 12 comes into contact with conductive materials (e.g., electrically conductive materials) other than the first and second semiconductor layers 11 and 13. In addition, the insulating layer 14 may minimize or reduce surface defects of the light emitting element LD, thereby increasing a lifetime and luminous efficiency of the light emitting element LD. In addition, when the plurality of light emitting elements LD are closely arranged, the insulating layer 14 may prevent or reduce occurrence of unwanted short circuits between the light emitting elements LD. As long as the active layer 12 may prevent or reduce occurrence of a short circuit with an external conductive material (e.g., an external, electrically conductive material), whether or not to provide the insulating layer 14 is not limited (e.g., in some embodiments, the insulating 14 may be omitted).

The insulating layer 14 may surround an entire outer peripheral (e.g., circumferential) surface of a light emitting stacked body including the first semiconductor layer 11, the active layer 12, and the second semiconductor layer 13.

In the above-described embodiment, the insulating layer 14 is described as surrounding entire outer peripheral (e.g., circumferential) surfaces of the first semiconductor layer 11, the active layer 12, and the second semiconductor layer 13, but the present disclosure is limited thereto. In some embodiments, when the light emitting element LD includes the first additional electrode, the insulating layer 14 may surround all of the first semiconductor layer 11, the active layer 12, the second semiconductor layer 13, and the first additional electrode. In addition, according to another embodiment, the insulating layer 14 may not surround the entire outer peripheral (e.g., circumferential) surface of the first additional electrode or may surround only a part of the outer peripheral (e.g., circumferential) surface of the first additional electrode and may also not surround the rest of the outer peripheral (e.g., circumferential) surface of the first additional electrode. In addition, In some embodiments, when the first additional electrode may be at the other end (or upper end) of the light emitting element LD, and when the second additional electrode is at one end (or lower end) of the light emitting element LD, the insulating layer 14 may also expose at least one region of each of the first and second additional electrodes.

The insulating layer 14 may include a transparent insulating material (e.g., a transparent, electrically insulating material). For example, the insulating layer 14 may include at least one insulating material selected from a group consisting of silicon oxide (SiOx), silicon nitride (SiNx), silicon oxynitride (SiOxNy), aluminum oxide (AlOx), and titanium oxide (TiOx), but the present disclosure is not limited thereto, and various suitable materials having insulating properties (e.g., electrically insulating properties) may be used as the material of the insulating layer 14.

In some embodiments, the light emitting element LD may also be implemented as a light emitting pattern having a core-shell structure. In this case, the first semiconductor layer 11 may be at a core, for example, a central portion (or the center) of the light emitting element LD, the active layer 12 may be provided and/or formed in a form that surrounds the outer peripheral (e.g., circumferential) surface of the first semiconductor layer 11, and the second semiconductor layer 13 may be provided and/or formed in a form that surrounds the active layer 12. In addition, the light emitting element LD may also further include an additional electrode surrounding at least one side of the second semiconductor layer 13. In addition, in some embodiments, the light emitting element LD may further include the insulating layer 14 that is on an outer peripheral (e.g., circumferential) surface of a light emitting pattern having a core-shell structure and includes a transparent insulating material (e.g., a transparent, electrically insulating material). The light emitting element LD implemented with the light emitting pattern having the core-shell structure may be manufactured by using a growth method.

The light emitting element LD described above may be used as a light emitting source (or light source) of various suitable display devices. The light emitting element LD may be manufactured through a surface treatment process. For example, when the plurality of light emitting elements LD are mixed with a fluid solution (or a solvent) and supplied to each pixel region (for example, a light emitting region of each pixel or a light emitting region of each sub-pixel), the light emitting elements LD may be subjected to surface treatment so that the light emitting elements LD may be uniformly (e.g., substantially uniformly) sprayed without (or substantially without) being unevenly agglomerated in the solution.

The light emitting unit (or light emitting device) including the light emitting element LD described above may be used for various suitable types or kinds of electronic devices that require light sources, in addition to a display device. For example, when a plurality of light emitting elements LD are in a pixel region of each pixel of a display panel, the light emitting elements LD may be used as a light source for each pixel. However, an application field of the light emitting element LD is not limited to the above-described example. For example, the light emitting element LD may also be used for other types or kinds of electronic devices that require light sources, such as an illumination device.

Figure 8:
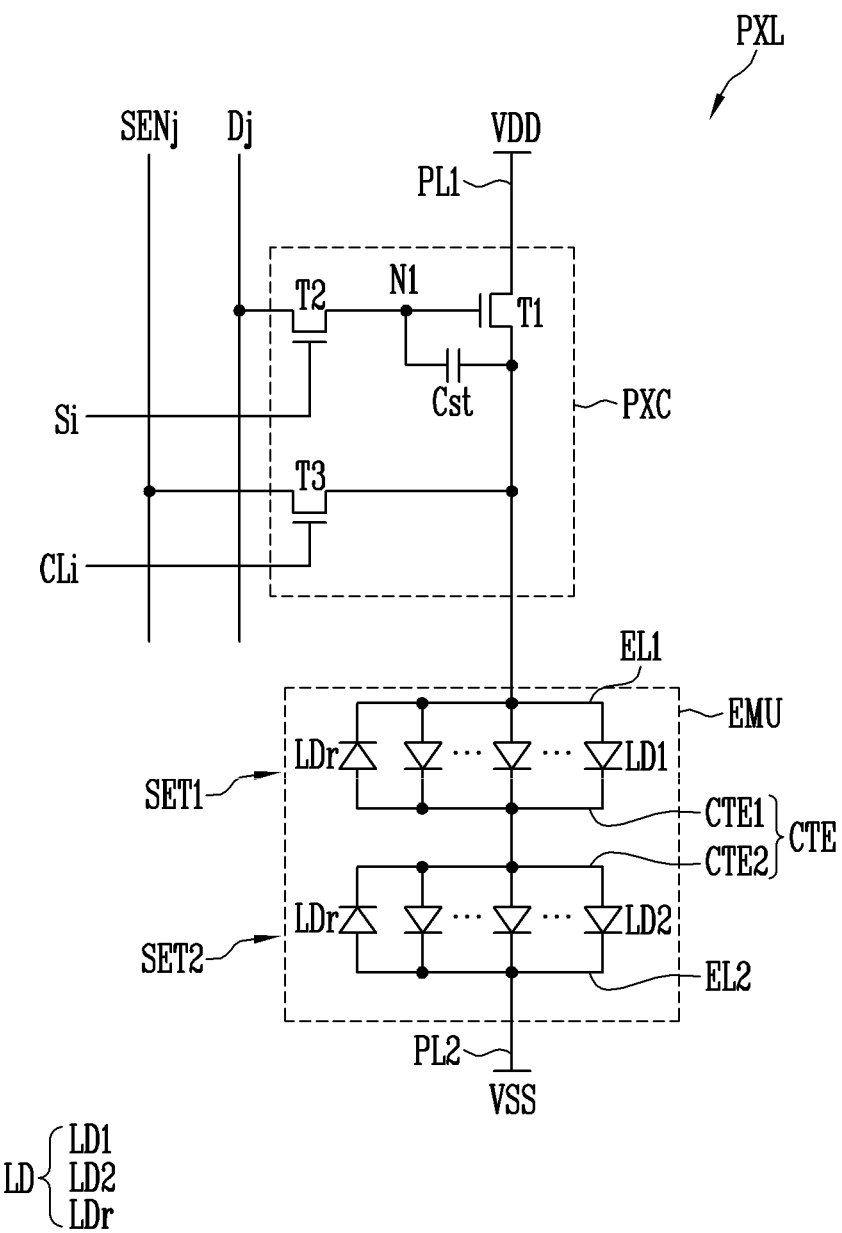
FIG. 8 is a circuit diagram illustrating an electrical connection relationship between configuration elements included in one pixel illustrated in FIG. 5, according to an embodiment.

FIG. 8 is a circuit diagram illustrating an electrical connection relationship between configuration elements included in one pixel PXL illustrated in FIG. 5, according to an embodiment.

For example, FIG. 8 illustrates an electrical connection relationship between configuration elements included in the pixel PXL that may be applied to an active display device, according to an embodiment. However, the types or kinds of configuration elements included in the pixel PXL to which the embodiment of the present disclosure may be applied are not limited thereto.

In FIG. 8, not only the configuration elements included in the pixel illustrated in FIG. 5 but also a region in which the configuration elements are provided is referred to as the pixel PXL.

Referring to FIGS. 5 to 8, one pixel PXL (hereinafter referred to as a "pixel") may include a light emitting unit EMU that generates light with a luminance corresponding to a data signal. In addition, the pixel PXL may further include selectively a pixel circuit PXC that drives the light emitting unit EMU.

The pixel circuit PXC may be coupled to a scan line Si and a data line Dj of the pixel PXL. For example, when the pixel PXL is in an $i^{th}$ (i is a natural number) row and a $j^{th}$ (j is a natural number) column of the display region DA, the pixel circuit PXC of the pixel PXL may be coupled to the $i^{th}$ scan line Si and the $j^{th}$ data line Dj of the display region DA. In addition, the pixel circuit PXC may be coupled to an $i^{th}$ control line CLi and a $j^{th}$ sensing line SENj of the display region DA.

The pixel circuit PXC described above may include a first transistor T1 to a third transistor T3 and a storage capacitor Cst.

A first terminal of a second transistor T2 (switching transistor) may be coupled to the $j^{th}$ data line Dj, and a second terminal thereof may be coupled to a first node N1. Here, the first terminal and the second terminal of the second transistor T2 may be different from each other, and for example, if the first terminal is a drain electrode, the second terminal may be a source electrode. In addition, a gate electrode of the second transistor T2 may be coupled to the $i^{th}$ scan line Si.

The second transistor T2 is turned on when a scan signal having a voltage by which the second transistor T2 may be turned on is supplied from the $i^{th}$ scan line Si, and thereby, the $j^{th}$ data line Dj and the first node N1 are electrically coupled to each other. In this case, a data signal of a corresponding frame is supplied to the $j^{th}$ data line Dj, and accordingly, the data signal is transmitted to the first node N1. The data signal transmitted to the first node N1 is charged in the storage capacitor Cst.

A first terminal of the first transistor T1 (drive transistor) may be coupled to a first drive power supply VDD, and a second terminal thereof may be electrically coupled to a first electrode EL1 of each of the light emitting elements LD. A gate electrode of the first transistor T1 may be coupled to the first node N1. The first transistor T1 may control a drive current supplied from the first drive power supply VDD to the light emitting elements LD through a second node in response to a voltage of the first node N1. The second node may be a point at which the second terminal of the first transistor T1 and the first electrode EL1 are electrically coupled.

The third transistor T3 may be coupled between the first transistor T1 and the $j^{th}$ sensing line SENj. For example, a first terminal of the third transistor T3 may be coupled to the first terminal of the first transistor T1 coupled to the first electrode EL1, and a second terminal of the third transistor T3 may be coupled to the $j^{th}$ sensing line SENj. A gate electrode of the third transistor T3 may be coupled to the $i^{th}$ control line CLi. The third transistor T3 is turned on by a control signal having a gate-on voltage supplied to the $i^{th}$ control line CLi during a set or predetermined sensing period, and thereby, the $j^{th}$ sensing line SENj and the first transistor T1 are electrically coupled to each other.

The sensing period may be a period in which characteristic information (for example, a threshold voltage of the first transistor T1 and so on) of each of the pixels PXL in the display region DA is extracted.

One electrode of the storage capacitor Cst may be coupled to the first drive power supply VDD, and the other electrode thereof may be coupled to the first node N1. The storage capacitor Cst may charge a voltage corresponding to a data signal supplied to the first node N1 and may maintain the charged voltage until a data signal of a next frame is supplied.

The light emitting unit EMU may include a plurality of light emitting elements LD coupled in parallel between a first power line PL1 to which a voltage of the first drive power supply VDD is applied and a second power line PL2 to which a voltage of a second drive power supply VSS is applied. For example, the light emitting unit EMU may include a first electrode EL1 (or a "first alignment electrode") coupled to the first drive power supply VDD through the pixel circuit PXC and the first power line PL1, a second electrode EL2 (or a "second alignment electrode") coupled to the second drive power supply VSS through the second power line PL2, and a plurality of light emitting elements LD coupled in parallel in the same (e.g., substantially the same) direction between the first and second electrodes EL1 and EL2.

Each of the light emitting elements LD included in the light emitting unit EMU may include one end coupled to the first drive power supply VDD through the first electrode EL1 and the other end coupled to the second drive power supply VSS through the second electrode EL2. The first drive power supply VDD and the second drive power supply VSS may have different potentials. For example, the first drive power supply VDD may be set as a high potential power supply, and the second drive power supply VSS may be set as a low potential power supply. In this case, a potential difference between the first and second drive power supplies VDD and VSS may be set to be greater than or equal to a threshold voltage of the light emitting elements LD during a light emitting period of the pixel PXL.

As described above, each of the light emitting elements LD coupled in parallel in the same (e.g., substantially the same) direction (for example, a forward direction) between the first electrode EL1 and the second electrode EL2 to which voltages of different potentials are respectively supplied may constitute each of effective light sources. The effective light sources may constitute the light emitting unit EMU of the pixel PXL.

The light emitting elements LD of the light emitting unit EMU may emit light with a luminance corresponding to a drive current supplied through the pixel circuit PXC. For example, during each frame period, the pixel circuit PXC may supply a drive current corresponding to a gray level value of the corresponding frame data to the light emitting unit EMU. The drive current supplied to the light emitting unit EMU may be divided and flow into each of the light emitting elements LD. Accordingly, while each of the light emitting elements LD emits light with a luminance corresponding to a current flowing therethrough, the light emitting unit EMU may emit light with a luminance corresponding to the drive current.

In some embodiments, the light emitting unit EMU may further include at least one non-effective light source, for example, reverse light emitting elements LDr, in addition to the light emitting elements LD constituting each of the effective light sources. The reverse light emitting elements LDr may be coupled in parallel between the first and second electrodes EL1 and EL2 together with the light emitting elements LD constituting the effective light sources and may be coupled between the first and second electrodes EL1 and EL2 in a direction opposite to the light emitting elements LD. The reverse light emitting elements LDr maintain an inactive state even when a set or predetermined drive voltage (for example, a forward drive voltage) is applied between the first and second electrodes EL1 and EL2, and accordingly, a current does not substantially flow through the light emitting elements LDr.

The light emitting unit EMU may also include at least one series stage including the plurality of light emitting elements LD coupled in parallel with each other. For example, the light emitting unit EMU may also be composed of a series and parallel mixed structure as illustrated in FIG. 8.

The light emitting unit EMU may include first and second series stages SET1 and SET2 sequentially coupled between the first and second drive power supplies VDD and VSS. The first and second series stages SET1 and SET2 may respectively include two pairs of electrodes EL1 and CTE1 and CTE2 and EL2, and a plurality of light emitting elements LD coupled in parallel in the same (e.g., substantially the same) direction between the electrodes EL1 and CTE1 and between the electrodes CTE2 and EL2.

The first series stage SET1 may include the first electrode EL1 and the first intermediate electrode CTE1 and may include one or more first light emitting elements LD1 coupled between the first electrode EL1 and the first intermediate electrode CTE1. In addition, the first series stage SET1 may include the reverse light emitting element LDr coupled between the first electrode EL1 and the first intermediate electrode CTE1 in a direction opposite to the first light emitting elements LD1.

The second series stage SET2 may include the second intermediate electrode CTE2 and the second electrode EL2 and may include one or more light emitting elements LD2 coupled between the second intermediate electrode CTE2 and the second electrode EL2. In addition, the second series stage SET2 may include the reverse light emitting element LDr coupled between the second intermediate electrode CTE2 and the second electrode EL2 in a direction opposite to the second light emitting elements LD2.

The first intermediate electrode CTE1 of the first series stage SET1 and the second intermediate electrode CTE2 of the second series stage SET2 may be integrally formed to be coupled to each other. For example, the first intermediate electrode CTE1 and the second intermediate electrode CTE2 may constitute an intermediate electrode CTE that electrically couples the first series stage SET1 and the second series stage SET2 which are consecutively arranged. When the first intermediate electrode CTE1 and the second intermediate electrode CTE2 are formed integrally, the first intermediate electrode CTE1 and the second intermediate electrode CTE2 are different regions of the intermediate electrode CTE.

In the above-described embodiment, the first electrode EL1 of the first series stage SET1 may be an anode electrode of the light emitting unit EMU of each of the pixels PXL, and the second electrode EL2 of the second series stage SET2 may be a cathode electrode of the light emitting unit EMU.

FIG. 8 illustrates an embodiment in which all of the first to third transistors T1 to T3 are n-type transistors, but the present disclosure is not limited thereto. For example, at least one of the first to third transistors T1 to T3 described above may also be changed to a p-type transistor. In addition, FIG. 8 illustrates an embodiment in which the light emitting unit EMU is coupled between the pixel circuit PXC and the second drive power supply VSS, but the light emitting unit EMU may also be coupled between the first drive power supply VDD and the pixel circuit PXC.

A structure of the pixel circuit PXC may be variously changed. For example, the pixel circuit PXC may further include at least one transistor element such as a transistor element for initializing the first node N1 and/or a transistor element for controlling light emission times of the light emitting elements LD or may further include other circuit elements such as a boosting capacitor for boosting a voltage of the first node N1.

A structure of the pixel PXL applicable to the present disclosure is not limited to the embodiment illustrated in FIG. 8, and the pixel PXL may have various suitable structures. For example, the pixel PXL may also be included in a passive light emitting display device or so on. In this case, the pixel circuit PXC may be omitted, and both ends of the light emitting elements LD included in the light emitting unit EMU may also be coupled to the $i^{th}$ scan line Si, the $j^{th}$ data line Dj, the first power line PL1 coupled to the first drive power supply VDD, the second power line PL2 coupled to the second drive power supply VSS, a set or predetermined control line, and/or so on.

Figure 9:
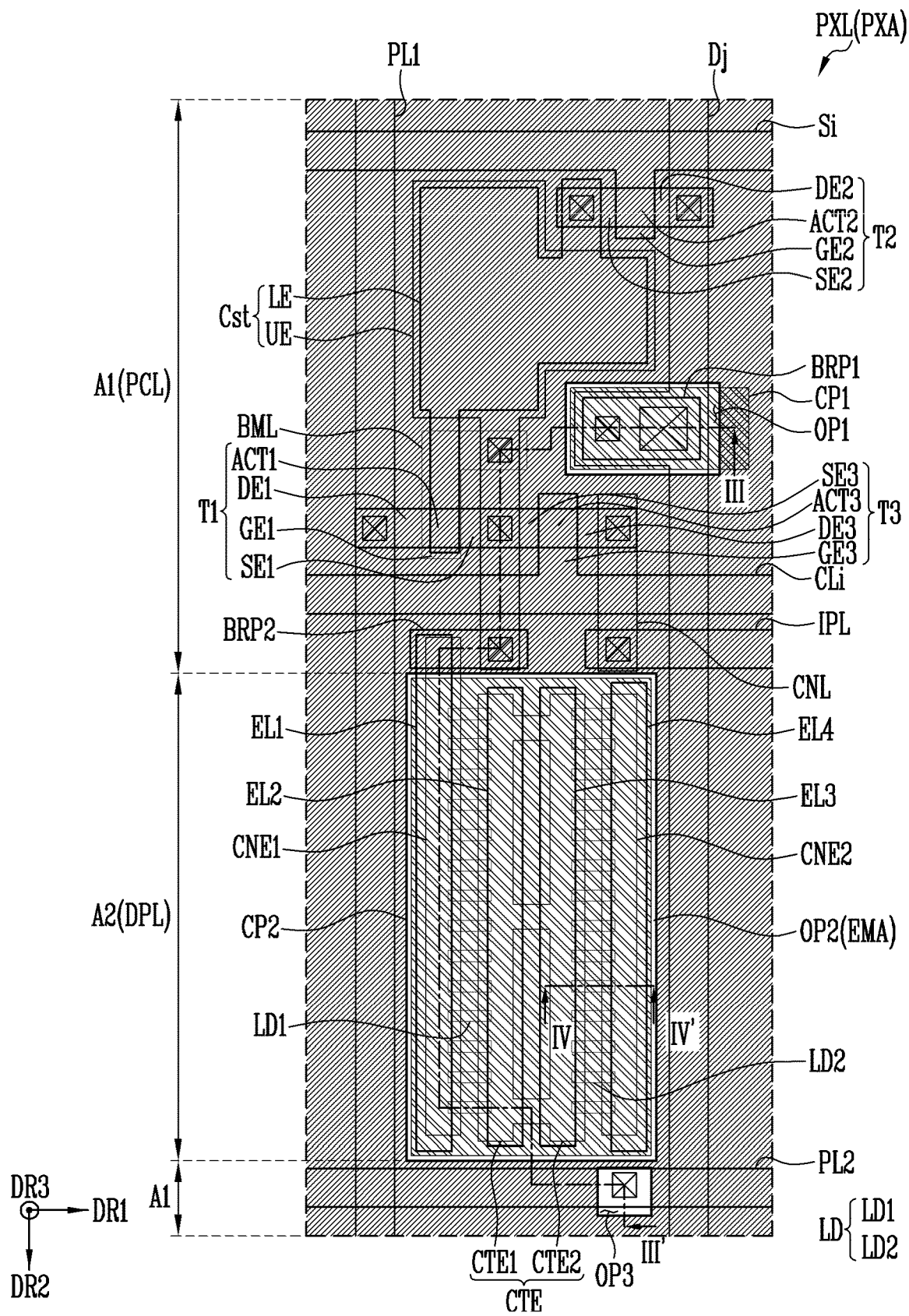
FIG. 9 is a plan view schematically illustrating one of the pixels illustrated in FIG. 5.
Figure 10:
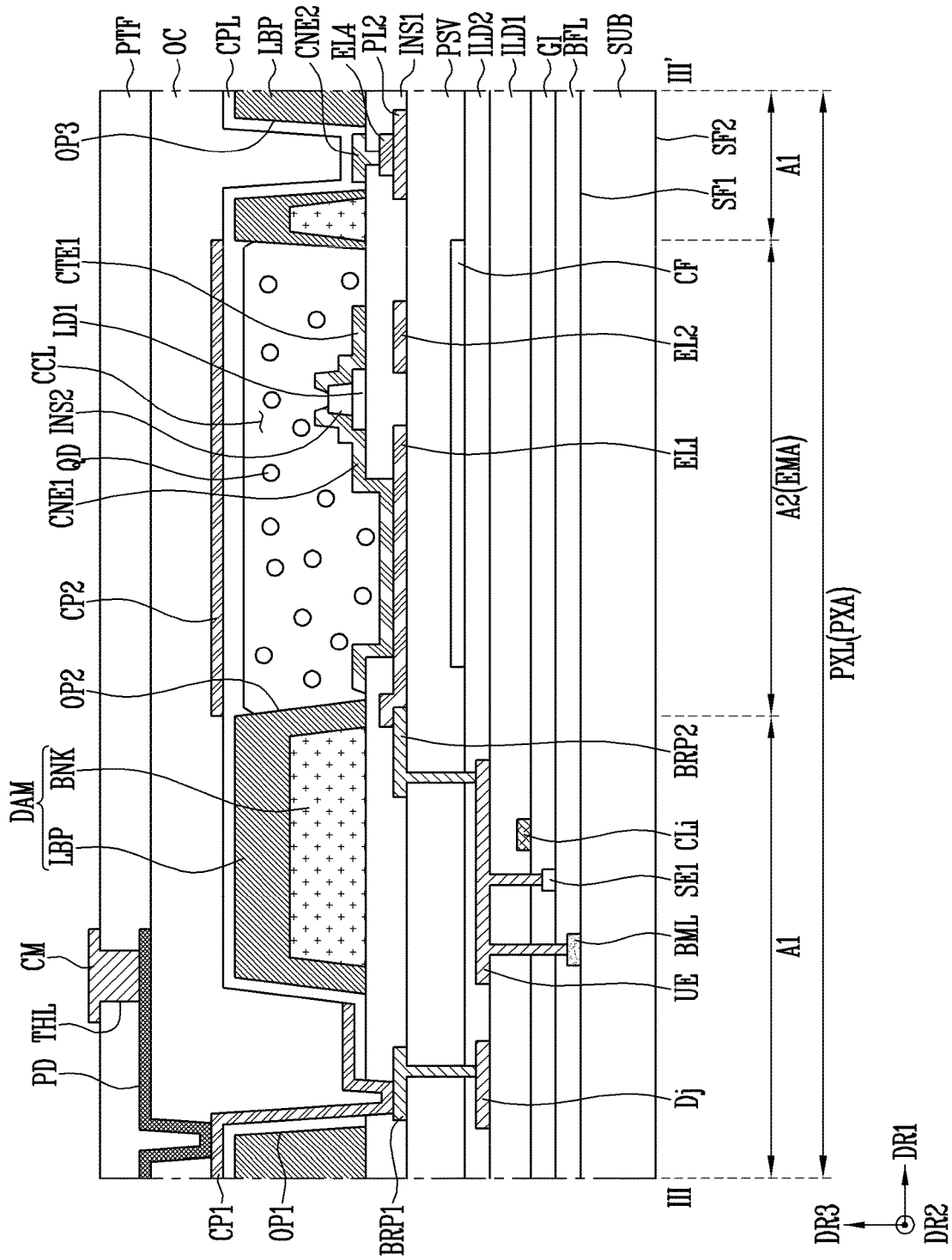
FIGS. 10 and 11 are cross-sectional views taken along line III-IIl' of FIG. 9.
Figure 11:
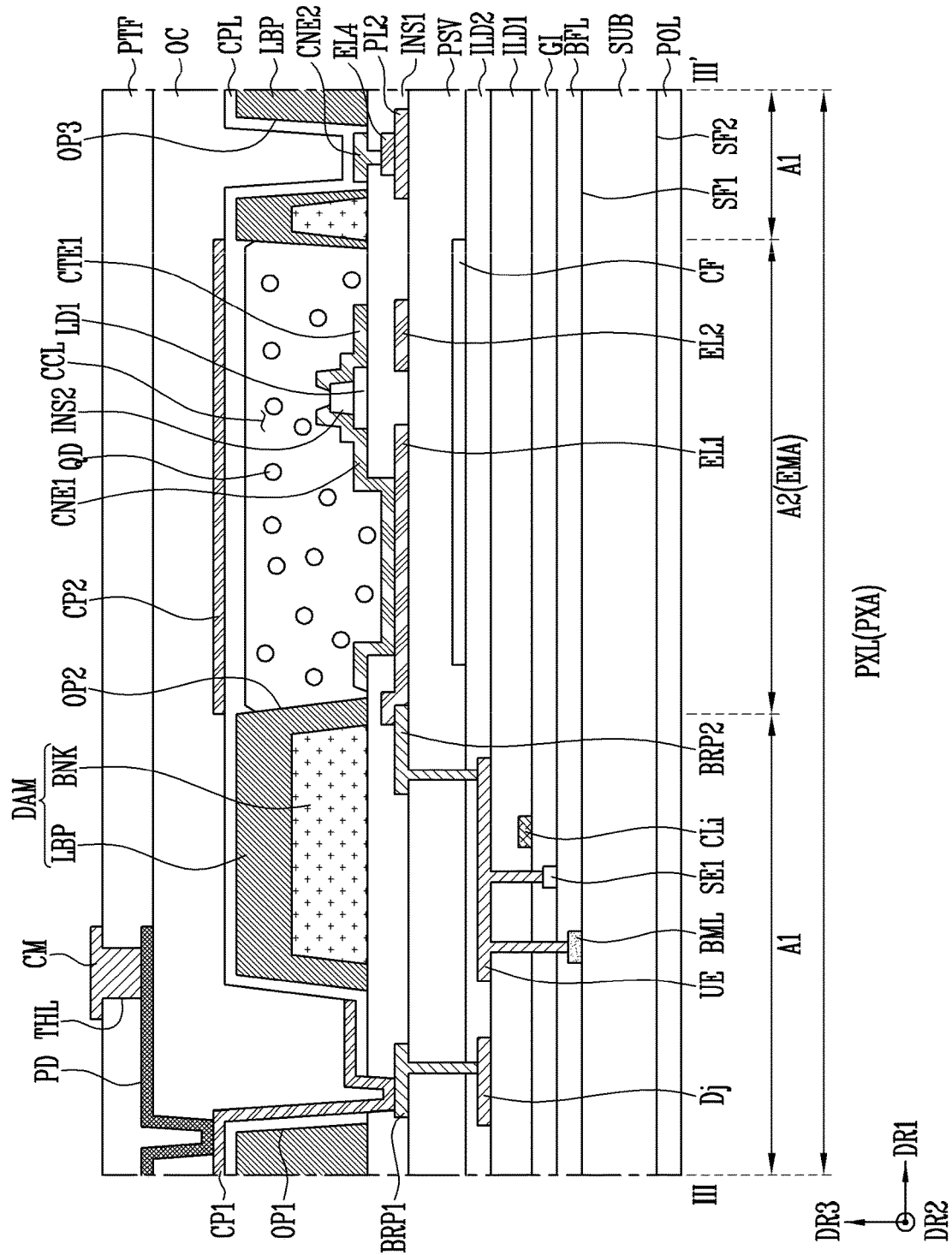
Figure 12:
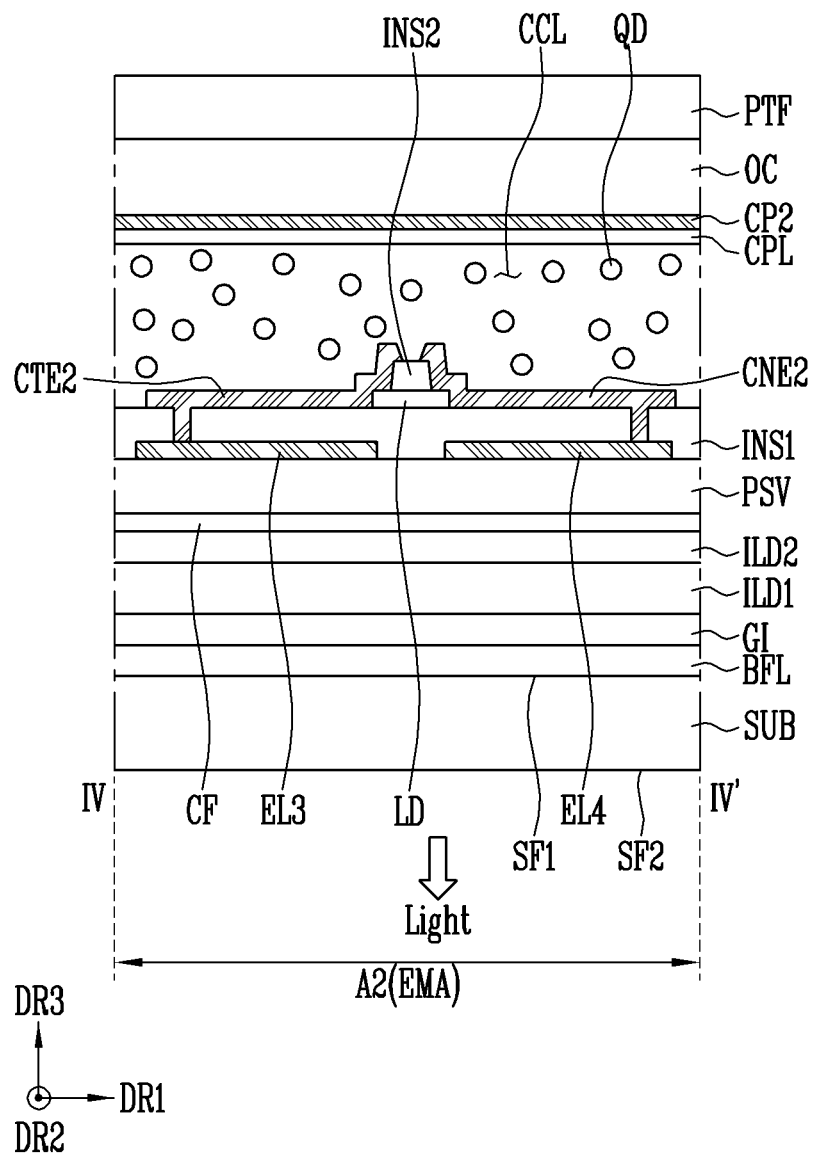
FIGS. 12 and 13 are cross-sectional views taken along line IV-IV' of FIG. 9.
Figure 13:
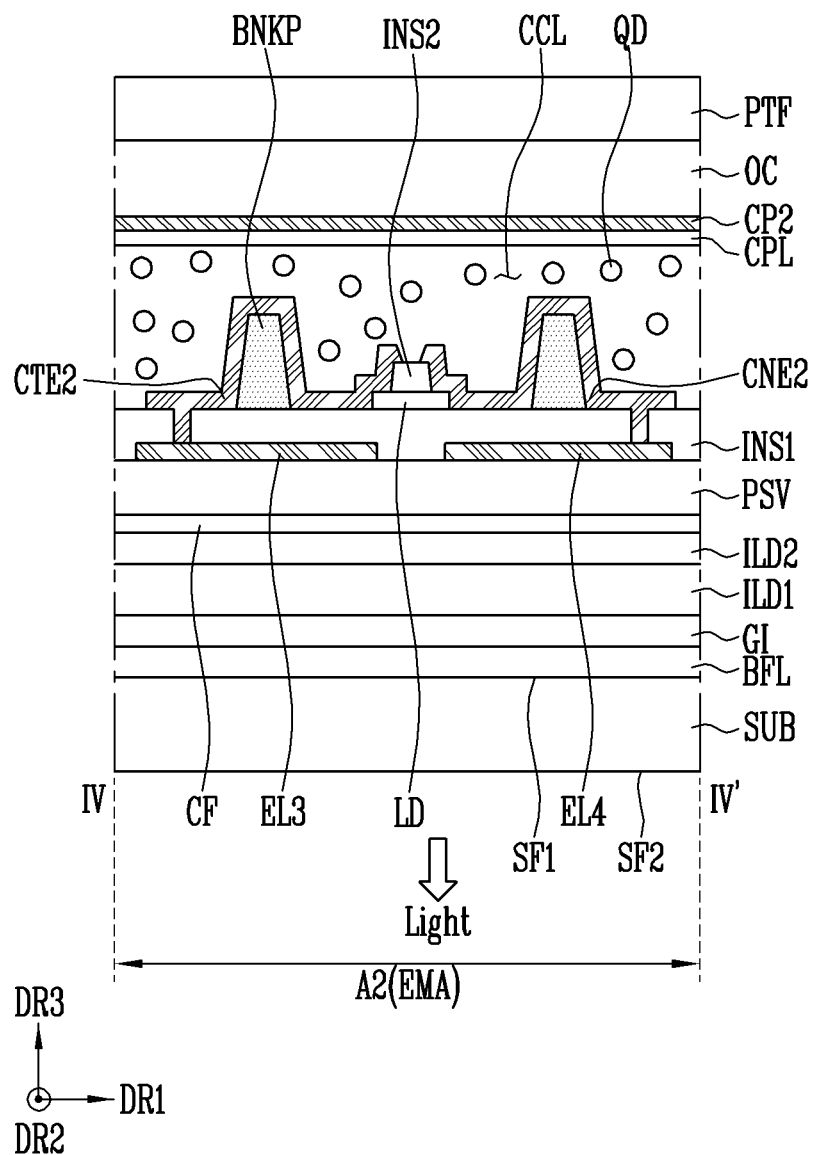

FIG. 9 is a plan view schematically illustrating one of the pixels PXL illustrated in FIG. 5, FIGS. 10 and 11 are cross-sectional views taken along line III-III' of FIG. 9, and FIGS. 12 and 13 are cross-sectional views taken along line IV-IV' of FIG. 9.

For the sake of convenience, FIG. 9 illustrates the scan line Si, the control line CLi, the data line Dj, and the power lines PL1 and PL2 which are coupled to the pixel PXL at an intersection of the $j^{th}$ pixel column and the $i^{th}$ pixel row.

In addition, for the sake of convenient description, among the lines coupled to the pixel PXL, a data line of the $j^{th}$ column to which a data signal is applied is named the "data line Dj", a scan of the $i^{th}$ row is named the "scan line Si", a power line coupled to the first drive power supply VDD is named the "first power line PL1", and a power line coupled to the second drive power supply VSS) is named the "second power line PL2," but the present disclosure is not limited thereto.

Although FIGS. 9 to 13 illustrate an embodiment in which a light emitting region EMA of each pixel PXL includes the light emitting elements LD at two series stages, the present disclosure is not limited thereto, and the number of series stages in the light emitting region EMA may be variously changed depending on embodiments.

Although FIGS. 10 to 13 illustrate that one pixel PXL is simplified such as illustrating each electrode as an electrode of a single layer and each insulating layer as an insulating layer of a single layer, the present disclosure is not limited thereto.

In addition, in one embodiment of the present disclosure, "being formed and/or provided in the same layer" may indicate being formed in the same process, and "being formed and/or provided in different layers" may indicate being formed in different processes.

Additionally, in FIGS. 9 to 13, the first to third directions DR1, DR2, and DR3 may indicate directions indicated by the first to third directions DR1, DR2, and DR3, respectively.

Referring to FIG. 5, and FIGS. 9 to 13, the pixel PXL according to an embodiment of the present disclosure may be in a pixel region PXA in the display region DA of the substrate SUB.

A plurality of insulating layers and a plurality of conductive layers may be on the substrate SUB. The insulating layers may include, for example, a buffer layer BFL, a gate insulating layer GI, first and second interlayer insulating layers ILD1 and ILD2, a protective layer PSV, first and second insulating layers INS1 and INS2, a capping layer CPL, and so on, which are sequentially formed on the substrate SUB. The conductive layers may be provided and/or formed between the above-described insulating layers. The conductive layers may include, for example, a first conductive layer formed on the substrate SUB, a second conductive layer formed on the gate insulating layer GI, a third conductive layer formed on the first interlayer insulating layer ILD1, a fourth conductive layer formed on the layer PSV, a fifth conductive layer formed on the fourth conductive layer, a sixth conductive layer formed on the second insulating layer INS2, and a seventh conductive layer formed on the capping layer CPL. However, the insulating layers and conductive layers formed over the substrate SUB are not limited to the above-described embodiments, and other insulating layers and other conductive layers other than the insulating layers and conductive layers described above may be formed on the substrate SUB according to embodiments.

The substrate SUB may include a first surface SF1 and a second surface SF2 facing each other in the third direction DR3.

A wiring portion electrically coupled to the pixel PXL may be on the first surface SF1. The wiring portion may include a plurality of signal lines that transmit a set or predetermined signal (or a set or predetermined voltage) to the pixel PXL. The signal lines may include the scan line Si, the data line Dj, the control line CLi, the first power line PL1, the second power line PL2, and an initialization power line IPL.

The scan line Si may extend in the first direction DR1 (or a horizontal direction). A scan signal may be applied to the scan line Si. The scan line Si may be the $i^{th}$ scan line Si described with reference to FIG. 8. The scan line Si may be a second conductive layer formed on the gate insulating layer GI. The second conductive layer may be a single layer formed with a single material selected from the group consisting of copper (Cu), molybdenum (Mo), tungsten (W), aluminum neodymium (AlNd), titanium (Ti), aluminum (Al), silver (Ag), an alloys thereof, and a mixture thereof, or the second conductive layer may be formed in a double-layer structure or a multi-layer structure of low-resistance materials such as molybdenum (Mo), titanium (Ti), copper (Cu), aluminum (Al), and/or silver (Ag) to reduce wiring resistance.

The gate insulating layer GI may be an inorganic insulating layer including an inorganic material. For example, the gate insulating layer GI may include at least one of metal oxides such as silicon nitride (SiNx), silicon oxide (SiOx), silicon oxynitride (SiOxNy), and/or aluminum oxide (AlOx). However, the material of the gate insulating layer GI is not limited to the above-described embodiments. In some embodiments, the gate insulating layer GI may also be formed of an organic insulating layer including an organic material. The gate insulating layer GI may be formed as a single layer but may also be formed as multiple layers of at least double layers.

The data line Dj may extend in the second direction DR2 (or a vertical direction). A data signal may be applied to the data line Dj. The data line Dj may be the $j^{th}$ data line Dj described with reference to FIG. 8. The data line Dj may be electrically coupled to the second transistor T2 of the pixel PXL. The data line Dj may be a third conductive layer formed on the first interlayer insulating layer ILD1.

The third conductive layer may include the same (e.g., substantially the same) material as the second conductive layer or may include one or more materials selected from the materials provided herein as examples of constituent materials of the second conductive layer.

The control line CLi may extend in the first direction DR1 to be spaced apart from the scan line Si. A control signal may be applied to the control line CLi. The control line CLi may be the $i^{th}$ control line CLi described with reference to FIG. 8. The control line CLi may be provided and/or formed on the same layer as the scan line Si. For example, the control line CLi may be the second conductive layer formed on the gate insulating layer GI.

A voltage of the first drive power supply VDD may be applied to the first power line PL1. The first power line PL1 may be the first power line PL1 described with reference to FIG. 8. The first power line PL1 may extend in the second direction DR2 and may be spaced apart from the data line Dj in the pixel region PXA in the first direction DR1. The first power line PL1 may be formed on the same layer as the data line Dj. For example, the first power line PL1 may be the third conductive layer formed on the first interlayer insulating layer ILD1.

A voltage of the second drive power supply VSS may be applied to the second power line PL2. The second power line PL2 may be the second power line PL2 described with reference to FIG. 8. The second power line PL2 may extend in the first direction DR1. The second power line PL2 may be the fourth conductive layer formed on the protective layer PSV. The fourth conductive layer may include the same (e.g., substantially the same) material as the second conductive layer or may include one or more materials selected from the materials provided herein as examples of constituent materials of the second conductive layer.

The initialization power line IPL may extend in the first direction DR1 and may be spaced apart from the control line CLi. The initialization power line IPL may be the $j^{th}$ sensing line SENj described with reference to FIG. 8. The initialization power line IPL may be electrically coupled to the third transistor T3 in the pixel region PXA. A voltage of an initialization power supply may be applied to the initialization power line IPL. The initialization power line IPL may be the second conductive layer formed on the gate insulating layer GI. The scan line Si, the control line CLi, and the initialization power line IPL may be provided and/or formed on the same layer.

The light emitting elements LD may be in the light emitting region EMA of the pixel region PXA, and circuit elements for driving the light emitting elements LD may be in a peripheral region of the pixel region PXA.

In one embodiment, the pixel region PXA may include a first region A1 and a second region A2 partitioned in one direction, for example, the second direction DR2. A pixel circuit portion PCL may be in the first region A1, and a display element portion DPL may be in the second region A2. The first region A1 may correspond to a peripheral region adjacent to the light emitting region EMA, and the second region A2 may correspond to the light emitting region EMA. Here, the peripheral region may include a non-light emission region from which light is not emitted.

For the sake of convenience, the pixel circuit portion PCL is first described, and then the display element portion DPL will be described.

The pixel circuit portion PCL may include a bottom metal layer BML in the first region A1, a pixel circuit (refer to "PXC" in FIG. 8), and signal lines electrically coupled to the pixel circuit PXC.

The bottom metal layer BML may be provided and/or formed on the substrate SUB. The bottom metal layer BML may be a light blocking layer that prevents or reduces travel of light incident through the second surface SF2 (or a lower surface) of the substrate SUB to the first transistor T1 of the pixel PXL. For example, the bottom metal layer BML prevents or reduces travel of the light incident through the second surface SF2 of the substrate SUB to a semiconductor layer of the first transistor T1, thereby preventing or reducing occurrence of an abnormal operation of the first transistor T1. To this end, the bottom metal layer BML may be on the substrate SUB to overlap the first transistor T1. For example, the bottom metal layer BML may be on the substrate SUB to overlap a first gate electrode GE1 of the first transistor T1. In one embodiment of the present disclosure, the bottom metal layer BML may be a first conductive layer provided and/or formed on the substrate SUB. The first conductive layer may include the same (e.g., substantially the same) material as the second conductive layer or may include one or more materials selected from the materials provided herein as examples of constituent materials of the second conductive layer.

The bottom metal layer BML may be electrically and/or physically coupled to an upper electrode UE of the storage capacitor Cst through a contact hole CH penetrating the buffer layer BFL, the gate insulating layer GI, and the first interlayer insulating layer ILD1.

The upper electrode UE may be a third conductive layer CL3 provided and/or formed over the first interlayer insulating layer ILD1 and may overlap the bottom metal layer BML when viewed in plan and cross-section. The upper electrode UE may be formed on the same layer as the data line Dj and the first power line PL1 and may include the same (e.g., substantially the same) material and may be formed in the same process.

The first interlayer insulating layer ILD1 may include the same (e.g., substantially the same) material as the gate insulating layer GI or may include at least one material selected from materials provided herein as examples of constituent materials of the gate insulating layer GI. According to an embodiment, the first interlayer insulating layer ILD1 may include an organic insulating layer including an organic material.

One region of the upper electrode UE may be coupled to the bottom metal layer BML through the contact hole CH penetrating through the buffer layer BFL, the gate insulating layer GI, and the first interlayer insulating layer ILD1. In addition, the other region of the upper electrode UE may be coupled to a first source region SE1 of the first transistor T1 through the contact hole CH penetrating the gate insulating layer GI and the first interlayer insulating layer ILD1. As a result, the bottom metal layer BML may be coupled to the first source region SE1 of the first transistor T1.

As described above, when the bottom metal layer BML is coupled to the first source region SE1 of the first transistor T1, a swing width margin of the second drive power supply VSS may be obtained. In this case, a drive range of a gate voltage applied to the first gate electrode GE1 of the first transistor T1 may be widened.

The buffer layer BFL may be formed on the first conductive layer and may prevent or reduce diffusion of impurities and/or the like into the pixel circuit PXC. The buffer layer BFL may be an inorganic insulating layer including an inorganic material. The buffer layer BFL may include at least one of metal oxides such as silicon nitride (SiNx), silicon oxide (SiOx), silicon oxynitride (SiOxNy), and/or aluminum oxide (AlOx). The buffer layer BFL may be formed as a single layer but may also be formed as multiple layers of at least double layers. When the buffer layer BFL is formed as multiple layers, each of the multiple layers may be formed of the same material or different materials. The buffer layer BFL may also be omitted depending on materials and process conditions of the substrate SUB.

The pixel circuit PXC may include first to third transistors T1 to T3 and a storage capacitor Cst formed on the buffer layer BFL.

The first transistor T1 may be the first transistor T1 described with reference to FIG. 8, the second transistor T2 may be the second transistor T2 described with reference to FIG. 8, and the third transistor T3 may be the third transistor T3 described with reference to FIG. 8.

The first transistor T1 may include a first gate electrode GE1, a first active pattern ACT1, a first source region SE1, and a first drain region DE1.

The first gate electrode GE1 may be coupled to the second source region SE2 of the second transistor T2 through the contact hole CH penetrating the gate insulating layer GI. The first gate electrode GE1 may be provided and/or formed on the gate insulating layer GI. The first gate electrode GE1 may be a second conductive layer provided and/or formed on the gate insulating layer GI.

The first active pattern ACT1, the first source region SE1, and the first drain region DE1 may be semiconductor patterns formed of poly silicon (e.g., polycrystalline silicon), amorphous silicon, oxide semiconductor, and/or the like. The first active pattern ACT1, the first source region SE1, and the first drain region DE1 may be formed of a semiconductor layer that is not doped with impurities or doped with impurities. For example, the first source region SE1 and the first drain region DE1 may be formed of a semiconductor layer doped with impurities, and the first active pattern ACT1 may be formed of a semiconductor layer that is not doped with impurities. The impurities may include, for example, an n-type impurity.

The first active pattern ACT1, the first source region SE1, and the first drain region DE1 may be provided and/or formed on the buffer layer BFL.

The first active pattern ACT1 may overlap the first gate electrode GE1 and may be a channel region of the first transistor T1. When the first active pattern ACT1 is formed to be long, the channel region of the first transistor T1 may be formed to be long. In this case, a drive range of a gate voltage (or gate signal) applied to the first transistor T1 may be widened. Accordingly, a gray level of light emitted from the light emitting elements LD may be precisely controlled.

The first source region SE1 may be coupled to (or in contact with) one end of the first active pattern ACT1. In addition, the first source region SE1 may be electrically coupled to the upper electrode UE through the contact hole CH penetrating the gate insulating layer GI and the first interlayer insulating layer ILD1.

The first drain region DE1 may be coupled to (or in contact with) the other end of the first active pattern ACT1. In addition, the first drain region DE1 may be coupled to the first power line PL1 through the contact hole CH penetrating the gate insulating layer GI and the first interlayer insulating layer ILD1. Accordingly, a voltage of the first drive power supply VDD may be applied to the first drain region DE1.

The second transistor T2 may include a second gate electrode GE2, a second active pattern ACT2, a second source region SE2, and a second drain region DE2.

The second gate electrode GE2 may be formed integrally with the scan line Si. In this case, the second gate electrode GE2 may be formed as a part of the scan line Si or may be formed to protrude from the scan line Si. The second gate electrode GE2 may be a second conductive layer provided and/or formed on the gate insulating layer GI.

Although the above-described embodiment describes that the second gate electrode GE2 is formed integrally with the scan line Si to be electrically coupled to the scan line Si, the present disclosure is not limited thereto. In some embodiments, the second gate electrode GE2 may be formed non-integrally with the scan line Si and may also be electrically coupled to the scan line Si through a separate connection member.

The second active pattern ACT2, the second source region SE2, and the second drain region DE2 may be semiconductor patterns formed of poly silicon (e.g., polycrystalline silicon), amorphous silicon, oxide semiconductor, and/or the like. The second active pattern ACT2, the second source region SE2, and the second drain region DE2 may be formed of a semiconductor layer that is not doped with impurities or doped with impurities. For example, the second source region SE2 and the second drain region DE2 may be formed of a semiconductor layer doped with impurities, and the second active pattern ACT2 may be formed of a semiconductor layer that is not doped with impurities. The impurities may include, for example, an n-type impurity.

The second active pattern ACT2, the second source region SE2, and the second drain region DE2 may be provided and/or formed on the buffer layer BFL.

The second active pattern ACT2 may overlap the second gate electrode GE2 and may be a channel region of the second transistor T2.

The second source region SE2 may be coupled to (or in contact with) one end of the second active pattern ACT2. In addition, the second source region SE2 may be coupled to the first gate electrode GE1 of the first transistor T1 through the contact hole CH penetrating the buffer layer BFL.

The second drain region DE2 may be coupled to (or in contact with) the other end of the second active pattern ACT2. In addition, the second drain region DE2 may be coupled to the data line Dj through a contact hole penetrating the gate insulating layer GI and the first interlayer insulating layer ILD1.

The third transistor T3 may include a third gate electrode GE3, a third active pattern ACT3, a third source region SE3, and a third drain region DE3.

The third gate electrode GE3 may be formed integrally with the control line CLi. In this case, the third gate electrode GE3 may be formed as a part of the control line CLi or may be formed to protrude from the control line CLi. The third gate electrode GE3 may be a second conductive layer provided and/or formed on the gate insulating layer GI.

Although the above-described embodiment describes that the third gate electrode GE3 is formed integrally with the control line CLi to be electrically coupled to the control line CLi, the present disclosure is not limited thereto. In some embodiments, the third gate electrode GE3 may be formed non-integrally with the control line CLi and may be electrically coupled to the control line CLi through a separate connection member.

The third active pattern ACT3, the third source region SE3, and the third drain region DE3 may be semiconductor patterns formed of poly silicon (e.g., polycrystalline silicon), amorphous silicon, an oxide semiconductor, and/or the like. The third active pattern ACT3, the third source region SE3, and the third drain region DE3 may be formed of a semiconductor layer that is not doped with impurities or doped with impurities. For example, the third source region SE3 and the third drain region DE3 may be formed of a semiconductor layer doped with impurities, and the third active pattern ACT3 may be formed of a semiconductor layer that is not doped with impurities. The impurities may include, for example, an n-type impurity.

The third active pattern ACT3, the third source region SE3, and the third drain region DE3 may be provided and/or formed on the buffer layer BFL.

The third active pattern ACT3 may overlap the third gate electrode GE3 and may be a channel region of the third transistor T3.

The third source region SE3 may be coupled to (or in contact with) one end of the third active pattern ACT3. In addition, the third source region SE3 may be coupled to the first source region SE1 of the first transistor T1.

The third drain region DE3 may be coupled to (or in contact with) the other end of the third active pattern ACT3. In addition, the third drain region DE3 may be electrically coupled to the initialization power line IPL through a connection line CNL.

The connection line CNL may be a third conductive layer provided and/or formed on the first interlayer insulating layer ILD1. One end of the connection line CNL may be electrically coupled to the third drain region DE3 through the contact hole CH penetrating the gate insulating layer GI and the first interlayer insulating layer ILD1. The other end of the connection line CNL may be electrically coupled to the initialization power line IPL through the contact hole CH penetrating the first interlayer insulating layer ILD1.

The storage capacitor Cst may include a lower electrode LE and the upper electrode UE. Here, the storage capacitor Cst may be the storage capacitor Cst described with reference to FIG. 8.

The lower electrode LE may be formed integrally with the first gate electrode GE1. When the lower electrode LE is formed integrally with the first gate electrode GE1, the lower electrode LE may be a region of the first gate electrode GE1.

When viewed in a plan view, the upper electrode UE may overlap the lower electrode LE and may be designed to have a larger area (or size) than the lower electrode LE. When viewed in a plan view, the upper electrode UE may overlap the first source region SE1 and may overlap the bottom metal layer BML. The upper electrode UE may be a third conductive layer provided and/or formed on the first interlayer insulating layer ILD1. The upper electrode UE may be provided and/or formed on the same layer as the data line Dj and the first power line PL1.

The upper electrode UE may be electrically coupled to the first source region SE1 of the first transistor T1, the third source region SE3 of the third transistor T3, and the bottom metal layer BML.

The pixel circuit portion PCL may further include first and second bridge patterns BRP1 and BRP2 in the first region A1 of the pixel region PXA.

The first bridge pattern BRP1 may be a fourth conductive layer formed on the protective layer PSV. The first bridge pattern BRP1 may overlap a first opening OP1 of a light blocking layer LBP and may be a first intermediate medium that electrically couples the data line Dj to the pad electrode PD. The first bridge pattern BRP1 may be formed on the same layer as the second power line PL2 and may include the same (e.g., substantially the same) material and may be formed in the same process.

One end of the first bridge pattern BRP1 may be electrically coupled to the data line Dj through the contact hole CH penetrating the second interlayer insulating layer ILD2 and the protective layer PSV. The other end of the first bridge pattern BRP1 may be electrically coupled to the first conductive pattern CP1 through the contact hole CH penetrating through the first insulating layer INS1.

The second bridge pattern BRP2 may be a fourth conductive layer spaced apart from the first bridge pattern BRP1 on the protective layer PSV. The second bridge pattern BRP2 may be an intermediate medium that is electrically coupled to a part of the pixel circuit portion PCL, for example, a part of the storage capacitor Cst and the display element portion DPL, for example, the first electrode EL1.

One end of the second bridge pattern BRP2 may be electrically coupled to the upper electrode UE through the contact hole CH penetrating the second interlayer insulating layer ILD2 and the protective layer PSV. The other end of the second bridge pattern BRP2 may be electrically coupled to the first electrode EL1.

The second interlayer insulating layer ILD2 may be provided and/or formed on the data line Dj, the upper electrode UE, and the first power line PL1. The second interlayer insulating layer ILD2 may include the same (e.g., substantially the same) material as the gate insulating layer GI or may include one or more materials selected from materials provided herein as examples of constituent materials of the gate insulating layer GI. In some embodiments, the second interlayer insulating layer ILD2 may include an organic insulating layer including an organic material.

The protective layer PSV may be provided and/or formed on the second interlayer insulating layer ILD2.

The protective layer PSV may include an organic insulating layer, an inorganic insulating layer, or an organic insulating layer on the inorganic insulating layer. The inorganic insulating layer may include at least one of metal oxides such as silicon oxide (SiOx), silicon nitride (SiNx), silicon oxynitride (SiOxNy), and/or aluminum oxide (AlOx). The organic insulating layer may include at least one of, for example, acrylic resin, epoxy resin, phenolic resin, polyamides resin, polyimide resin, unsaturated polyesters resin, poly-phenylene ethers resin, poly-phenylene sulfides resin, and/or benzocyclobutene resin.

The above-described embodiment may have a structure in which the data line Dj and the first power line PL1 are formed across all of the first and second regions A1 and A2 of the pixel region PXA.

A first insulating layer INS1 may be provided and/or formed on the first and second bridge patterns BRP1 and BRP2.

The first insulating layer INS1 may include the same (e.g., substantially the same) material as the gate insulating layer GI or may include one or more materials selected from materials provided herein as examples of constituent materials of the gate insulating layer GI. For example, the first insulating layer INS1 may be an inorganic insulating layer including an inorganic material, or an organic insulating layer including an organic material. In the first region A1, the first insulating layer INS1 may be partially opened to expose a part of the first bridge pattern BRP1.

A bank BNK may be provided and/or formed on the first insulating layer INS1.

The bank BNK may be a structure for defining (or partitioning) the pixel region PXA or the light emitting region EMA of the corresponding pixel PXL and adjacent pixels PXL and may be, for example, a pixel defining layer. The bank BNK may be a pixel defining layer or a dam structure for defining the light emitting region EMA to which the light emitting elements LD have to be supplied in a process of supplying the light emitting elements LD to the pixel PXL. For example, as the light emitting region EMA of the pixel PXL is partitioned by the bank BNK, a mixed solution (for example, ink) including the light emitting elements LD of a desired amount and/or type (or kind) may be supplied (introduced) to the light emitting region EMA.

The bank BNK may be configured to include at least one light blocking material and/or a reflective material to reduce a light leakage defect that light leaks between each pixel PXL and adjacent pixels PXL. In some embodiments, the bank BNK may include a transparent material (or substance). The transparent material may include, for example, polyamides resin, polyimide resin, and/or the like, but the present disclosure is not limited thereto. According to another embodiment, a reflective material layer may be separately provided and/or formed on the bank BNK so as to further increase efficiency of light emitted from each pixel PXL.

The light blocking layer LBP may be provided and/or formed on the bank BNK.

The light blocking layer LBP may include a light blocking material that reduces the light leakage defect that light leaks between the pixel PXL and adjacent pixels PXL. In this case, the light blocking layer LBP may be a black matrix. The light blocking layer LBP may prevent or reduce color mixing of light emitted from each of the adjacent pixels PXL. In some embodiments, the light blocking layer LBP may include at least one light blocking material and/or one reflective material to cause the light emitted from the light emitting elements LD in the second region A2 of the pixel region PXA to further travel toward an image display direction of the display device (refer to "DD" of FIG. 3), and thereby, light emission efficiency of the light emitting elements LD may be increased.

The light blocking layer LBP may include one or more openings exposing configuration elements under the light blocking layer LBP in the pixel region PXA of the pixel PXL. The light emitting region EMA of the pixel PXL may be defined by the opening of the light blocking layer LBP. For example, the light blocking layer LBP may include first to third openings OP1 to OP3 exposing configuration elements under the light blocking layer LBP in the pixel region PXA of the pixel PXL. The light emitting region EMA of the pixel PXL may correspond to the second opening OP2 of the light blocking layer LBP.

The light blocking layer LBP may be on the bank BNK in a peripheral region of the pixel region PXA to implement a dam portion DAM together with the bank BNK. A region surrounded by the dam portion DAM may correspond to the light emitting region EMA from which light is emitted in the pixel region PXA. For example, the dam portion DAM may surround the light emitting region EMA of the pixel PXL.

The dam portion DAM may be a structure for finally defining a light emitting region EMA from which light is emitted in the pixel PXL. In one embodiment, in a process of supplying a color conversion layer CCL including color conversion particles QD to the pixel PXL, the dam portion DAM may be a structure for finally defining the light emitting region EMA to which the color conversion layer CCL needs to be supplied. For example, as the light emitting region EMA of the pixel PXL is finally partitioned by the dam portion DAM, the color conversion layer CCL including the amount and/or type (or kind) of color conversion particles QD to be targeted may be supplied (or introduced) to the light emitting region EMA.

The first opening OP1 of the light blocking layer LBP may be in the first region A1 of the pixel region PXA. The first opening OP1 may be spaced apart from the second opening OP2. The first opening OP1 of the light blocking layer LBP may overlap a first bridge pattern BRP1.

The second opening OP2 of the light blocking layer LBP may be in the second region A2 of the pixel region PXA. The second opening OP2 may be spaced apart from the first and third openings OP1 and OP3. The second opening OP2 may overlap the light emitting elements LD and electrodes that apply electrical signals to the light emitting elements LD.

The third opening OP3 of the light blocking layer LBP may be in the first region A1 of the pixel region PXA. The third opening OP3 may be spaced apart from the second opening OP2. The light blocking layer LBP may overlap electrical contact portions of the second power line PL2 and a fourth electrode EL4.

A capping layer CPL may be provided and/or formed on the light blocking layer LBP.

The capping layer CPL may include the same (e.g., substantially the same) material as the gate insulating layer GI or may include one or more materials selected from materials provided herein as examples of constituent materials of the gate insulating layer GI. For example, the capping layer CPL may include an inorganic insulating layer including an inorganic material and/or an organic insulating layer including an organic material. The capping layer CPL may be partially opened to expose one region of the first bridge pattern BRP1.

A first conductive pattern CP1 may be provided and/or formed on the capping layer CPL.

The first conductive pattern CP1 may be a second intermediate medium that is electrically coupled to the first bridge pattern BRP1 to electrically couple the data line Dj to a pad electrode PD. In one embodiment, the first conductive pattern CP1 may be a connection portion for electrically coupling the data line Dj to the pad electrode PD together with the first bridge pattern BRP1.

The first conductive pattern CP1 may be formed of a conductive material (e.g., an electrically conductive material or substance) having a constant (e.g., substantially constant) reflectance. The conductive material (e.g., the electrically conductive material or substance) may include an opaque metal. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. In some embodiments, the first conductive pattern CP1 may include a transparent conductive material (e.g., a transparent, electrically conductive material or substance).

The transparent conductive material (e.g., the transparent, electrically conductive material or substance) may include a conductive oxide such as indium tin oxide (ITO), indium zinc oxide (IZO), zinc oxide (ZnO), indium gallium zinc oxide (IGZO), and/or indium tin zinc oxide (ITZO), a conductive polymer such as poly(3,4-ethylenedioxythiophene) (PEDOT), and/or the like. When the first conductive pattern CP1 includes a transparent conductive material (e.g., a transparent, electrically conductive material or substance), a separate conductive layer may also be added which is composed of an opaque metal for reflecting light emitted from the light emitting elements LD toward an image display direction (for example, a second surface (SF2) direction of the substrate SUB; or a lower surface direction of the substrate SUB) of the display device DD.

An overcoat layer OC may be provided and/or formed on the first conductive pattern CP1.

The overcoat layer OC may be a planarization layer that reduces a step difference generated by configuration elements under the overcoat layer. In addition, the overcoat layer OC may be an encapsulation layer that prevents or reduces penetration of oxygen and/or moisture into the light emitting elements LD. The overcoat layer OC may be partially opened to expose one region of the first conductive pattern CP1.

A pad electrode PD may be provided and/or formed on the overcoat layer OC.

The pad electrode PD may be formed on the overcoat layer OC to be electrically and/or physically coupled to the exposed first conductive pattern CP1. The pad electrode PD may be configured to electrically couple the drive portion (refer to "DRP" of FIG. 4) to the pixel PXL.

One end of the pad electrode PD may be electrically coupled to the first conductive pattern CP1, and the other end thereof may be electrically coupled to a connection member CM in a through-hole THL of a protective film PTF. For example, the pad electrode PD may transmit a data signal to the data line Dj by electrically coupling the drive portion DRP to the data line Dj through the connection member CM and the first conductive pattern CP1

The protective film PTF may be provided and/or formed on the pad electrode PD. The protective film PTF may be the protective film PTF described with reference to FIGS. 1 to 5.

The protective film PTF may include at least one through-hole THL. The through-hole THL may be formed to penetrate the protective film PTF, and the connection member CM may be in the through-hole THL.

The connection member CM may be formed of a conductive adhesive member and may be configured to electrically couple the pad electrode PD to the drive portion DRP. In one embodiment, the connection member CM may be an anisotropic conductive film, but the present disclosure is not limited thereto.

Next, the display element portion DPL of the pixel PXL will be described.

The display element portion DPL may include a color filter CF in the second region A2 of the pixel region PXA in which the pixels PXL are arranged, first to fourth electrodes EL1 to EL4, light emitting elements LD, first and second contact electrodes CNE1 and CNE2, an intermediate electrode CTE, a color conversion layer CCL, and a second conductive pattern CP2.

In addition, the display element portion DPL may include the same (e.g., substantially the same) insulating layers as the pixel circuit portion PCL. For example, the display element portion DPL may include a buffer layer BFL, a gate insulating layer GI, first and second interlayer insulating layers ILD1 and ILD2, a protective layer PSV, and a first insulating layer INS1, which are sequentially stacked on the first surface SF1 of the substrate SUB. The buffer layer BFL, the gate insulating layer GI, the first and second interlayer insulating layers ILD1 and ILD2, the protective layer PSV, and the first insulating layer INS1 of the display element portion DPL have the same (e.g., substantially the same) configuration as the buffer layer BFL, the gate insulating layer GI, the first and second interlayer insulating layers ILD1 and ILD2, the protective layer PSV, and the first insulating layer INS1 of the pixel circuit portion PCL, respectively, and thus, duplicative detailed description thereof will not be repeated here.

The color filter CF may be provided and/or formed on the second interlayer insulating layer ILD2 of the second region A2.

The color filter CF may be formed on the second interlayer insulating layer ILD2 to correspond to the light emitting region EMA of the pixel PXL. The color filter CF may cause light of a second color that is emitted from the color conversion layer CCL and travels toward the second surface SF2 of the substrate SUB to selectively pass therethrough. The color filter CF may include a red color filter, a green color filter, and a blue color filter.

A protective layer PSV may be provided and/or formed on the color filter CF. The protective layer PSV may have the same (e.g., substantially the same) configuration as the protective layer PSV of the pixel circuit portion PSV.

A first electrode EL1, a second electrode EL2, a third electrode EL3, and a fourth electrode EL4 may be provided and/or formed on the protective layer PSV.

The first electrode EL1, the second electrode EL2, the third electrode EL3, and the fourth electrode EL4 may be sequentially arranged in a first direction DR1. The first electrode EL1, the second electrode EL2, the third electrode EL3, and the fourth electrode EL4 may extend in a direction different from the first direction DR1, for example, in a second direction DR2 crossing the first direction. After the light emitting elements LD are supplied to the pixel region PXA and aligned therein during a fabrication process of the display device DD, the first to fourth electrodes EL1 to EL4 may be separated from other electrodes (for example, electrodes in adjacent pixels PXL adjacent in the second direction DR2).

In the light emitting region EMA of the pixel PXL, each of the first to fourth electrodes EL1 to EL4 may be spaced apart from adjacent electrodes along the first direction DR1. For example, the first electrode EL1 may be spaced apart from the second electrode EL2, the second electrode EL2 may be spaced apart from the third electrode EL3, and the third electrode EL3 may be spaced apart from the fourth electrode EL4. Distances between the first electrode EL1 and the second electrode EL2, between the second electrode EL2 and the third electrode EL3, and between the third electrode EL3 and the fourth electrode EL4 are the same (e.g., substantially the same) as each other, but the present disclosure is not limited thereto. In some embodiments, the distances between the first electrode EL1 and the second electrode EL2, between the second electrode EL2 and the third electrode EL3, and the third electrode EL3 and the fourth electrode EL4 may be different from each other.

The first to fourth electrodes EL1 to EL4 may be formed of a transparent conductive material (e.g., a transparent, electrically conductive material or substance) to cause the light emitted from each of the light emitting elements LD to pass therethrough without loss (or substantially without light loss). The transparent conductive material (e.g., the transparent, electrically conductive material or substance) may include a conductive oxide such as indium tin oxide (ITO), indium zinc oxide (IZO), zinc oxide (ZnO), indium gallium zinc oxide (IGZO), and/or indium tin zinc oxide (ITZO), a conductive polymer such as poly(3,4-ethylenedioxythiophene) (PEDOT), and/or the like.

Each of the first to fourth electrodes EL1 to EL4 may be provided and/or formed as a single layer, but the present disclosure is not limited thereto. In some embodiments, each of the first to fourth electrodes EL1 to EL4 may also be provided and/or formed as multiple layers in which at least two or more of metal, alloy, conductive oxide, and/or conductive polymer are stacked. Each of the first to fourth electrodes EL1 to EL4 may also be formed of multiple layers more than at least double layers to minimize or reduce distortion due to signal delay when transmitting signals (or voltages) to both ends of each of the light emitting elements LD.

The first electrode EL1 may partially extend to the first region A1 of the pixel PXL to overlap the second bridge pattern BRP2. For example, a part of the first electrode EL1 may be formed on the second bridge pattern BRP2 in the first region A1. Accordingly, the first electrode EL1 may be electrically and/or physically coupled to the second bridge pattern BRP2.

The fourth electrode EL4 may partially extend to the first region A1 of the pixel PXL to overlap the second power line PL2. For example, a part of the fourth electrode EL4 may be formed on the second power line PL2 in the first region A1. Accordingly, the fourth electrode EL4 may be electrically and/or physically coupled to the second power line PL2.

Each of the first to fourth electrodes EL1 to EL4 may be used as an alignment electrode (or alignment line) for receiving a set or predetermined alignment signal (or an alignment voltage) from the corresponding pad electrode PD before the light emitting elements LD are aligned in the light emitting region EMA of the pixel PXL to align the light emitting elements LD.

The alignment signals (or alignment voltages) transmitted to the first to fourth electrodes EL1 to EL4 may have a voltage difference and/or a phase difference for aligning the light emitting elements LD between the first to fourth electrodes EL1 to EL4. At least one alignment signal (or alignment voltage) among the alignment signals (or alignment voltages) transmitted to each of the first to fourth electrodes EL1 to EL4 may be an AC signal (or voltage), but the present disclosure is not limited thereto.

In the light emitting region EMA of the pixel PXL, the first electrode EL1 and the second electrode EL2 may configure a first series stage (see "SET1" of FIG. 8) together with a plurality of light emitting elements LD coupled in parallel therebetween, and the third electrode EL3 and the fourth electrode EL4 may configure a second series stage (see "SET2" of FIG. 8) together with a plurality of light emitting elements LD coupled in parallel therebetween.

In one embodiment, the first and second series stages SET1 and SET2 are in the light emitting region EMA of the pixel PXL, and the first and second series stages SET1 and SET2 may configure the light emitting unit EMU of the corresponding pixel PXL.

The first electrode EL1 included in the first series stage SET1 may be an anode of the light emitting unit EMU, and the fourth electrode EL4 included in the second series stage SET2 may be a cathode of the light emitting unit EMU.

The first insulating layer INS1 may be provided and/or formed on the first to fourth electrodes EL1 to EL4.

The first insulating layer INS1 may have the same (e.g., substantially the same) configuration as the first insulating layer INS1 of the pixel circuit portion PCL. The first insulating layer INS1 may be provided and/or formed on the protective layer PSV to cover all of the first to fourth electrodes EL1 to EL4. After the light emitting elements LD are supplied to and aligned on the first insulating layer INS1, the first insulating layer INS1 may be partially opened to expose one region of each of the first and fourth electrodes EL1 and EL4. After the light emitting elements LD are supplied and aligned, the first insulating layer INS1 may also be patterned in the form of individual patterns that are locally under the light emitting elements LD. The first insulating layer INS1 may cover regions other than the one region of each of the first and fourth electrodes EL1 and EL4 in the second region A2. In some embodiments, the first insulating layer INS1 may be omitted.

The light emitting elements LD may be on the first insulating layer INS1.

The light emitting elements LD may be light emitting diodes using a material having an inorganic crystal structure and may have a size as small as a nanoscale to a microscale (e.g., a size of nanometers to micrometers). Each of the light emitting elements LD may be a micro light emitting diode manufactured by using an etching method and/or a growth method.

At least two to tens of light emitting elements LD may be in the light emitting region EMA of the pixel PXL, but the number of the light emitting elements LD is not limited thereto. In some embodiments, the number of light emitting elements LD in the light emitting region EMA may be variously changed.

Each of the light emitting elements LD may emit any one of color light and/or white light. In one embodiment, each of the light emitting elements LD may emit a light of a first color. Here, the light of the first color may be blue light in a short wavelength range.

Each of the light emitting elements LD may be aligned on the first insulating layer INS1 between adjacent two electrodes among the first to fourth electrodes EL1 to EL4 so that an extension direction (or the length L direction) is parallel (e.g., substantially parallel) to the first direction DR1 when viewed in a plan view and a cross-sectional view. The light emitting elements LD may be provided in a sprayed form in a solution and may be introduced into the pixel region PXA of each pixel PXL.

The light emitting elements LD may be introduced into the pixel region PXA of each pixel PXL by using through an inkjet printing method, a slit coating method, and/or various other suitable methods. For example, the light emitting elements LD may be mixed with a volatile solvent and supplied to the pixel region PXA through the inkjet printing method and/or the slit coating method. In this case, when an alignment signal corresponding to each of the first to fourth electrodes EL1 to EL4 provided to the pixel region PXA is applied, an electric field may be formed between two adjacent electrodes among the first to fourth electrodes EL1 to EL4. By doing so, the light emitting elements LD may be aligned between the two adjacent electrodes among the first to fourth electrodes EL1 to EL4.

After the light emitting elements LD are aligned, the solvent may be volatilized and/or removed in any other suitable way, and thereby, the light emitting elements LD are finally aligned and/or provided in the pixel region PXA of each pixel PXL.

Although it is illustrated that light emitting elements LD whose length (see "L" of FIG. 6) direction is parallel to the first direction DR1 are aligned between two adjacent electrodes among the first to fourth electrodes EL1 to EL4, the present disclosure is not limited thereto. In some embodiments, some of the light emitting elements LD may also be between the two adjacent electrodes so that the length L direction is parallel (e.g., substantially parallel) to the second direction DR2 and/or a direction inclined to the second direction DR2. In addition, in some embodiments, at least one reverse light emitting element (see "LDr" of FIG. 8) coupled in a reverse direction may be further between the two adjacent electrodes.

In one embodiment, the light emitting elements LD may include a plurality of first light emitting elements LD1 and a plurality of second light emitting elements LD2.

The first light emitting elements LD1 may be between the first electrode EL1 and the second electrode EL2. The second light emitting elements LD2 may be between the third electrode EL3 and the fourth electrode EL4.

The first light emitting elements LD1 may be aligned in the same (e.g., substantially the same) direction between the first electrode EL1 and the second electrode EL2. For example, one end of each of the first light emitting elements LD1 may be coupled to the first electrode EL1, and the other end thereof may be coupled to the second electrode EL2. A first series stage SET1 may be formed together with the first light emitting elements LD1 coupled in parallel in the same (e.g., substantially the same) direction between the first electrode EL1 and the second electrode EL2.

The second light emitting elements LD2 may be aligned in the same (e.g., substantially the same) direction between the third electrode EL3 and the fourth electrode EL4. For example, one end of each of the second light emitting elements LD2 may be coupled to the third electrode EL3, and the other end thereof may be coupled to the fourth electrode EL4. A second series stage SET2 may be formed together with the second light emitting elements LD2 coupled in the same (e.g., substantially the same) direction between the third electrode EL3 and the fourth electrode EL4.

A second insulating layer INS2 may be provided and/or formed on each of the light emitting elements LD. The second insulating layer INS2 may be provided and/or formed on the light emitting elements LD to partially cover an outer peripheral (e.g., circumferential) surface (or a front surface) of each of the light emitting elements LD and may expose both ends of each of the light emitting elements LD to the outside.

The second insulating layer INS2 may be formed as a single layer or multiple layers and may include an inorganic insulating layer including at least one inorganic material and/or an organic insulating layer including at least one organic material. The second insulating layer INS2 may further fix the respective light emitting elements LD. The second insulating layer INS2 may include an inorganic insulating layer has a feature of protecting the active layers 12 of each of the light emitting elements LD from external oxygen and/or moisture. However, the present disclosure is not limited thereto. The second insulating layer INS2 may also be formed of an organic insulating layer including an organic material according to design conditions of the display device DD in which the above-described light emitting elements LD are applied as a light source.

After aligning the light emitting elements LD is completed in the pixel region PXA of the pixel PXL, the second insulating layer INS2 may be formed on the light emitting elements LD, and thus, deviation of the light emitting elements LD from the aligned position may be prevented or reduced. If there is an empty gap (or space) between the first insulating layer INS1 and the light emitting elements LD before the second insulating layer INS2 is formed, the gap may be filled with the second insulating layer INS2 in the process of forming the second insulating layer INS2. Accordingly, the second insulating layer INS2 may be formed of an organic insulating layer which has a feature of filling the gap between the first insulating layer INS1 and the light emitting elements LD.

First and second contact electrodes CNE1 and CNE2 and an intermediate electrode CTE may be provided and/or formed on the first to fourth electrodes EL1 to EL4.

The first and second contact electrodes CNE1 and CNE2 and the intermediate electrode CTE may be configured to electrically couple more stably the first to fourth electrodes EL1 to EL4 to the light emitting elements LD.

The first contact electrode CNE1 may be provided and/or formed on the first electrode EL1. The first contact electrode CNE1 may be in direct contact with the first electrode EL1 exposed to the outside by the first insulating layer INS1 to be electrically and/or physically coupled to the first electrode EL1. In addition, the first contact electrode CNE1 may be provided and/or formed on one end of each of the first light emitting elements LD1 to be electrically and/or physically coupled to one end of each of the first light emitting elements LD1. Accordingly, the first electrode EL1 and one end of each of the first light emitting elements LD1 may be electrically coupled to each other through the first contact electrode CNE1.

The second contact electrode CNE2 may be provided and/or formed on the fourth electrode EL4. The second contact electrode CNE2 may be in direct contact with the fourth electrode EL4 exposed to the outside by the first insulating layer INS1 to be electrically and/or physically coupled to the fourth electrode EL4. In addition, the second contact electrode CNE2 may be electrically and/or physically coupled to the other end of each of the second light emitting elements LD2. Accordingly, the fourth electrode EL4 and the other ends of each of the second light emitting elements LD2 may be electrically coupled to each other through the second contact electrode CNE2.

The first and second contact electrodes CNE1 and CNE2 may be formed of various suitable transparent conductive materials (e.g., suitable transparent, electrically conductive materials) to cause light emitted from each of the light emitting elements LD to travel in an image display direction (for example, a second surface SF2 direction of the substrate SUB) of the display device DD without loss (e.g., substantially without light loss). For example, the first and second contact electrodes CNE1 and CNE2 may include at least one of various suitable transparent conductive materials (e.g., suitable transparent, electrically conductive materials or substances) such as indium tin oxide (ITO), indium zinc oxide (IZO), zinc oxide (ZnO), indium gallium zinc oxide (IGZO), and/or indium tin zinc oxide (ITZO), and may be configured to be substantially transparent or translucent to satisfy a set or predetermined light transmission (or transmittance). However, materials of the first and second contact electrodes CNE1 and CNE2 are not limited to the above-described embodiment. In some embodiments, the first and second contact electrodes CNE1 and CNE2 may also be formed of various suitable opaque conductive materials (e.g., suitable opaque, electrically conductive materials or substances). The first and second contact electrodes CNE1 and CNE2 may also be formed as a single layer or multiple layers.

When viewed in a plan view, each of the first and second contact electrodes CNE1 and CNE2 may have a bar shape extending in the second direction DR2, but the present disclosure is not limited thereto. In some embodiments, shapes of the first and second contact electrodes CNE1 and CNE2 may be variously changed within a range in which the first and second contact electrodes CNE1 and CNE2 are coupled electrically and stably to each of the light emitting elements LD. In addition, the shape of each of the first and second contact electrodes CNE1 and CNE2 may be variously changed by considering a connection relationship with electrodes thereunder.

The intermediate electrode CTE may include a first intermediate electrode CTE1 and a second intermediate electrode CTE2 extending in the second direction DR2.

The first intermediate electrode CTE1 may be formed over the second electrode EL2 and overlap the second electrode EL2 when viewed in a plan view. The first intermediate electrode CTE1 may be on the first insulating layer INS1 on the second electrode EL2 to be electrically insulated from the second electrode EL2. The first intermediate electrode CTE1 may be on the other end of each of the first light emitting elements LD1 in the light emitting region EMA of each pixel PXL to be electrically and/or physically coupled to the first light emitting elements LD1.

The second intermediate electrode CTE2 may be formed over the third electrode EL3 and overlap the third electrode EL3 when viewed in a plan view. The second intermediate electrode CTE2 may be on the first insulating layer INS1 on the third electrode EL3 to be electrically insulated from the third electrode EL3. The second intermediate electrode CTE2 may be on one end of each of the second light emitting elements LD2 in the light emitting region EMA of each pixel PXL, to be electrically and/or physically coupled to the second light emitting elements LD2.

The first intermediate electrode CTE1 and the second intermediate electrode CTE2 may be formed integrally to be coupled to each other. The first intermediate electrode CTE1 and the second intermediate electrode CTE2 may be different regions of the intermediate electrode CTE. The first intermediate electrode CTE1 may have the same (e.g., substantially the same) configuration as the first intermediate electrode CTE1 described with reference to FIG. 8, and the second intermediate electrode CTE2 may have the same (e.g., substantially the same) configuration as the second intermediate electrode CTE2 described with reference to FIG. 8. The intermediate electrode CTE may be used as a bridge electrode (or a connection electrode) that electrically couples the other end of each of the first light emitting elements LD1 to one end of each of the second light emitting elements LD2. For example, the intermediate electrode CTE may be a bridge electrode (or a connection electrode) that couples the first series stage SET1 to the second series stage SET2.

The first contact electrode CNE1, the second contact electrode CNE2, and the intermediate electrode CTE may be spaced apart from each other in a plan view and a cross-sectional view.

The first contact electrode CNE1 may face one region of the intermediate electrode CTE, for example, the first intermediate electrode CTE1. The first contact electrode CNE1 and the first intermediate electrode CTE1 may extend in the same (e.g., substantially the same) direction, for example, the second direction DR2. The first contact electrode CNE1 and the first intermediate electrode CTE1 may be spaced apart from each other in the first direction DR1. The second contact electrode CNE2 may face another region of the intermediate electrode CTE, for example, the second intermediate electrode CTE2. The second contact electrode CNE2 and the second intermediate electrode CTE2 may extend in the second direction DR2. The second contact electrode CNE2 and the second intermediate electrode CTE2 may be spaced apart from each other in the first direction DR1.

The intermediate electrode CTE may be formed of various suitable transparent conductive materials (e.g., suitable transparent, electrically conductive materials) to cause light emitted from each of the light emitting elements LD to travel in an image display direction (for example, the second surface SF2 direction of the substrate SUB) of the display device DD without loss (e.g., substantially without light loss).

The intermediate electrode CTE may be on the same layer as the first and second contact electrodes CNE1 and CNE2 and may be formed in the same process. For example, the intermediate electrode CTE and the first and second contact electrodes CNE1 and CNE2 may be provided and/or formed on the second insulating layer INS2. However, the present disclosure is not limited thereto, and the intermediate electrode CTE may also be on a different layer from the first and second contact electrodes CNE1 and CNE2 and may also be formed in a different process in some embodiments.

The first and second contact electrodes CNE1 and CNE2 and the intermediate electrode CTE described above may correspond to the second region A2 of the pixel PXL, for example, the light emitting region EMA. For example, the first and second contact electrodes CNE1 and CNE2 and the intermediate electrode CTE may be formed on the first insulating layer INS1 to correspond to the second opening OP2 of the light blocking layer LBP.

In some embodiments, a support member may be between each of the first and second contact electrodes CNE1 and CNE2 and the intermediate electrode CTE, and the first insulating layer INS1. For example, as illustrated in FIG. 13, a bank pattern BNKP may be between each of the second intermediate electrode CTE2 and the second contact electrode CNE2, and the first insulating layer INS1.

The bank pattern BNKP may be in the light emitting region EMA of the pixel PXL. The bank pattern BNKP may be a guide member that guides light of a first color emitted from the light emitting elements LD to the color conversion layer CCL. For example, the bank pattern BNKP may be a guide member that support at least a part of each of the first and second contact electrodes CNE1 and CNE2 and the intermediate electrode CTE and changes a surface profile (or shape) so that each of the first and second contact electrodes CNE1 and CNE2 and the intermediate electrodes CTE has a shape protruding in the third direction DR3 to further guide the light of the first color emitted from the light emitting elements LD to a target direction.

The bank pattern BNKP may be an inorganic insulating layer including an inorganic material and/or an organic insulating layer including an organic material. In some embodiments, the bank pattern BNKP may include an organic insulating layer of a single layer and/or an inorganic insulating layer of a single layer, but the present disclosure is not limited thereto. In some embodiments, the bank pattern BNKP may also be in the form of multiple layers in which at least one organic insulating layer and at least one inorganic insulating layer are stacked. However, the material of the bank pattern BNKP is not limited to the above-described embodiment, and in some embodiments, the bank pattern BNKP may also include a conductive material (e.g., an electrically conductive material). In one embodiment, the bank pattern BNKP may also include a transparent material (or substance). The transparent material may include, for example, polyamides resin, polyimide resin, and/or the like, but the present disclosure is not limited thereto.

The bank pattern BNKP may have a trapezoidal cross-section having a width that becomes narrower toward an upper portion in the third direction DR3 from one surface (for example, an upper surface) of the first insulating layer INS1, but the present disclosure is not limited thereto. In some embodiments, the bank pattern BNKP may also have a curved surface having a cross section of a semi-elliptical shape, a semi-circular shape (or hemispherical shape), and the like having a width that becomes narrower toward an upper portion in the third direction DR3 from one surface of the first insulating layer INS1. When viewed in a cross-sectional view, the shape of the bank pattern BNKP is not limited to the above-described embodiments and may be variously changed within a range in which efficiency of light emitted from each of the light emitting elements LD may be increased.

A color conversion layer CCL may be provided and/or formed on the first and second contact electrodes CNE1 and CNE2 and the intermediate electrode CTE.

The color conversion layer CCL may include color conversion particles QD corresponding to a set or specific color. The color conversion layer CCL may include color conversion particles QD for converting light of a first color emitted from the light emitting elements LD in the pixel PXL into light of a second color (or a set or specific color). For example, when the pixel PXL is a red pixel, the color conversion layer CCL may include color conversion particles QD of red quantum dots for converting light emitted from the light emitting elements LD into red light. As another example, when the pixel PXL is a green pixel, the color conversion layer CCL may include color conversion particles QD of green quantum dots for converting the light emitted from the light emitting elements LD into green light. As another example, when the pixel PXL is a blue pixel, the color conversion layer CCL may include color conversion particles QD of blue quantum dots for convert the light emitted from the light emitting elements LD into blue light.

A capping layer CPL may be provided and/or formed on the color conversion layer CCL. The capping layer CPL may have the same (e.g., substantially the same) configuration as the capping layer CPL in the first region A1 of the pixel PXL. The capping layer CPL may be formed of an inorganic insulating layer including an inorganic material and/or an organic insulating layer including an organic material. For example, the capping layer CPL may have a structure in which one or more inorganic insulating layers and/or one or more organic insulating layers are alternately stacked. The capping layer CPL may completely cover the color conversion layer CCL thereby preventing or reducing entry of water content and/or moisture into the color conversion layer CCL.

A second conductive pattern CP2 may be provided and/or formed on the capping layer CPL.

The second conductive pattern CP2 may be provided and/or formed on the capping layer CPL to correspond to the light emitting region EMA. The second conductive pattern CP2 may be a guide member for guiding light of a second color emitted from the color conversion layer CCL in an image display direction (the second surface SF2 direction of the substrate SUB) of the display device DD. To this end, the second conductive pattern CP2 may be formed of a conductive material (e.g., an electrically conductive material or substance) having a constant reflectance. The conductive material (e.g., the electrically conductive material or substance) may include an opaque metal.

When viewed in a plan view, the second conductive pattern CP2 may overlap the light emitting region EMA and may not overlap the light blocking layer LBP in the second region A2. The second conductive pattern CP2 may be formed in a shape to cover the entire light emitting region EMA. Although FIG. 9 illustrates the second conductive pattern CP2 in a rectangular shape, but the present disclosure is not limited thereto. In some embodiments, the shape of the second conductive pattern CP2 may be variously changed within a range in which the light emitting region EMA of the pixel PXL is capable of being sufficiently covered.

The second conductive pattern CP2 may be formed on the same layer as the first conductive pattern CP1 in the first region A1 of the pixel PXL and may include the same (e.g., substantially the same) material and may be formed in the same process.

An overcoat layer OC may be provided and/or formed on the second conductive pattern CP2. The overcoat layer OC may have the same (e.g., substantially the same) configuration as the overcoat layer OC in the first region A1 of the pixel PXL.

A protective film PTF may be provided and/or formed on the overcoat layer OC. The protective film PTF may have the same (e.g., substantially the same) configuration as the protective film PTF in the first region A1 of the pixel PXL.

When a drive current flows from the first power line PL1 to the second power line PL2 via the pixel circuit PXC by the first transistor T1 included in the pixel circuit PXC of the pixel PXL, the drive current may flow into the first electrode EL1 through the first transistor T1 and an upper electrode UE. The drive current flows to the intermediate electrode CTE through the first contact electrode CNE1 in direct contact with (or coupled to) the first electrode EL1 and the first light emitting elements LD1. Accordingly, the first light emitting elements LD1 in the first series stage SET1 may emit light with a luminance corresponding to currents distributed to each of the first light emitting elements LD1. The drive current flowing through the intermediate electrode CTE flows to the second contact electrode CNE2 through the intermediate electrode CTE and the second light emitting elements LD. Accordingly, the second light emitting elements LD2 in the second series stage SET2 may emit light with a luminance corresponding to currents distributed to each of the second light emitting elements LD2.

In the above-described manner, the drive current of the pixel PXL may sequentially flow through the first light emitting elements LD1 of the first series stage SET1 and the second light emitting elements LD2 of the second series stage SET2. Accordingly, each pixel PXL may emit light having a luminance corresponding to a data signal which is supplied during each frame period.

As described above, the pixel PXL is on the first surface SF1 of the substrate SUB, and the drive portion DRP is thereon, thereby minimizing or reducing a size of the non-display region NDA in the second surface SF2 (or display surface) of the substrate SUB, and thus, a wider screen may be provided to a user. In addition, as the non-display region (see "DD_NDA" of FIG. 3) is minimized or reduced in each display device DD, visual recognition of a boundary region between the display devices DD is minimized or reduced when a multi-screen display device (see "TDD" of FIG. 1) using a plurality of display devices DD is implemented, and thus, an image of increased quality may be obtained.

In addition, according to the above-described embodiment, the pixel PXL is formed on the first surface SF1 of the substrate SUB, and the pad electrode PD is formed thereon. After the protective film PTF including the through-hole THL is formed on the pad electrode PD, the drive portion DRP and the pixel PXL are electrically coupled to each other through the connection member CM. When the pixels PXL and the driver DRP are sequentially formed on the same surface of the substrate SUB, for example, the first surface SF1, a fabrication process may be simplified compared to a display device of the related art manufactured by forming the pixel PXL on one surface of the substrate SUB, rotating the substrate SUB up and down, forming a via hole on a rear surface of the substrate SUB by using a laser, filling the via hole with a conductive filling layer, and electrically coupling the drive portion DRP to the pixel PXL.

In some embodiments, a polarization film POL may be in the first region A1 and the second region A2 of the pixel PXL as illustrated in FIG. 11.

A polarization film POL may be provided and/or formed on the second surface SF2 of the substrate SUB. The polarization film POL may prevent visual recognition of configuration elements on the first surface SF1 of the substrate SUB due to introduction of external light (e.g., the polarization film POL may reduce visibility of configuration elements on the first surface SF1 of the substrate SUB due to introduction of external light).

In the following embodiment, configuration elements in the non-display region DD_NDA of the display device DD and an arrangement structure of the drive portion DRP will be mainly described with reference to FIG. 14.

Figure 14:
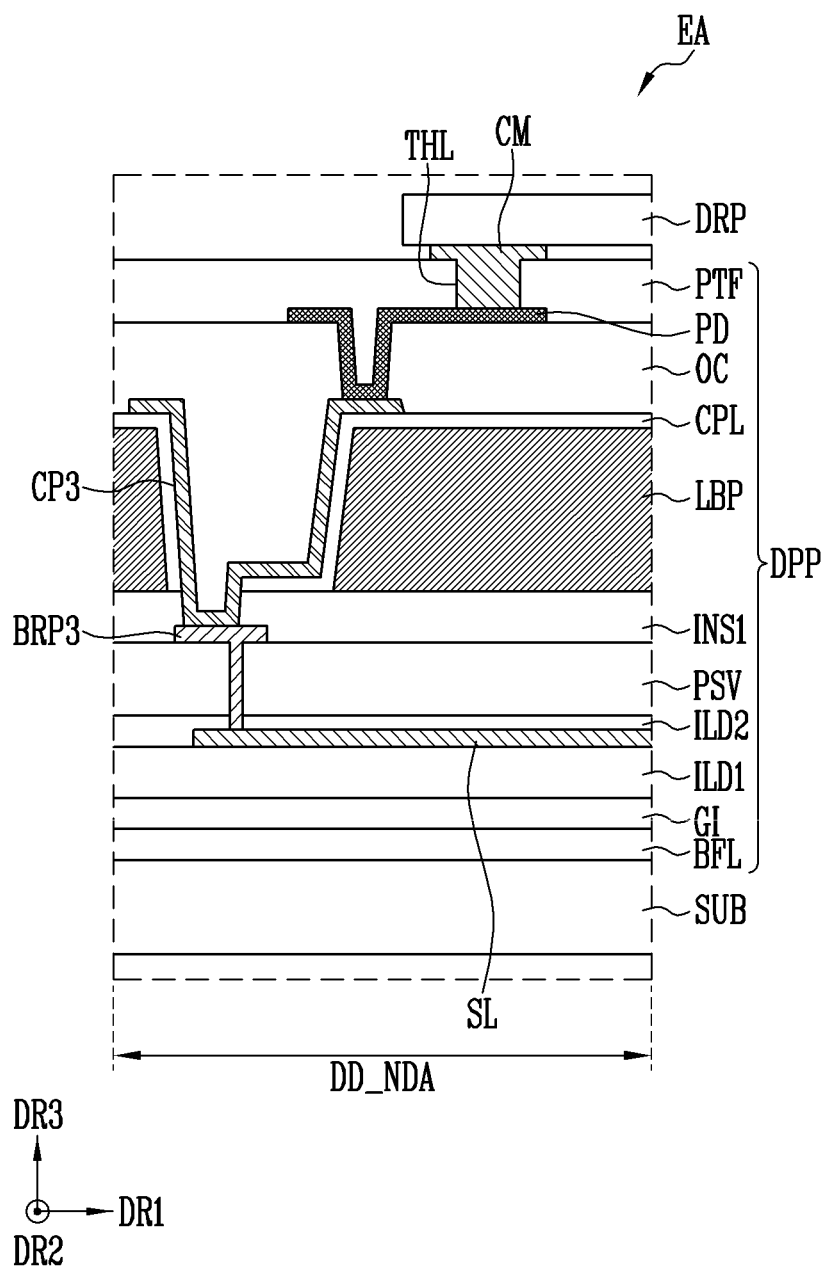
FIG. 14 is a schematic enlarged cross-sectional view of a portion EA of FIG. 4.

FIG. 14 is a schematic enlarged cross-sectional view of the portion EA of FIG. 4.

In relation to a display device of FIG. 14, different points from the above-described embodiments will be mainly described in order to avoid redundant description. Parts not specifically described in the embodiments of the present disclosure are the same (e.g., substantially the same) as the parts in the above-described embodiments, and the same numbers indicate the same configuration elements, and similar numbers indicate similar configuration elements.

Referring to FIGS. 4 and 14, a display portion DPP and a drive portion DRP may be in the non-display region DD_NDA of the display device DD.

The display portion DPP in the non-display region DD_NDA may include a plurality of insulating layers sequentially formed on the first surface SF1 of the substrate SUB, a signal line SL, a third bridge pattern BRP3, a light blocking layer LBP, a capping layer CPL, a third conductive pattern CP3, a planarization layer OC, a pad electrode PD, a protective film PTF, and a connection member CM.

The signal line SL may be a fan-out line that is electrically coupled to the pad electrode PD and transmits a set or predetermined signal (or set or a predetermined voltage) to the pixels PXL in the display region DD_DA. The signal line SL may be a third conductive layer provided and/or formed on the first interlayer insulating layer ILD1. For example, the signal line SL may be formed integrally with a data line (see "Dj" of FIG. 9) in the display region DD_DA to be coupled to the data line Dj. In some embodiment, the signal line SL may also be a fan-out line electrically coupled to a scan line (see "Si" of FIG. 9) and a control line (see "CU" of FIG. 9). According to another embodiment, the signal line SL may also be a fan-out line electrically coupled to a first power line (see "PL1" of FIG. 9) or a fan-out line electrically coupled to a second power line (see "PL2" of FIG. 9).

In the above-described embodiment, the signal line SL is described as a third conductive layer formed on the first interlayer insulating layer ILD1, but the present disclosure is not limited thereto. In some embodiments, the signal line SL may be a conductive layer formed on one of the insulating layers formed on the first surface SF1 of the substrate SUB.

The signal line SL may be electrically coupled to the third bridge pattern BRP3.

The third bridge pattern BRP3 may be formed on the protective layer PSV and may be formed on the same layer as the first and second bridge patterns BRP1 and BRP2 described with reference to FIG. 9 and may include the same (e.g., substantially the same) material and may be formed in the same process. The third bridge pattern BRP3 may be a first intermediate medium that electrically couples the signal line SL to the pad electrode PD.

A first insulating layer INS1 may be formed on the third bridge pattern BRP3, and the light blocking layer LBP and the capping layer CPL may be sequentially formed on the first insulating layer INS1. Each of the first insulating layer INS1, the light blocking layer LBP, and the capping layer CPL may be partially opened to expose one region of the third bridge pattern BRP3.

The third conductive pattern CP3 may be formed on the capping layer CPL. The third conductive pattern CP3 may be electrically coupled to the third bridge pattern BRP3 exposed by the first insulating layer INS1, the light blocking layer LBP, and the capping layer CPL. The third conductive pattern CP3 may be formed on the same layer as the first and second conductive patterns CP1 and CP2 described with reference to FIG. 9 and may include the same (e.g., substantially the same) material and may be formed in the same process.

An overcoat layer OC may be formed on the third conductive pattern CP3. The overcoat layer OC may be a planarization layer for reducing a step difference generated by configuration elements under the non-display region DD_NDA. The overcoat layer OC may be partially opened to expose one region of the third conductive pattern CP3. In one embodiment, the third conductive pattern CP3 may be a second intermediate medium that electrically couples the signal line SL to the pad electrode PD.

The pad electrode PD may be formed on the overcoat layer OC. The pad electrode PD may electrically couple the drive portion DRP to the third conductive pattern CP3.

The protective film PTF may be formed on the pad electrode PD. The protective film PTF may be partially opened to expose one region of the pad electrode PD.

The protective film PTF may be formed of the same (e.g., substantially the same) material as the substrate SUB, but the present disclosure is not limited thereto. The protective film PTF may include at least one through-hole THL. The connection member CM may be in the through-hole THL.

The drive portion DRP may be over the protective film PTF to electrically coupled to the pad electrode PD through the connection member CM.

FIGS. 15 to 35 are schematic cross-sectional views illustrating a method of fabricating a display device, according to an embodiment.

Hereinafter, the display device according to the embodiment illustrated in FIG. 10 will be sequentially described according to a fabrication method with reference to FIGS. 15 to 35.

Figure 15:
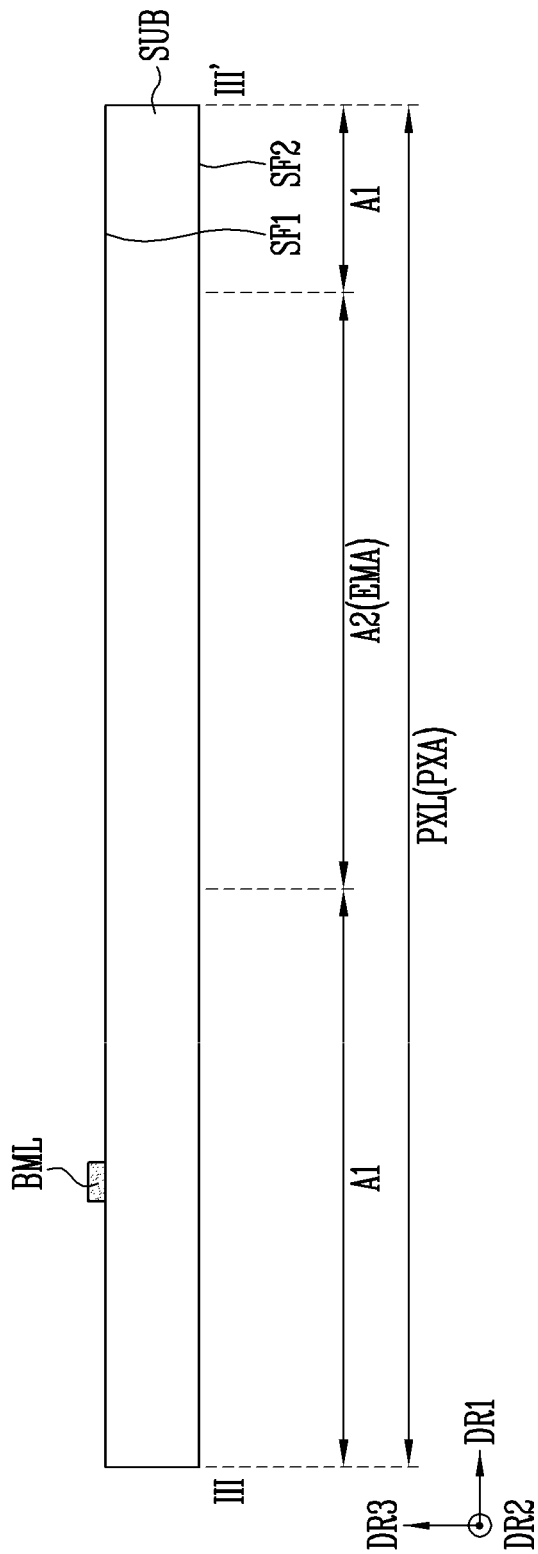
FIGS. 15 to 35 are schematic cross-sectional views illustrating a method of fabricating a display device, according to an embodiment.
Figure 16:
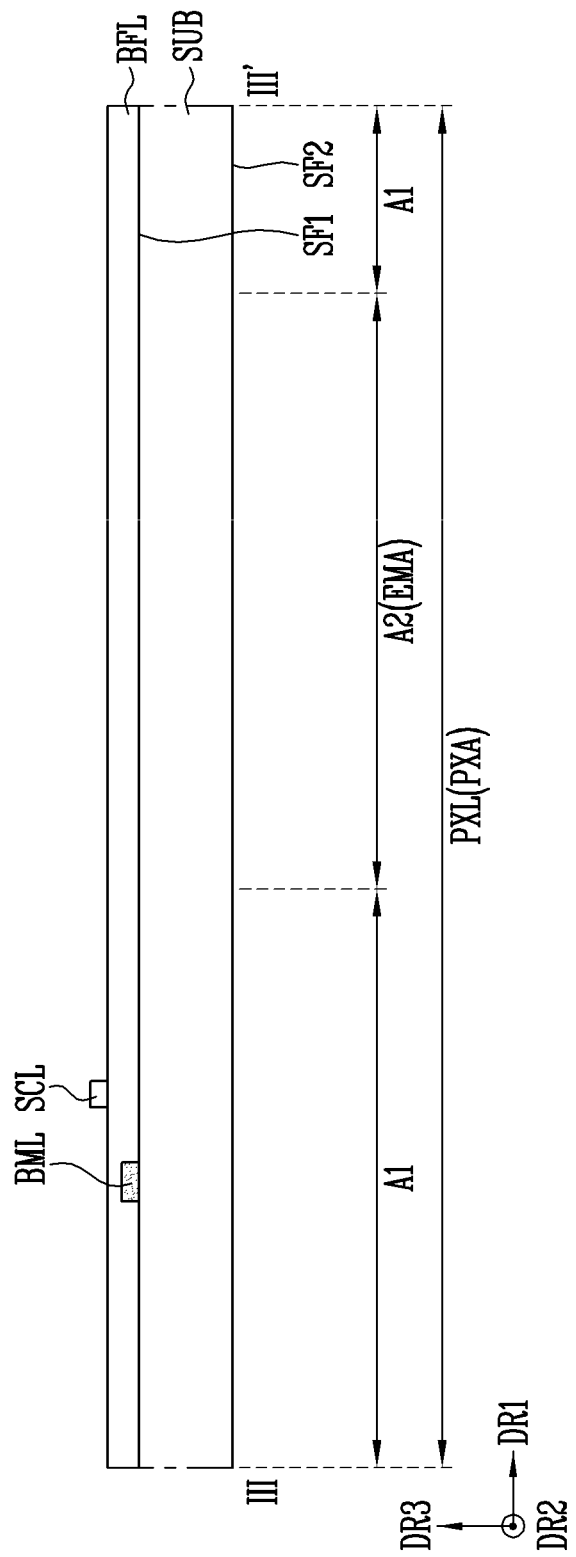
Figure 17:
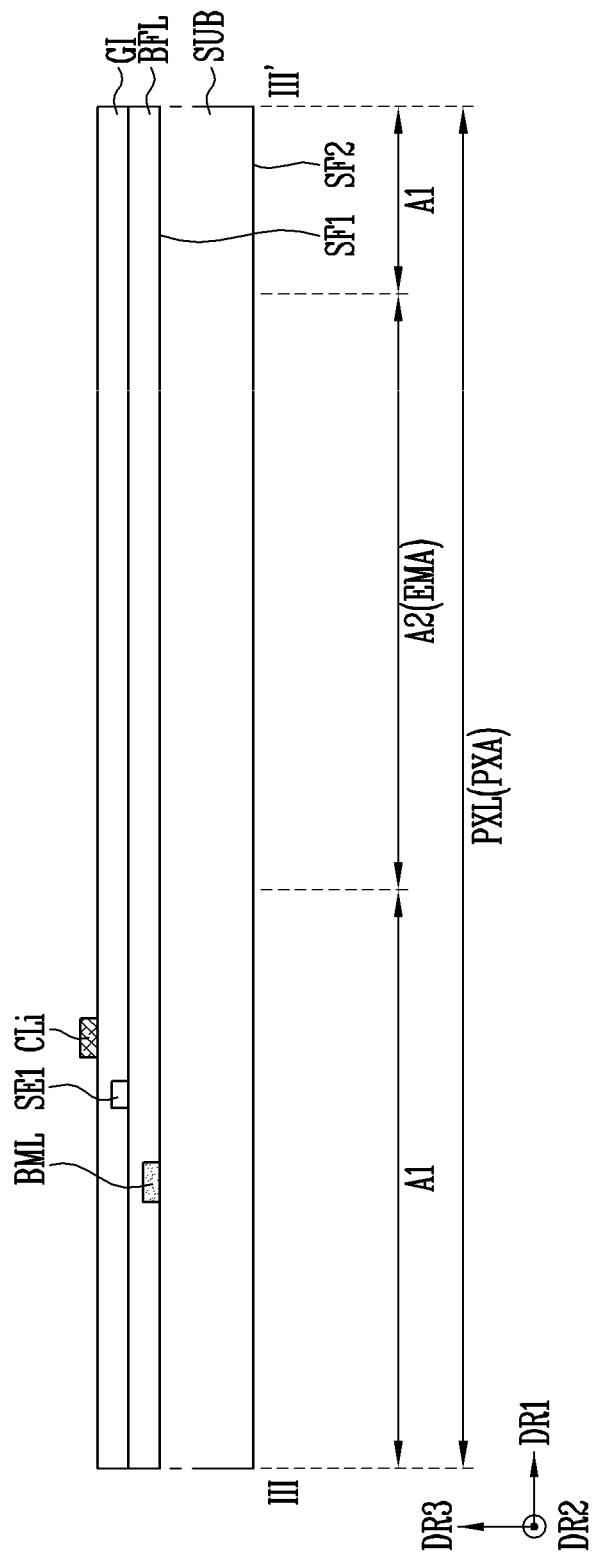
Figure 18:
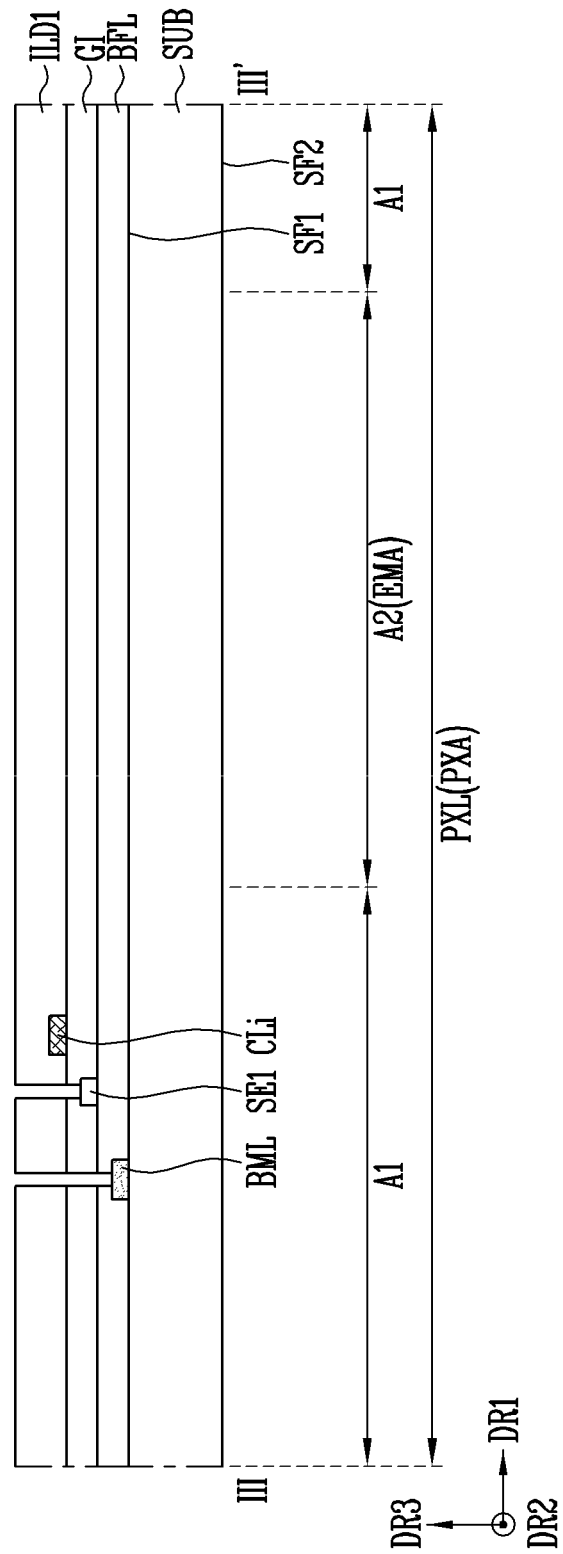
Figure 19:
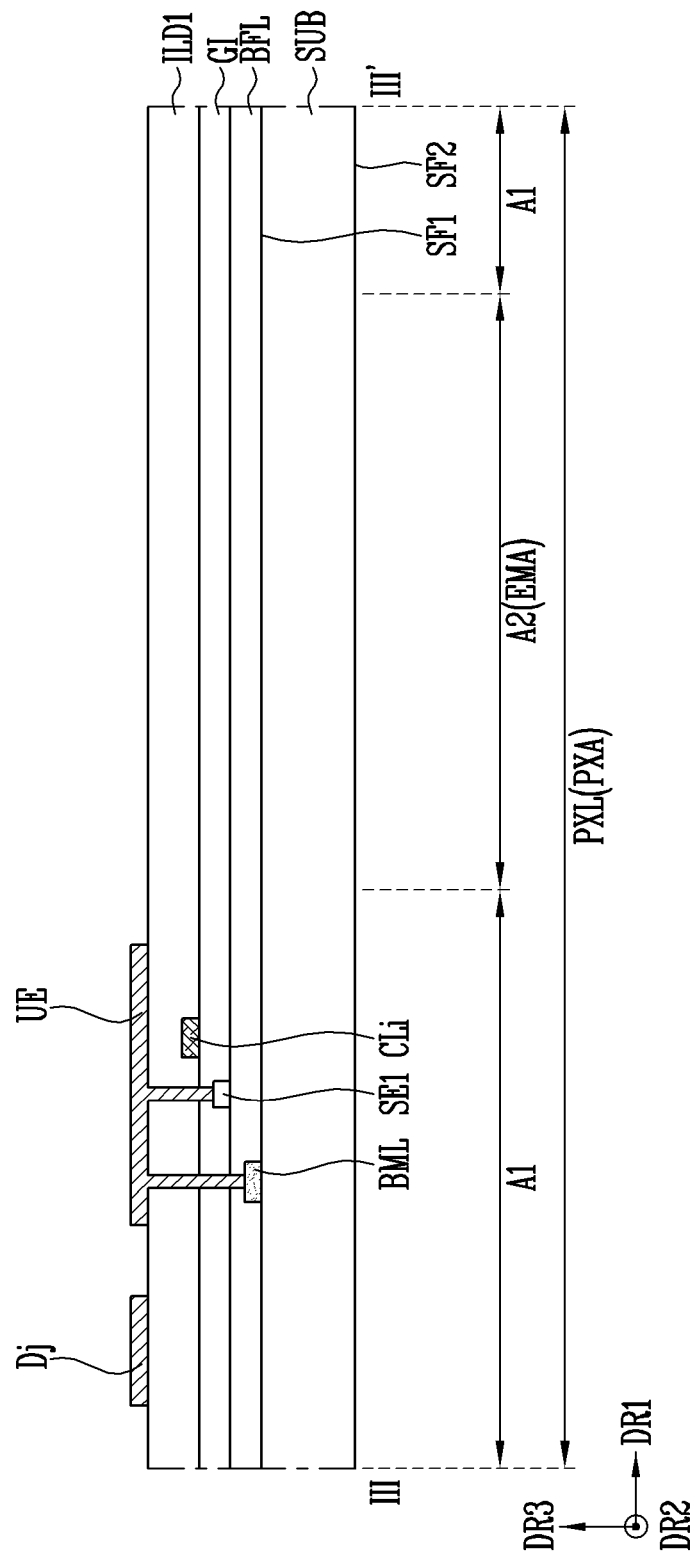
Figure 20:
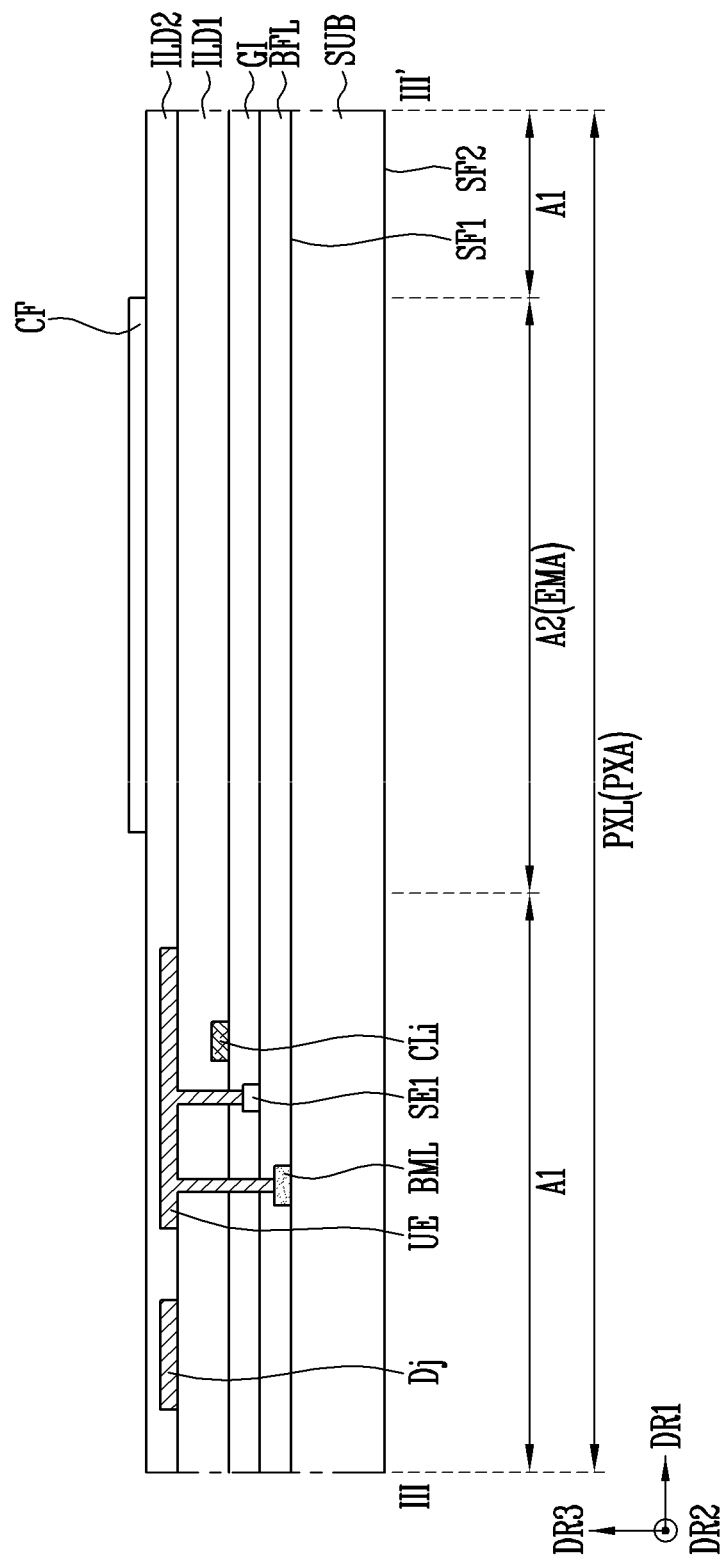
Figure 21:
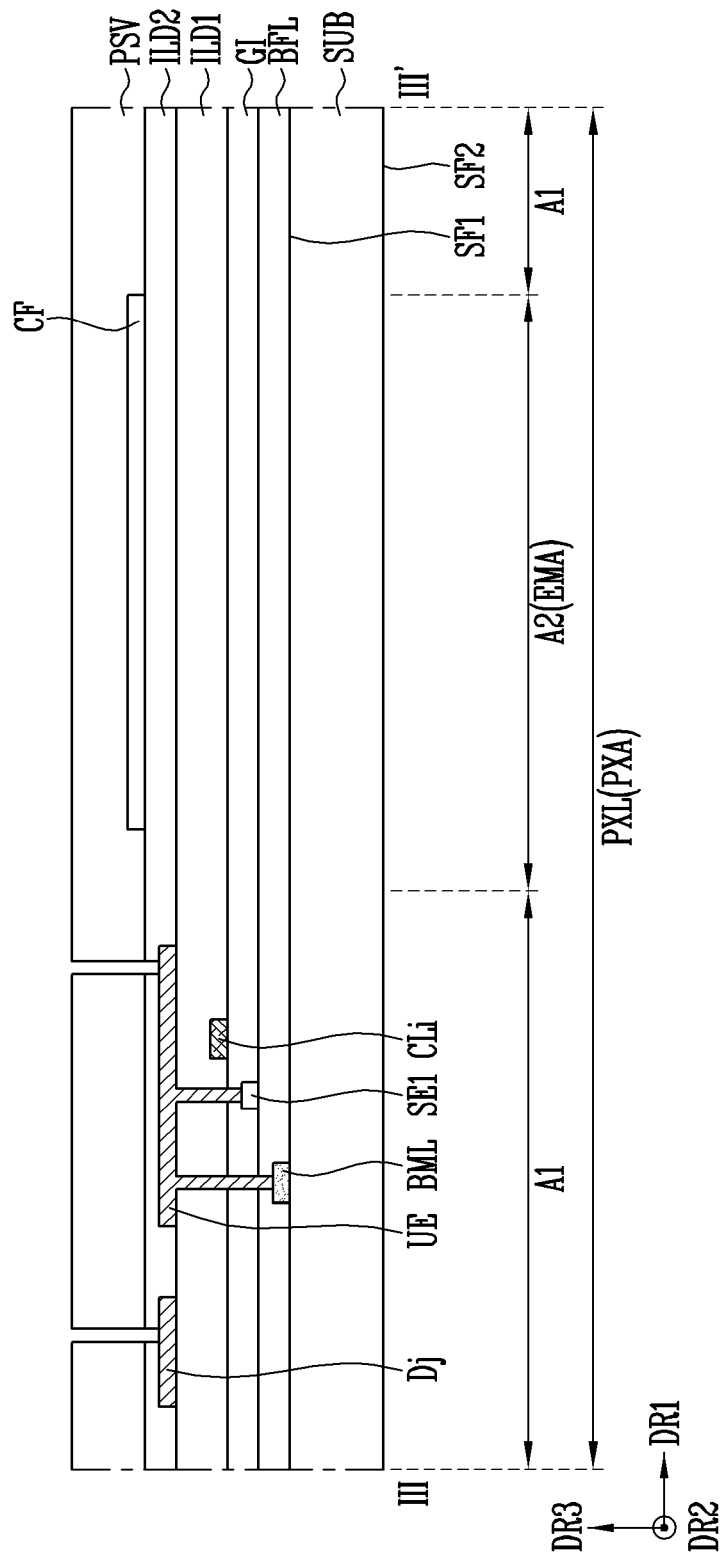
Figure 22:
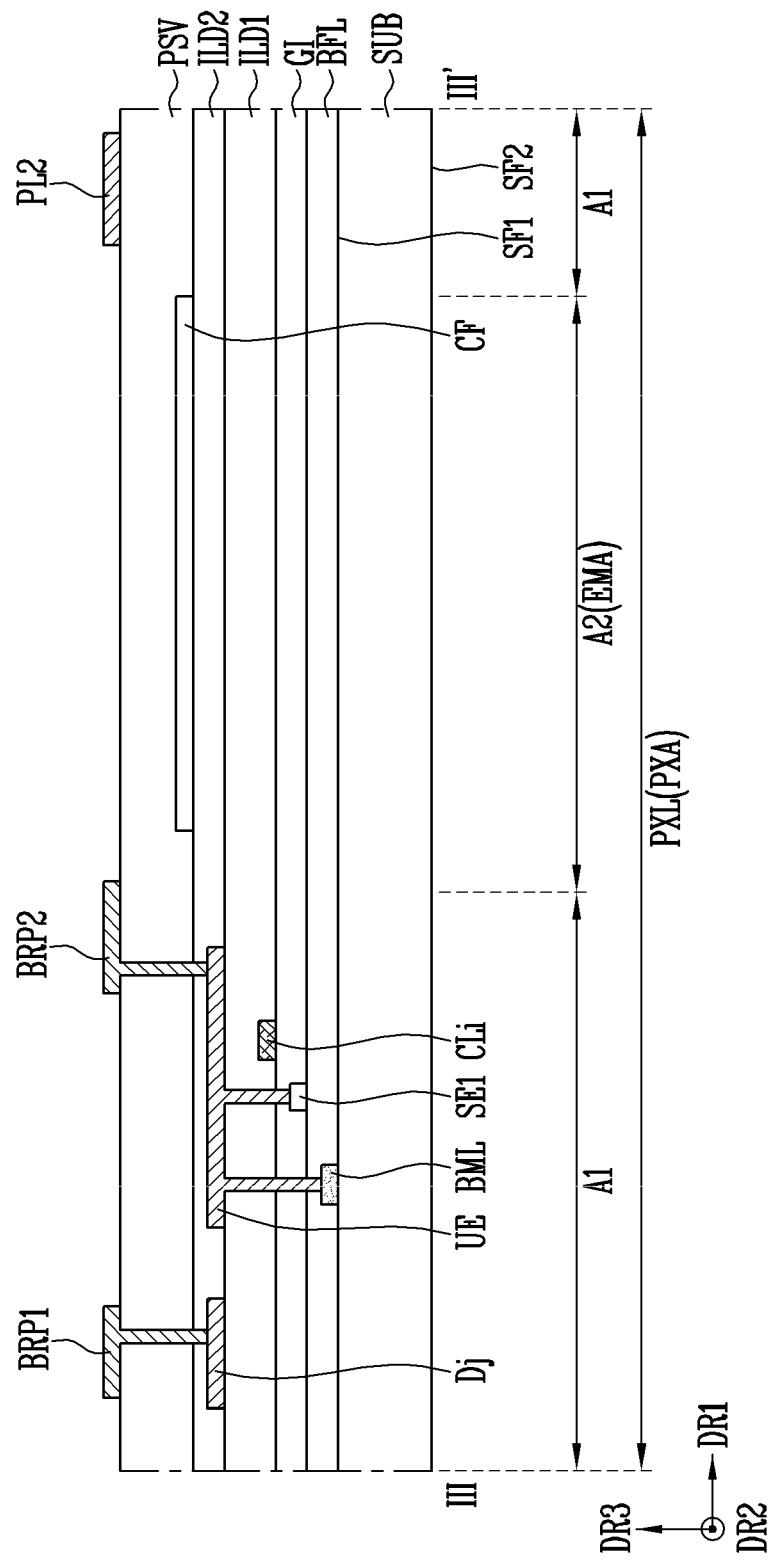
Figure 23:
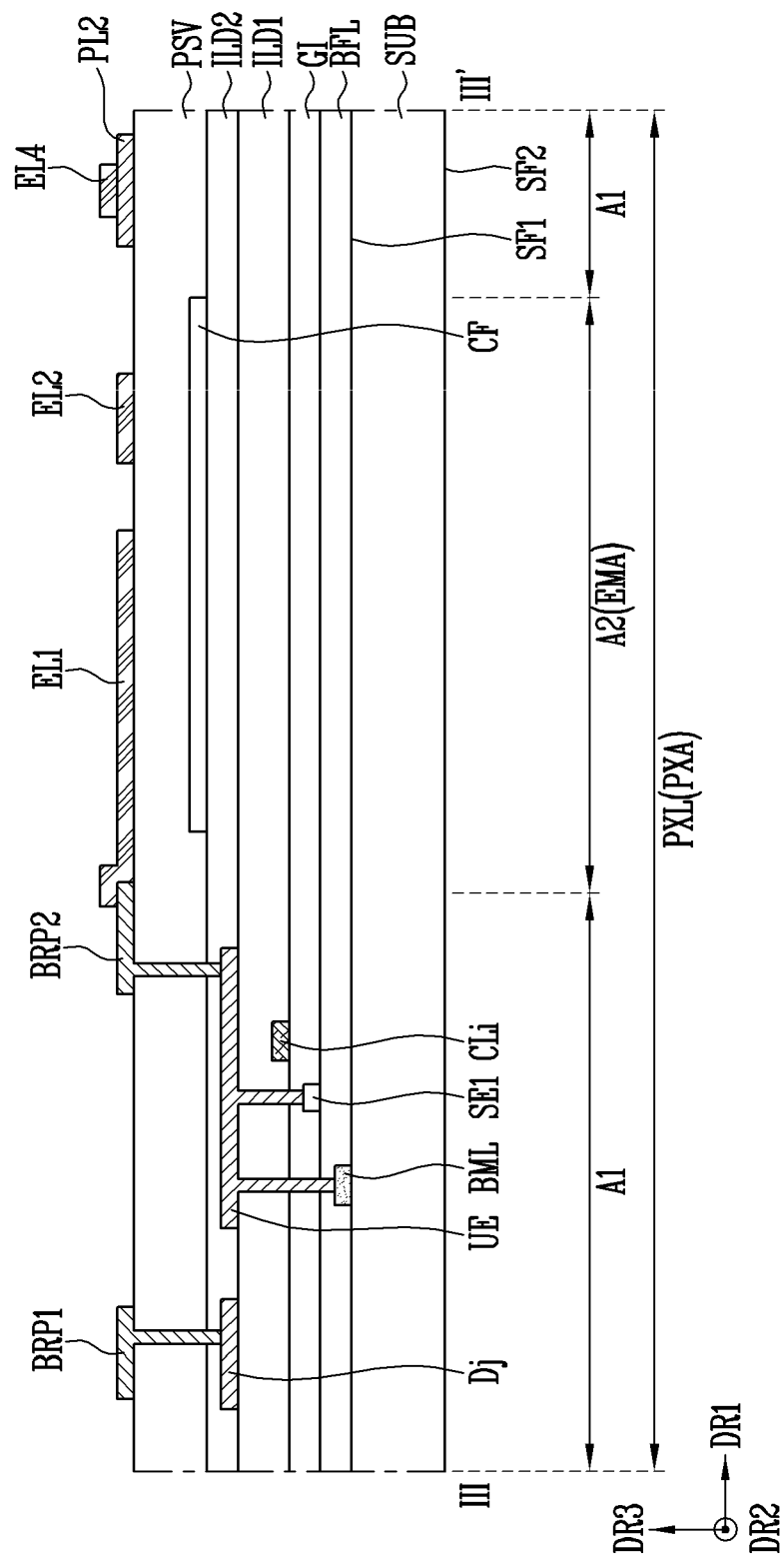
Figure 24:
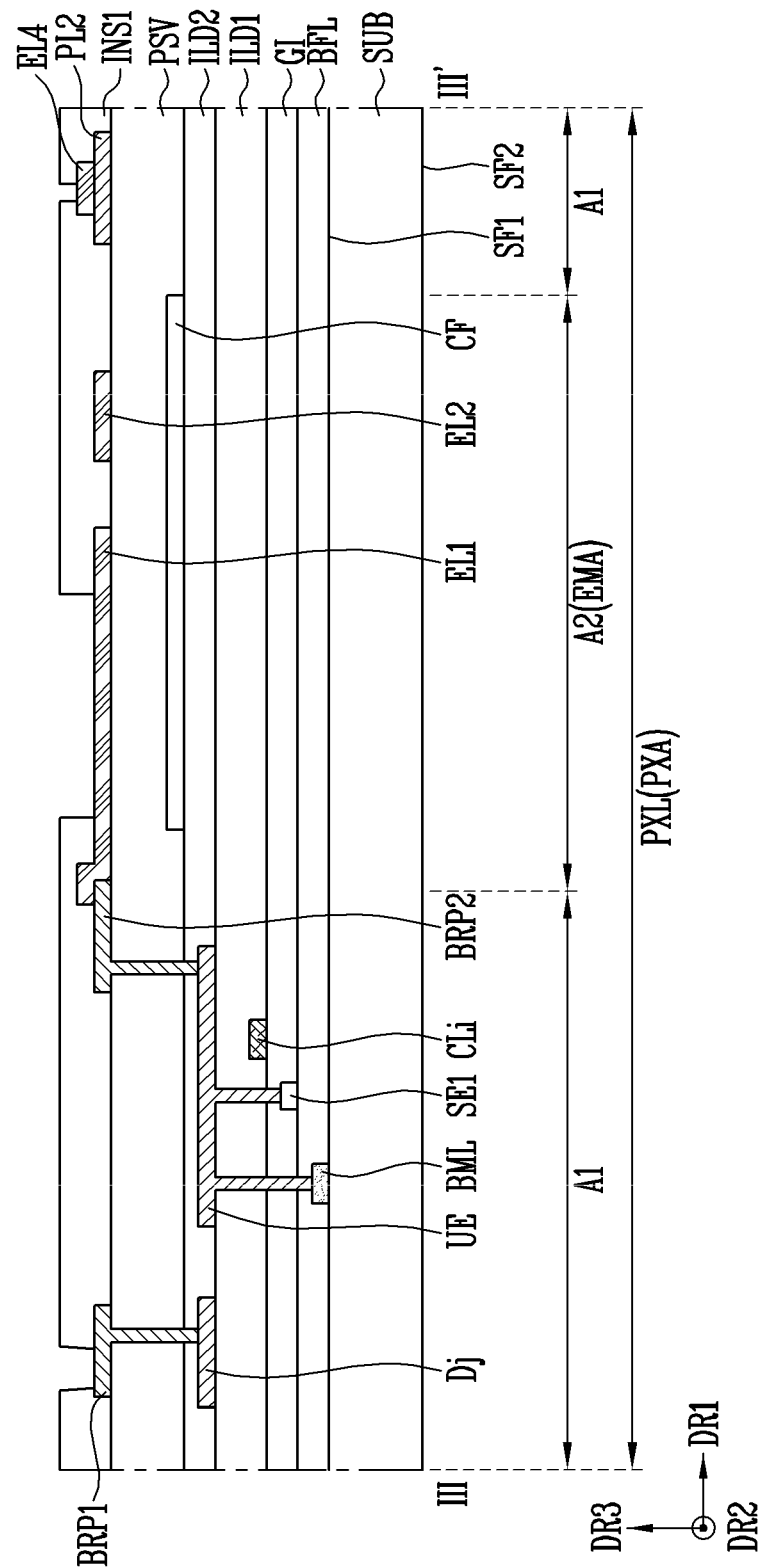
Figure 25:
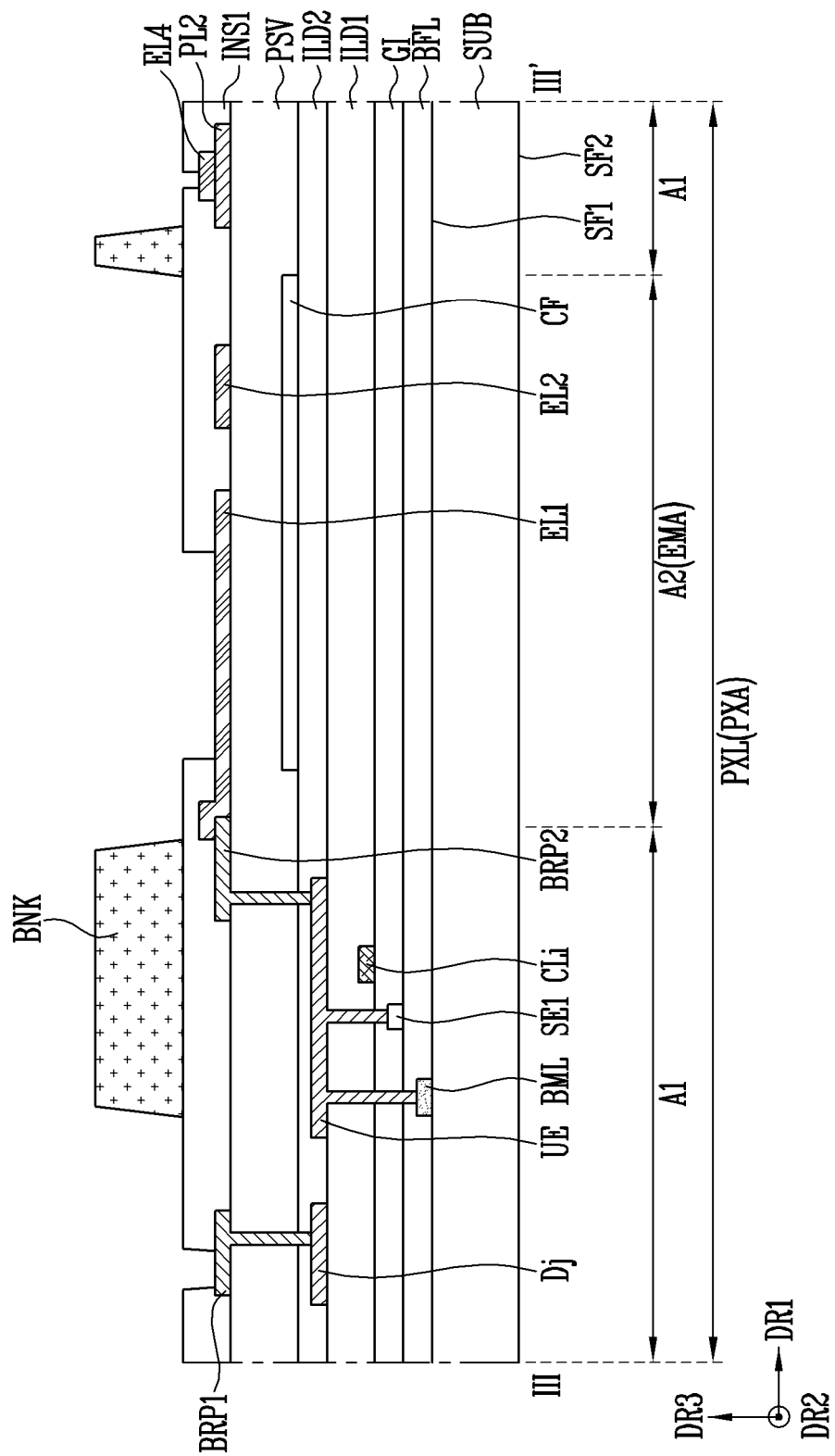
Figure 26:
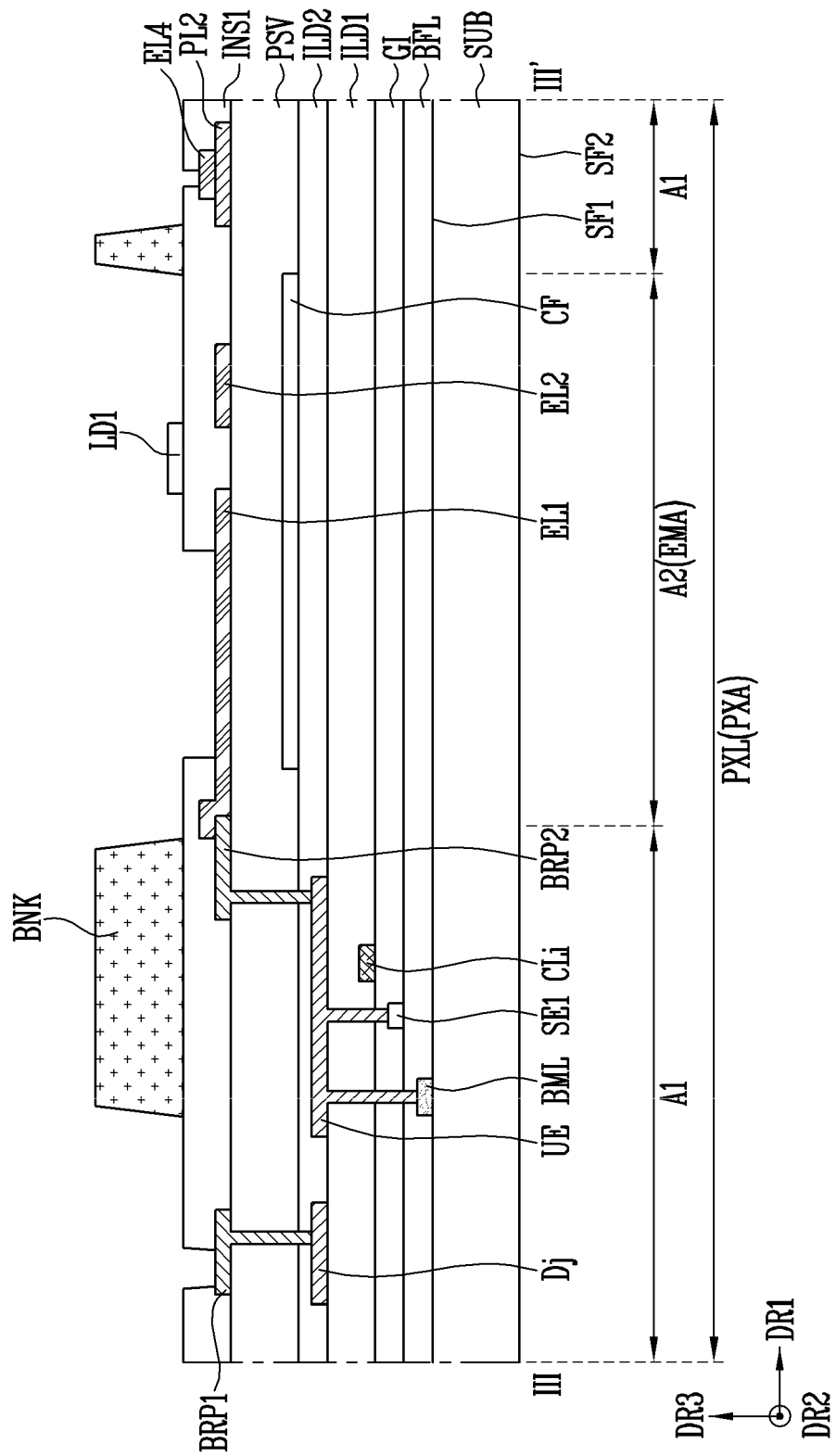
Figure 27:
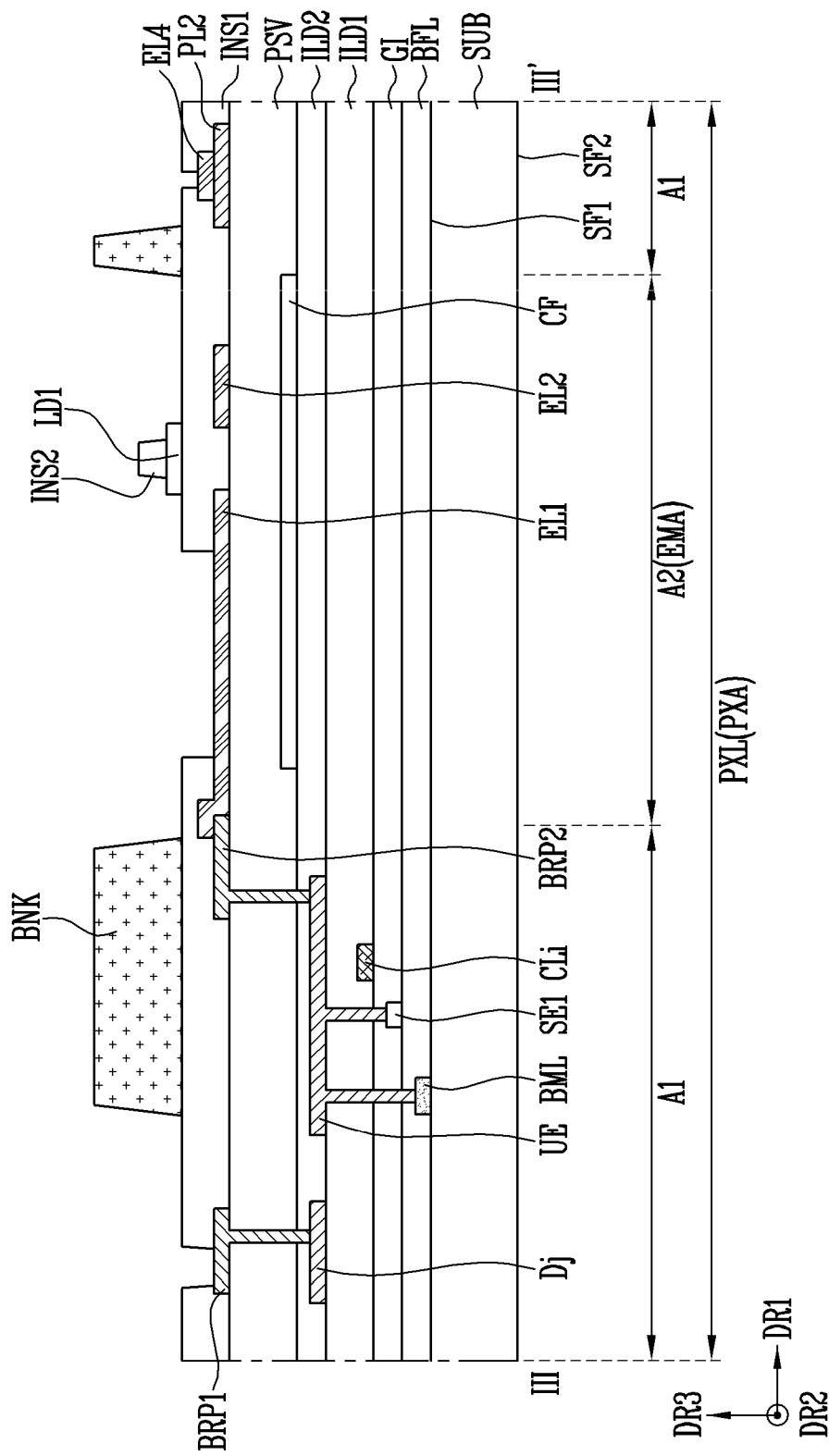
Figure 28:
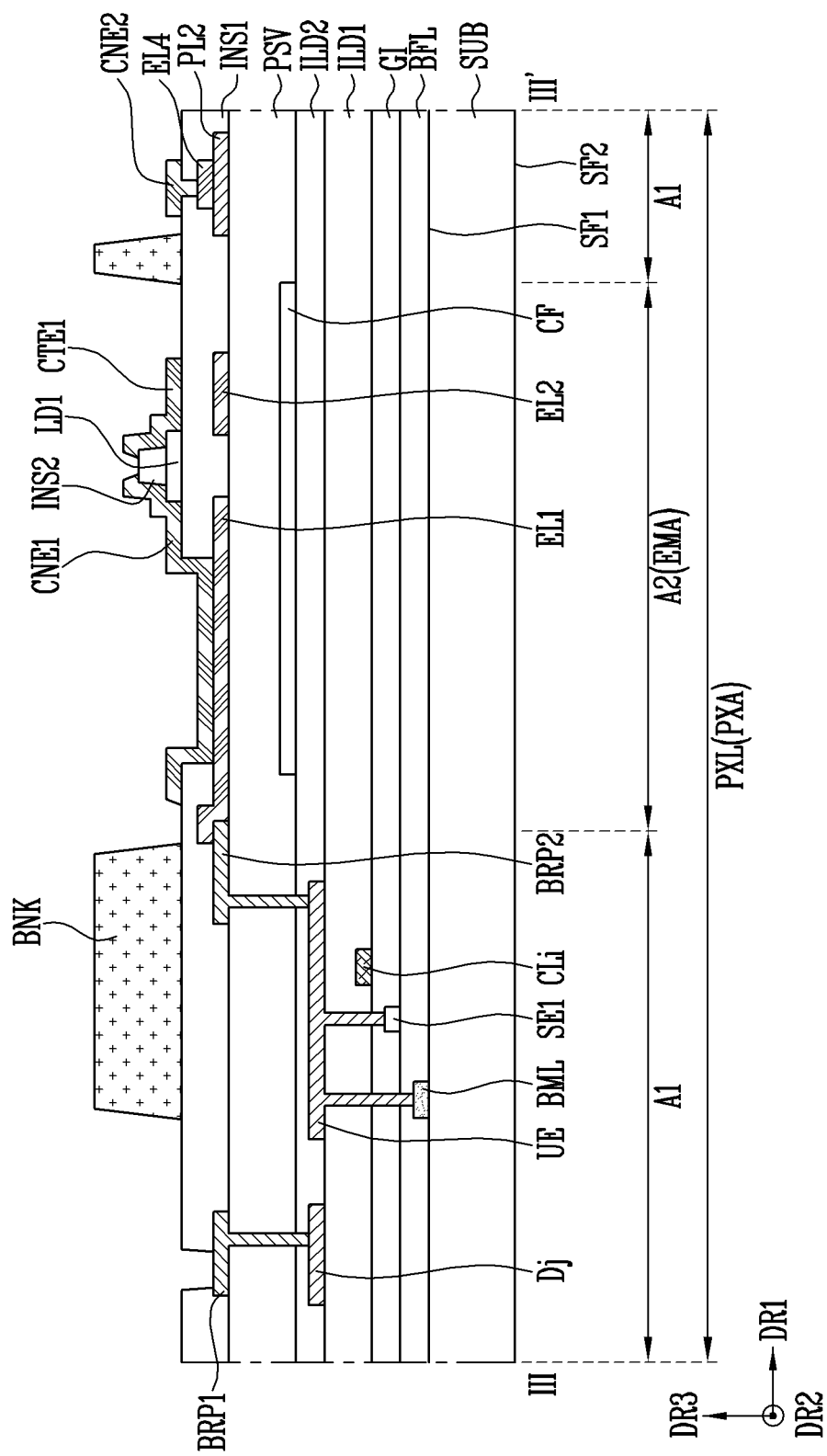
Figure 29:
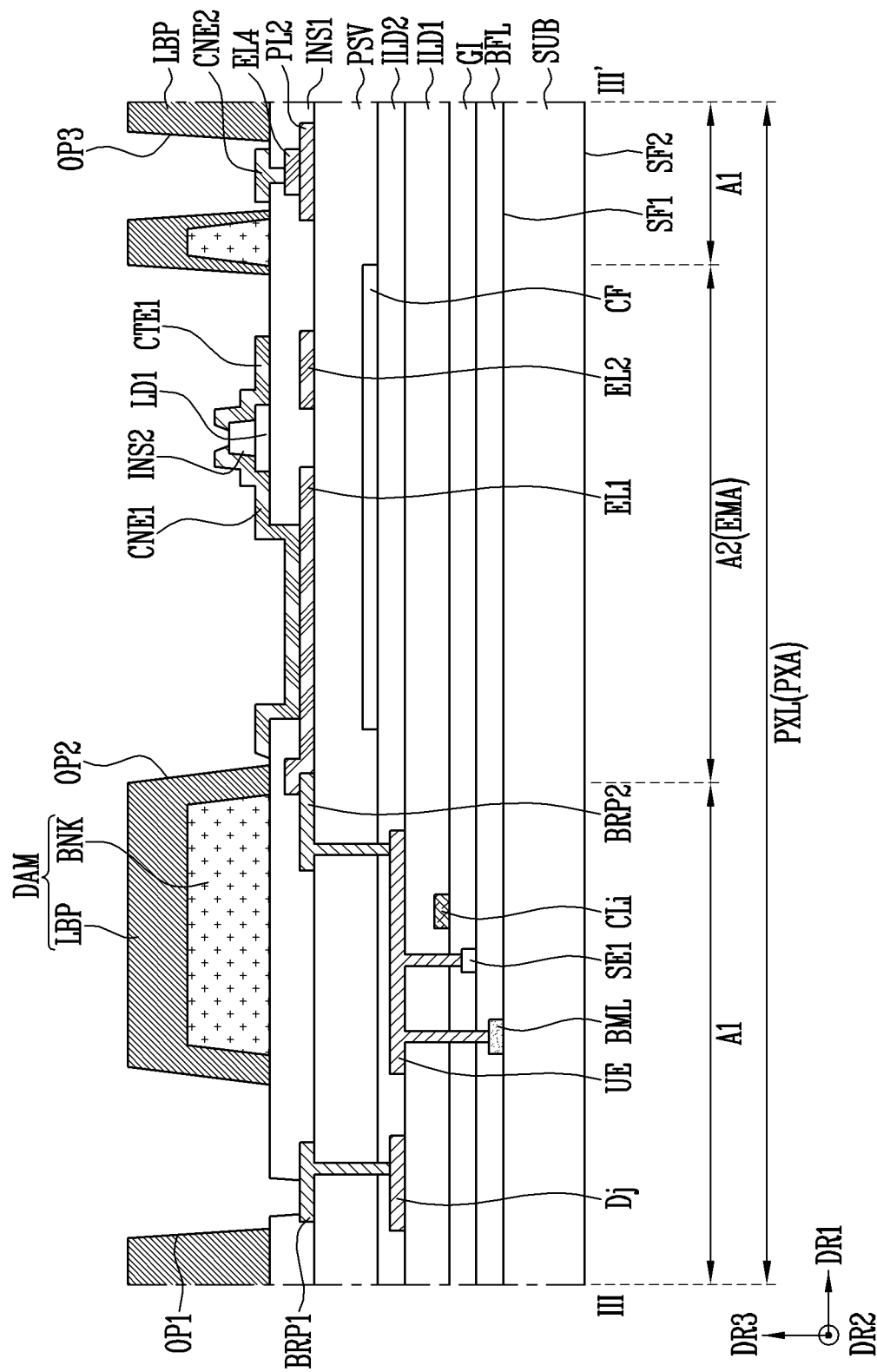
Figure 30:
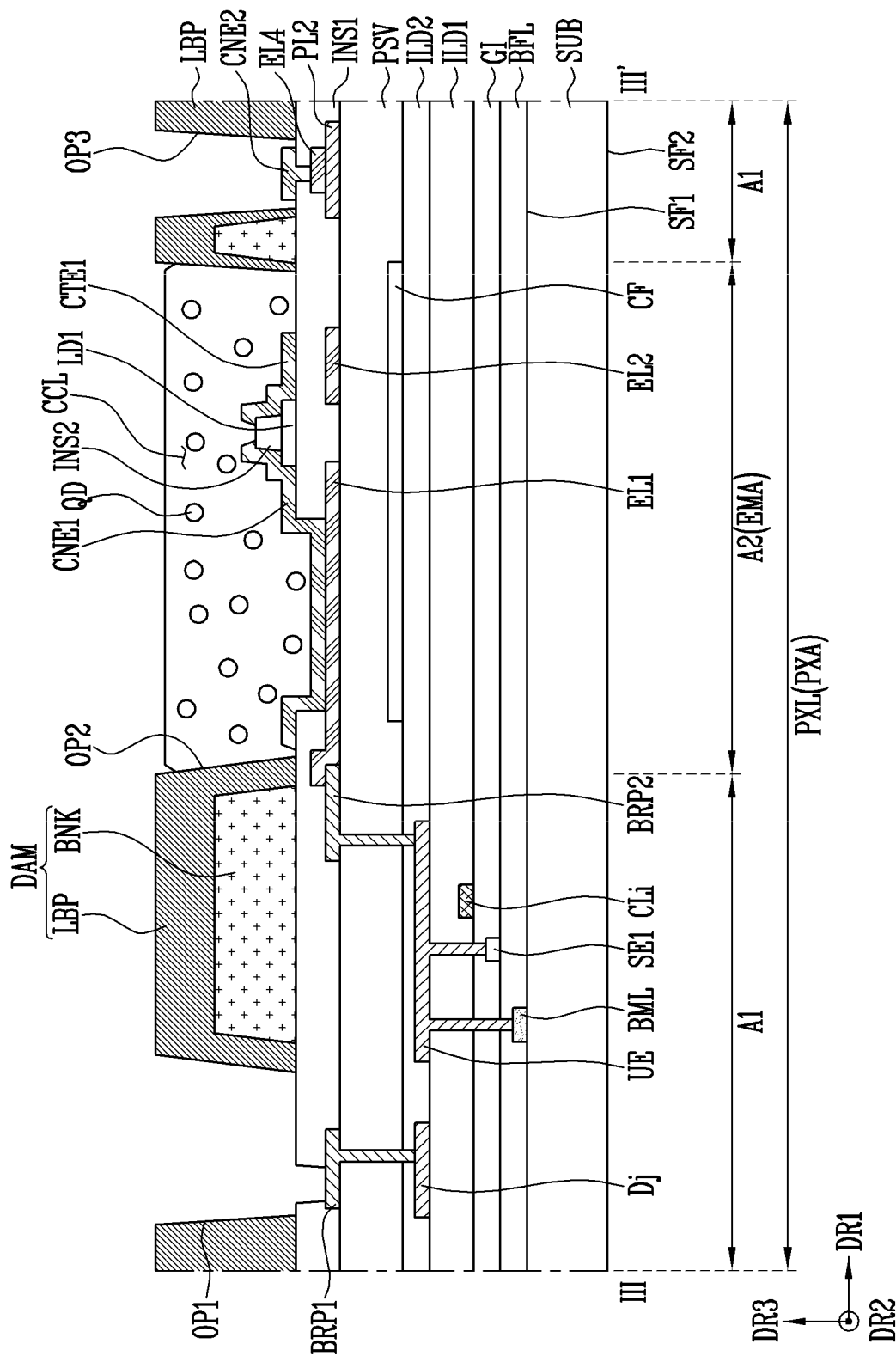
Figure 31:
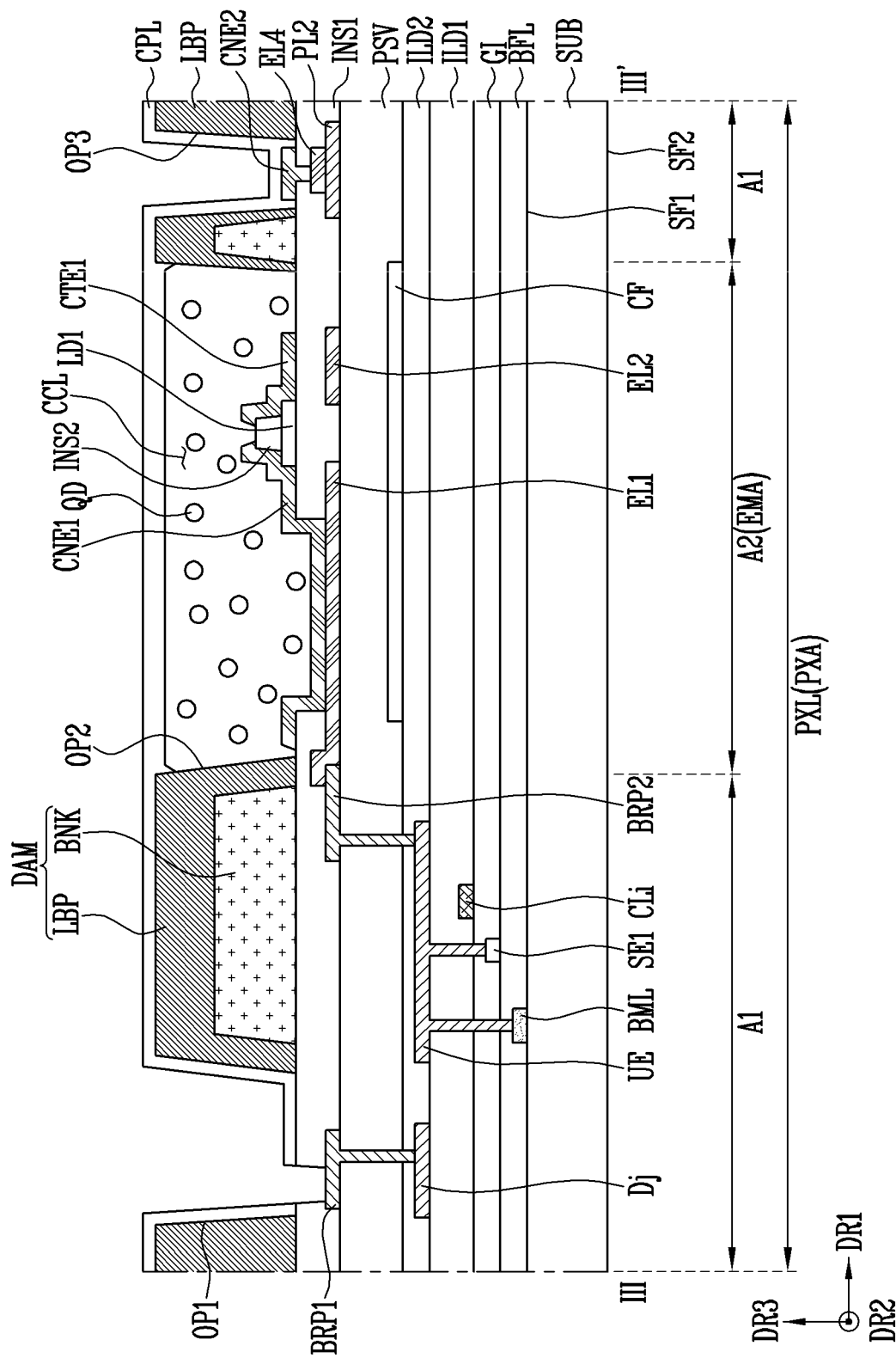
Figure 32:
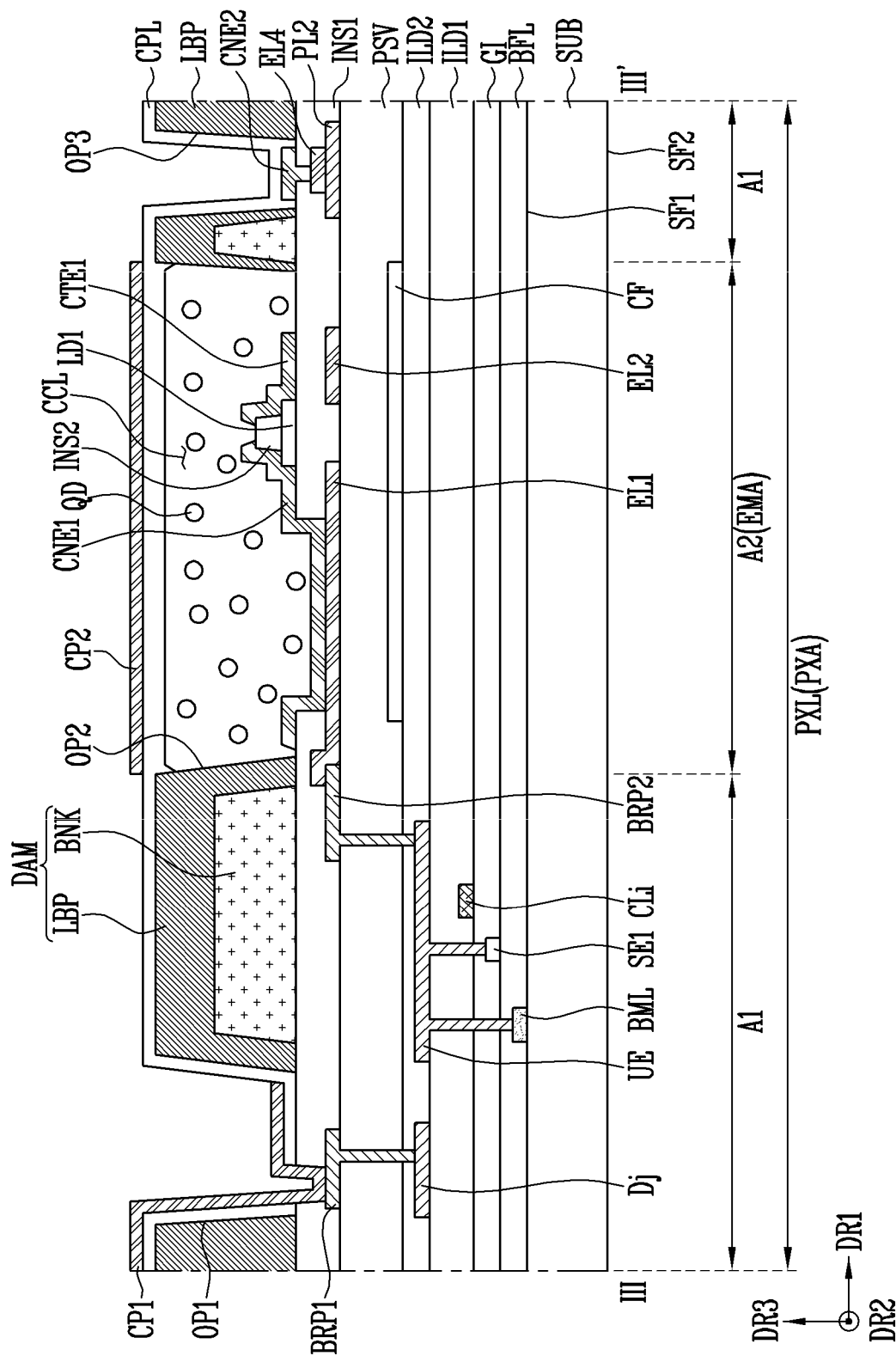
Figure 33:
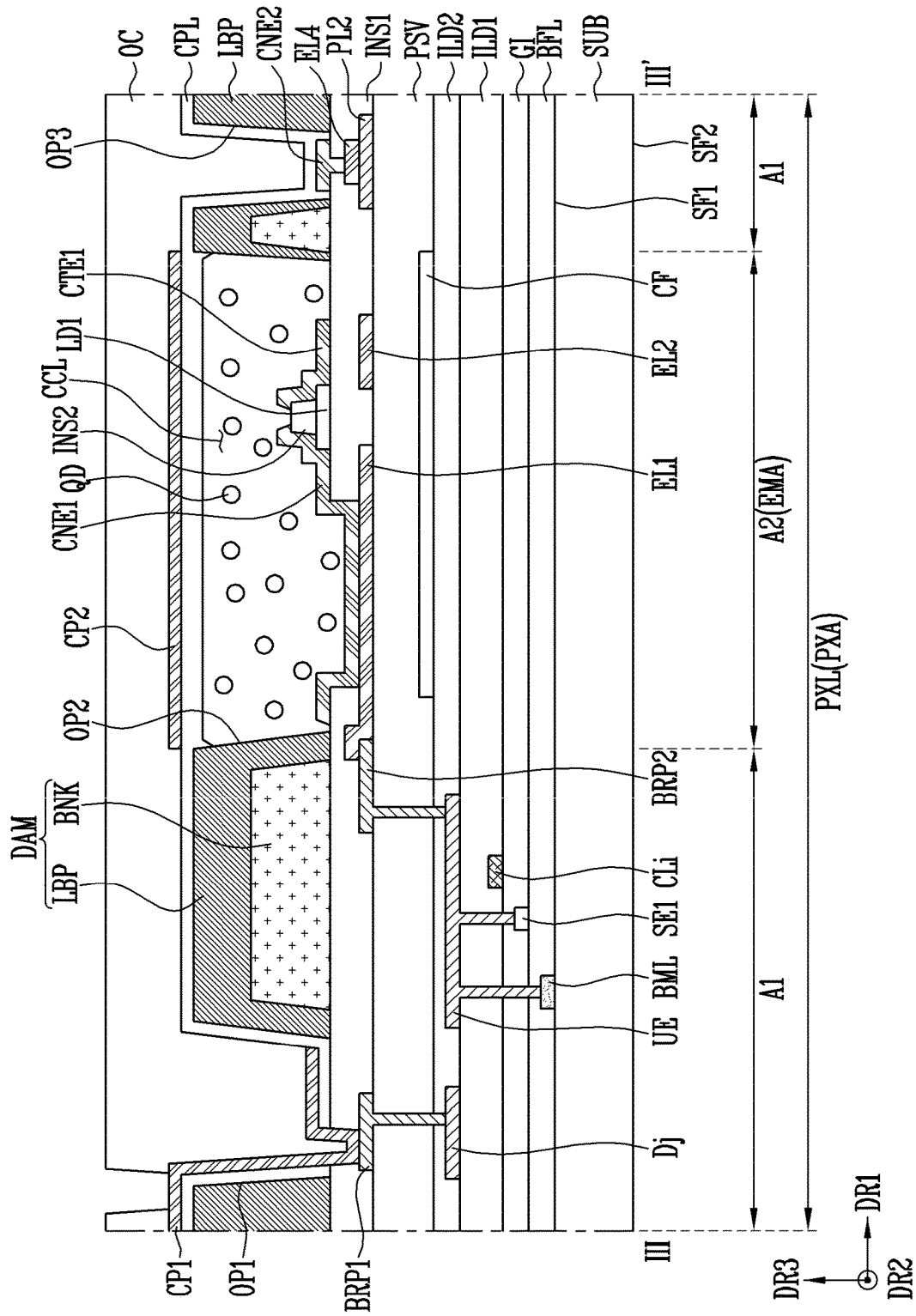
Figure 34:
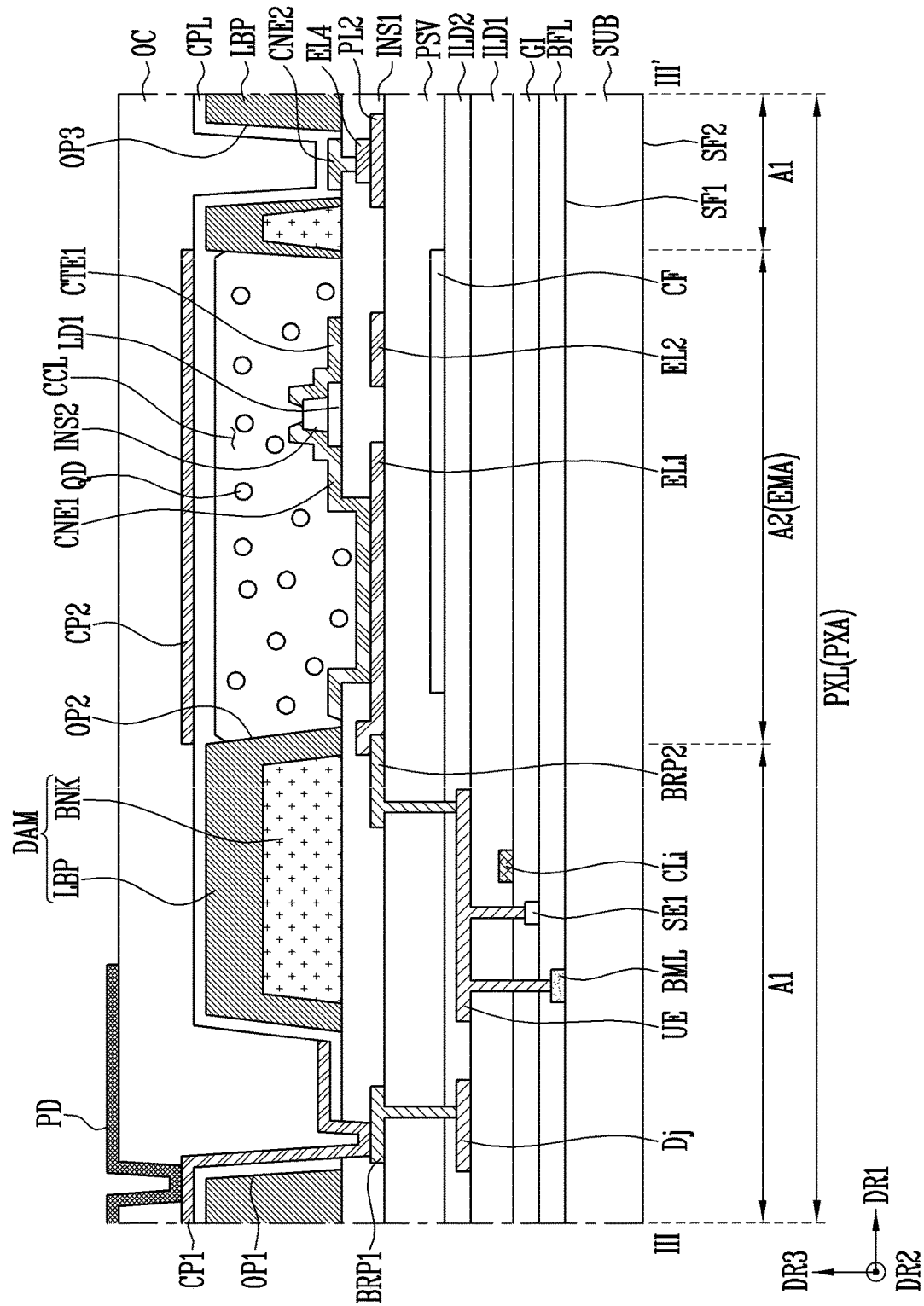
Figure 35:
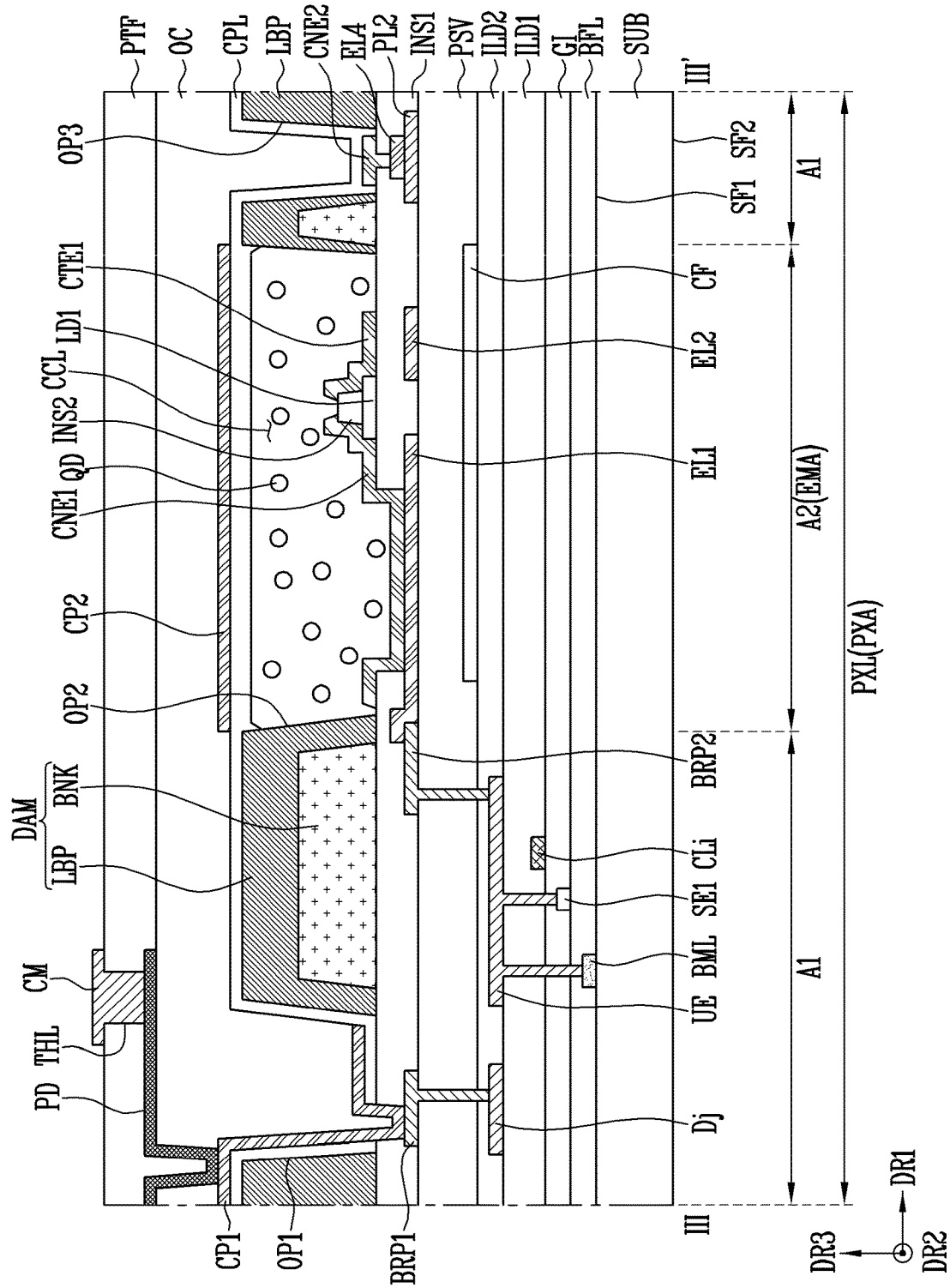

Referring to FIGS. 9, 10, and 15, the substrate SUB is provided. Subsequently, a first conductive layer is formed on the first region A1 on the substrate SUB. The first conductive layer may include the bottom metal layer BML.

Referring to FIGS. 9, 10, 15, and 16, the buffer layer BFL is formed on an entire surface of the substrate SUB including the bottom metal layer BML. Subsequently, the semiconductor layer SCL is formed on the buffer layer BFL.

The semiconductor layer SCL may be formed of silicon, for example, amorphous silicon and/or polysilicon (e.g., polycrystalline silicon). When the semiconductor layer SCL is formed of amorphous silicon, a crystallization process may be further performed by using a laser or so on.

In some embodiment, the semiconductor layer SCL may be formed of a semiconductor oxide including a binary compound (ABx), a ternary compound (ABxCy), a four-component compound (ABxCyDz), and/or the like that contain indium (In), zinc (Zn), gallium (Ga), tin (Sn), titanium (Ti), aluminum (Al), hafnium (Hf), zirconium (Zr), magnesium (Mg), and/or the like. These may be used alone or in combination with each other.

The semiconductor layer SCL may be formed only in the first region A1 of the pixel PXL (or the pixel region PXA), but the present disclosure is not limited thereto. In some embodiments, the semiconductor layer SCL may also be formed in the second region A2 of the pixel PXL (or the pixel region PXA).

Referring to FIGS. 9 and 10 and FIGS. 15 to 17, a gate insulating layer GI is formed on the buffer layer BFL including the semiconductor layer SCL. In some embodiments, the gate insulating layer GI may also be formed only in a region of the pixel region PXA except for the light emitting region EMA.

A second conductive layer is formed on the gate insulating layer GI.

The second conductive layer may include the lower electrode LE of the storage capacitor Cst in the first region A1 of the pixel PXL (or the pixel region PXA), the first to third gate electrodes GE1 to GE3, the initialization power line IPL, the control line CLi, and the scan line Si.

One region of the semiconductor layer SCL overlapping the first gate electrode GE1 may become the first active pattern ACT1. Both sides of the first active pattern ACT1 that do not overlap the first gate electrode GE1 may become the first source region SE1 and the first drain region DE1. The first active pattern ACT1, the first gate electrode GE1, the first source region SE1, and the first drain region DE1 may configure (e.g., may constitute) the first transistor T1.

One region of the semiconductor layer SCL overlapping the second gate electrode GE2 may become the second active pattern ACT2. Both sides of the second active pattern ACT2 that do not overlap the second gate electrode GE2 may become the second source region SE2 and the second drain region DE2. The second active pattern ACT2, the second gate electrode GE2, the second source region SE2, and the second drain region DE2 may configure (e.g., may constitute) the second transistor T2.

One region of the semiconductor layer SCL overlapping the third gate electrode GE3 may become the third active pattern ACT3. Both sides of the third active pattern ACT3 that do not overlap the third gate electrode GE3 may become the third source region SE3 and the third drain region DE3. The third active pattern ACT3, the third gate electrode GE3, the third source region SE3, and the third drain region DE3 may configure (e.g., may constitute) the third transistor T3.

Referring to FIGS. 9 and 10 and FIGS. 15 to 18, an insulating material layer is formed on the first to third transistors T1 to T3, a process of using a mask is performed, and thereby, the first interlayer insulating layer ILD1 including a plurality of contact holes CH is formed.

By the above-described process, the contact hole CH penetrating the first interlayer insulating layer ILD1, the gate insulating layer GI, and the buffer layer BFL to expose one region of the bottom metal layer BML may be formed, and the contact hole CH penetrating the first interlayer insulating layer ILD1 and the gate insulating layer GI to expose each of the first and second source regions SE1 and SE2 and the first to third drain regions DE1, DE2, and DE3 may be formed.

In addition, the contact hole CH penetrating the first interlayer insulating layer ILD1 to expose one region of the initialization power line IPL may be formed by the above-described process.

Referring to FIGS. 9 and 10 and FIGS. 15 to 19, a third conductive layer is formed on the first interlayer insulating layer ILD1.

The third conductive layer may include the connection line CNL in the first region A1 of the pixel PXL (or pixel region PXA), the upper electrode UE of the storage capacitor Cst, the data line Dj, and the first power line PL1.

The data line Dj may be electrically coupled to the second drain region DE2 through the contact hole CH penetrating the first interlayer insulating layer ILD1 and the gate insulating layer GI.

The first power line PL1 may be electrically coupled to the first drain region DE1 through the contact hole CH penetrating the first interlayer insulating layer ILD1 and the gate insulating layer GI.

The upper electrode UE may be electrically coupled to the first source region SE1 through the contact hole CH penetrating the first interlayer insulating layer ILD1 and the gate insulating layer GI. In addition, the upper electrode UE may be electrically coupled to the bottom metal layer BML through the contact hole CH penetrating the first interlayer insulating layer ILD1, the gate insulating layer GI, and the buffer layer BFL.

The connection line CNL may be electrically coupled to the third drain region DE3 through the contact hole CH penetrating the first interlayer insulating layer ILD1 and the gate insulating layer GI. In addition, the connection line CNL may be electrically coupled to the initialization power line IPL through the contact hole CH penetrating the first interlayer insulating layer ILD1.

Referring to FIGS. 9 and 10 and FIGS. 15 to 20, the second interlayer insulating layer ILD2 is formed on an entire surface of the first interlayer insulating layer ILD1 including the third conductive layer. Subsequently, the color filter CF is formed in the light emitting region EMA which is the second region A2 of the pixel PXL (or the pixel region PXA). In one embodiment, the color filter CF may be formed on the second interlayer insulating layer ILD2 to correspond to only the light emitting region EMA of the pixel PXL.

Referring to FIGS. 9 and 10 and FIGS. 15 to 21, after an insulating material layer is coated on an entire surface of the second interlayer insulating layer ILD2 including the color filter CF, a process of using a mask is performed to form the protective layer PSV including the contact holes CH.

In the above-described process, the contact holes CH penetrating the protective layer PSV and the second interlayer insulating layer ILD2 to expose one region of each of the upper electrode UE and the data line Dj, may be formed.

Referring to FIGS. 9 and 10 and FIGS. 15 to 22, a fourth conductive layer is formed on the protective layer PSV.

The fourth conductive layer may include the first and second bridge patterns BRP1 and BRP2 and the second power line PL2, which are in the first region A1 of the pixel PXL (or the pixel region PXA).

The first bridge pattern BRP1 may be electrically coupled to the data line Dj through the contact hole CH penetrating through the protective layer PSV and the second interlayer insulating layer ILD2.

The second bridge pattern BRP2 may be electrically coupled to the upper electrode UE through the contact hole CH penetrating through the protective layer PSV and the second interlayer insulating layer ILD2.

Referring to FIGS. 9 and 10 and FIGS. 15 to 23, a fifth conductive layer is formed on the protective layer PSV. The fifth conductive layer may include the first to fourth electrodes EL1 to EL4 in the second region A2 of the pixel PXL (or the pixel region PXA).

The first electrode EL1 may be formed on at least a portion of the protective layer PSV and the second bridge pattern BRP2 to be electrically and/or physically coupled to the second bridge pattern BRP2. As the first electrode EL1 is coupled to the second bridge pattern BRP2, the first electrode EL1 may be electrically coupled to the upper electrode UE in the first region A1 of the pixel PXL (or the pixel region PXA).

The second electrode EL2 may be on the protective layer PSV to be spaced apart from the first electrode EL1 in the first direction DR1.

In one or more embodiments, the third electrode EL3 may also be on the protective layer PSV to be spaced apart from the second electrode EL2 in the first direction DR1.

The fourth electrode EL4 may be formed on at least a portion of the protective layer PSV and the second power line PL2 to be spaced apart from the second and third electrodes EL2 and EL3 in the first direction DR1. The fourth electrode EL4 may be formed on the second power line PL2 to be electrically and/or physically coupled to the second power line PL2.

The first to fourth electrodes EL1 to EL4 described above may be formed of a transparent conductive material (e.g., a transparent, electrically conductive material or substance) capable of minimizing or reducing light loss by causing light of a first color emitted from the light emitting elements LD to pass therethrough.

Referring to FIGS. 9 and 10 and FIGS. 15 to 24, after an insulating material layer is coated on the entire surface of the protective layer PSV including the first to fourth electrodes EL1 to EL4, a process of using a mask is performed to form the first insulating layer INS1 partially opened to expose some configuration elements arrange thereunder.

Through the above-described process, a part of each of the first bridge pattern BRP1, the first electrode EL1, and the fourth electrode EL4 may be exposed to the outside.

Referring to FIGS. 9 and 10 and FIGS. 15 to 25, the bank BNK is formed on the first insulating layer INS1. The bank BNK may be formed on the first insulating layer INS1 of the first region A1 of the pixel PXL (or the pixel region PXA).

The bank BNK may be a structure for determining alignment positions (or supply positions) of the light emitting elements LD in the pixel PXL (or the pixel region PXA). The bank BNK may guide alignment positions of the light emitting devices LD to a target region when aligning the light emitting elements LD in the pixel PXL (or the pixel region PXA) in the first region A1.

Referring to FIGS. 9 and 10 and FIGS. 15 to 26, by applying an alignment signal (or an alignment voltage) to each of the first to fourth electrodes EL1 to EL4, an electric field is formed between the first to fourth electrodes EL1 and EL4.

Each of the first to fourth electrodes EL1 to EL4 may be an alignment electrode (or an alignment line) that aligns the light emitting elements LD in the second region A2 of the pixel PXL (or the pixel region PXA).

When an alignment signal (or an alignment voltage) of an AC voltage having a set or predetermined voltage and a cycle or a DC voltage is applied to each of the first to fourth electrodes EL1 to EL4, an electric field according to a potential difference between two adjacent electrodes among the first to fourth electrodes EL1 to EL4 may be formed. In a state in which an electric field is formed between two adjacent electrodes, a mixed solution including the light emitting elements LD is introduced into the pixel PXL (or the pixel region PXA) by using an inkjet printing method and/or the like. For example, an inkjet nozzle may be over the first insulating layer INS1 of the second region A2 of the pixel PXL (or the pixel region PXA), and a mixed solvent in which multiple light emitting elements LD are mixed may be introduced into the pixel region PXA through the inkjet nozzle. Here, the solvent may include at least one of acetone, water, alcohol, and/or toluene, but the present disclosure is not limited thereto. For example, the solvent may be in the form of ink and/or paste. A method of introducing the light emitting elements LD into the pixel PXL (or the pixel region PXA) is not limited to the above-described embodiment, and the method of introducing the light emitting elements LD may be variously changed.

After the light emitting elements LD are introduced, the solvent may be removed.

When the light emitting elements LD are introduced into the pixel region PXA, self-alignment of the light emitting elements LD may be guided by an electric field formed between the first to fourth electrodes EL1 to EL4. By the electric field formed between the first to fourth electrodes EL1 to EL4, the first light emitting elements LD1 are aligned between the first electrode EL1 and the second electrode EL2, and the second light emitting elements LD2 may be aligned between the third electrode EL3 and the fourth electrode EL4. The first and second light emitting elements LD1 and LD2 may be aligned on the first insulating layer INS1 in the light emitting region EMA surrounded by the bank BNK in the second region A2 of the pixel PXL (or the pixel region PXA).

Referring to FIGS. 9 and 10 and FIGS. 15 to 27, after an insulating material layer is coated on the entire surface of the first insulating layer INS1 including the light emitting elements LD, a process of using a mask is performed to form the second insulating layer INS2 on one surface of each of the light emitting elements LD. The second insulating layer INS2 may be formed as a single layer or multiple layers and may include an inorganic insulating layer including at least one inorganic material and/or an organic insulating layer including at least one organic material.

The second insulating layer INS2 may be formed on one surface of each of the light emitting elements LD to expose both ends of a related light emitting element LD to the outside. The second insulating layer INS2 may be formed on one surface of each of the light emitting elements LD to fix the light emitting elements LD, and thus, separation of the light emitting elements LD from the aligned positions may be prevented or reduced.

Referring to FIGS. 9 and 10 and FIGS. 15 to 28, a sixth conductive layer is formed on the second insulating layer INS2. The sixth conductive layer may include the first and second contact electrodes CNE1 and CNE2 and the intermediate electrode CTE in the second region A2 of the pixel PXL (or the pixel region PXA).

The first contact electrode CNE1 may be formed on the first insulating layer INS1, the second insulating layer INS2, the first electrode EL1, and one end of each of the first light emitting elements LD1. The first contact electrode CNE1 may be directly formed on the first electrode EL1 exposed by the first insulating layer INS1 and one end of each of the first light emitting elements LD1 to electrically couple the first electrode EL1 to the first light emitting elements LD1.

The second contact electrode CNE2 may be formed on the first insulating layer INS1, the second insulating layer INS2, the fourth electrode EL4, and the other end of each of the second light emitting elements LD2. The second contact electrode CNE2 may be directly formed on the fourth electrode EL4 exposed by the first insulating layer INS1 and the other end of each of the second light emitting elements LD2 to electrically couple the fourth electrode EL4 to the second light emitting elements LD2.

The intermediate electrode CTE may include the first intermediate electrode CTE1 and the second intermediate electrode CTE2.

The first intermediate electrode CTE1 may be formed on the first insulating layer INS1 on the second electrode EL2 to be electrically insulated from the second electrode EL2. The second intermediate electrode CTE2 may be formed on the first insulating layer INS1 on the third electrode EL3 to be electrically insulated from the third electrode EL3.

Referring to FIGS. 9 and 10 and FIGS. 15 to 29, the light blocking layer LBP is formed in the first region A1 of the pixel PXL (or the pixel region PXA).

The light blocking layer LBP may include the first to third openings OP1 to OP3.

The first opening OP1 may expose the first bridge pattern BRP1 exposed by the first insulating layer INS1 in the first region A1. The first opening OP1 may correspond to the first bridge pattern BRP1 when viewed in a plan view. The second opening OP2 may expose configuration elements in the light emitting region EMA, for example, the first and second contact electrodes CNE1 and CNE2 and the intermediate electrode CTE. The second opening OP2 may correspond to the light emitting region EMA of the pixel PXL (or the pixel region PXA) when viewed in a plan view. The third opening OP3 may expose the contact portions of the second power line PL2, the fourth electrode EL4, and the second contact electrode CNE2 in the first region A1.

At least a part of the light blocking layer LBP may be formed on the bank BNK to implement the dam portion DAM for determining a supply position of the color conversion layer CCL together with the bank BNK.

The above-described light blocking layer LBP may include a light blocking material that reduces a light leakage defect that light leaks between the pixel PXL and adjacent pixels PXL, and may include, for example, a black matrix.

Referring to FIGS. 9 and 10 and FIGS. 15 to 30, the color conversion layer CCL including the color conversion particles QD is formed in a second region A of the pixel PXL (or the pixel region PXA).

The color conversion layer CCL may be formed in a form that fills a space surrounded by the dam portion DAM. The space is one region of the pixel region PXA surrounded by the dam portion DAM and may correspond to the light emitting region EMA from which light is emitted in the pixel region PXA.

Referring to FIGS. 9 and 10 and FIGS. 15 to 31, the capping layer CPL is formed on entire surfaces of the first and second regions A1 and A2 of the pixel PXL (or the pixel region PXA). The capping layer CPL may be partially opened to expose one region of the first insulating layer INS1 and one region of the first bridge pattern BRP1 exposed by the first opening OP1, in the first region A1.

Referring to FIGS. 9 and 10 and FIGS. 15 to 32, the first conductive pattern CP1 is formed in the first region A1 of the pixel PXL (or the pixel region PXA), and the second conductive pattern CP2 is formed in the second region A2 of the pixel PXL (or the pixel region PXA).

The first conductive pattern CP1 may be formed on the capping layer CPL and the exposed first bridge pattern BRP1. The first conductive pattern CP1 may be electrically and/or physically coupled to the first bridge pattern BRP1.

The second conductive pattern CP2 may be formed on the capping layer CPL on the color conversion layer CCL. The second conductive pattern CP2 may be a guide member that is formed over the color conversion layer CCL to guide light finally emitted from the color conversion layer CCL toward the second surface SF2 of the substrate SUB.

The first conductive pattern CP1 and the second conductive pattern CP2 may include the same (e.g., substantially the same) material and may be formed by the same process. The first and second conductive patterns CP1 and CP2 may be formed of a conductive material (e.g., an electrically conductive material or substance) having a constant (e.g., substantially constant) reflectance. The conductive material (e.g., the electrically conductive material or substance) may include an opaque metal.

Referring to FIGS. 9 and 10 and FIGS. 15 to 33, the overcoat layer OC is formed on entire surfaces of the first and second conductive patterns CP1 and CP2.

The overcoat layer OC may be partially opened to expose one region of the first conductive pattern CP1.

Referring to FIGS. 9 and 10 and FIGS. 15 to 34, the pad electrode PD is formed on the overcoat layer OC.

The pad electrode PD may be formed on the exposed first conductive pattern CP1 to be electrically and/or physically coupled to the first conductive pattern CP1. In one embodiment, the pad electrode PD may be formed of a conductive material (e.g., an electrically conductive material or substance).

Referring to FIGS. 9 and 10 and FIGS. 15 to 35, a protective film PTF is formed on the overcoat layer OC including the pad electrode PD.

The protective film PTF may include the through-hole THL partially opened to expose one region of the pad electrode PD. The connection member CM may be in the through-hole THL. A drive portion (see "DRP" of FIG. 4) may be on the connection member CM to electrically couple the drive portion DRP to the pad electrode PD.

In the display device formed through the above-described fabrication process, the fabrication process may be simplified by sequentially forming the pixels PXL and the drive portion DRP on the same surface of the substrate SUB, for example, the first surface SF1, and because an image is displayed on the second surface SF2 of the substrate SUB on which the pixels PXL and the drive portion DRP are not arranged, a non-display region of the second surface SF2 (or a display surface) may be minimized or reduced, and thus, a wider screen may be provided to a user.

Although the above description has been made with reference to example embodiments of the present disclosure, those skilled in the art or those having ordinary skill in the relevant technical field will understand that the present disclosure may be variously modified and changed without departing from the spirit or technical scope of the present disclosure as defined by the appended claims, and equivalents thereof.

Accordingly, the technical scope of the present disclosure is not limited to the content described in the detailed description of the specification but should be determined by the appended claims, and equivalents thereof.

What is claimed is:

1. A display device comprising:
   a substrate comprising a plurality of pixel regions, each of the plurality of pixel regions comprising a first region and a second region; and
   a pixel in each of the plurality of pixel regions,
   wherein the pixel comprises a display element portion comprising a plurality of light emitting elements that emit a light of a first color, and
   wherein the display element portion comprises:
   a color filter on a first surface of the substrate and corresponding to the second region;
   a first electrode and a second electrode on the color filter and spaced apart from each other in a first direction;
   the plurality of light emitting elements, which are between the first electrode and the second electrode;
   a first contact electrode on the first electrode and a second contact electrode on the second electrode; and
   a color conversion layer on the first contact electrode and the second contact electrode and comprising color conversion particles that absorb the light of the first color and emit a light of a second color,
   wherein the second region comprises a light emitting region from which the light of the second color is emitted; and
   when viewed in a cross section, the color filter and the color conversion layer overlap each other in the second region with the light emitting elements therebetween.

2. The display device of claim 1, wherein the pixel further comprises:
   at least one transistor on the first surface to correspond to the first region;
   at least one signal line electrically coupled to the transistor; and
   a first insulating layer on the transistor and the signal line.

3. The display device of claim 2, further comprising:
   a first bridge pattern and a second bridge pattern on the first insulating layer to correspond to the first region; and
   a second insulating layer on the first bridge pattern and the second bridge pattern, the second insulating layer exposing a part of the first bridge pattern, a part of the first electrode, and a part of the second electrode,
   wherein the second bridge pattern is electrically coupled to one selected from the first electrode and the second electrode.

4. The display device of claim 3, further comprising:
   a light blocking layer on the first bridge pattern and the second bridge pattern and comprising an opening corresponding to the light emitting region,
   wherein the color conversion layer is in the opening.

5. The display device of claim 4, further comprising:
   a first conductive pattern on the first bridge pattern in the first region and electrically coupled to the first bridge pattern; and
   a second conductive pattern on the color conversion layer in the second region,
   wherein the first conductive pattern and the second conductive pattern comprise a same material.

6. The display device of claim 5, wherein:
   the first conductive pattern and the second conductive pattern comprise a conductive material having a set reflectivity.

7. The display device of claim 6, wherein:
the second conductive pattern is a guide member that guides the light of the second color emitted from the color conversion layer to a second surface of the substrate facing away from the first surface of the substrate.

8. The display device of claim 7, further comprising:
a planarization layer on the first conductive pattern and the second conductive pattern and exposing one region of the first conductive pattern; and
a pad electrode on the planarization layer,
wherein the pad electrode is electrically coupled to the one region of the first conductive pattern that is exposed by the planarization layer.

9. The display device of claim 8, further comprising:
a protective film on the pad electrode and comprising at least one through-hole exposing one region of the pad electrode; and
a connection member in the through-hole and electrically coupled to the pad electrode.

10. The display device of claim 9, further comprising:
a drive portion on the protective film and electrically coupled to the pad electrode through the connection member.

11. The display device of claim 10, wherein:
the drive portion is over the pixel on the first surface of the substrate.

12. The display device of claim 10, further comprising: a bank adjacent to a light emitting region in the first region, wherein the light blocking layer is on the bank.

13. The display device of claim 1, further comprising:
a bank pattern between the first contact electrode and a second insulating layer and between the second contact electrode and the second insulating layer to correspond to the second region.

14. A display device comprising:
a substrate comprising a plurality of pixel regions, each of the plurality of pixel regions comprising a first region and a second region;
a pixel in each of the plurality of pixel regions; and
a polarization film on a second surface of the substrate facing away from a first surface of the substrate,
wherein the pixel comprises a display element portion comprising a plurality of light emitting elements that emit a light of a first color, and
wherein the display element portion comprises:
a color filter on the first surface of the substrate and corresponding to the second region;
a first electrode and a second electrode on the color filter and spaced apart from each other in a first direction;
the plurality of light emitting elements, which are between the first electrode and the second electrode;
a first contact electrode on the first electrode and a second contact electrode on the second electrode; and
a color conversion layer on the first contact electrode and the second contact electrode and comprising color conversion particles that absorb the light of the first color and emit a light of a second color.

* * * * *